United States Patent [19]
Inoue et al.

[11] Patent Number: 6,121,713
[45] Date of Patent: *Sep. 19, 2000

[54] SURFACE ACOUSTIC WAVE DEVICE

[75] Inventors: Kenji Inoue; Katsuo Sato, both of Chiba, Japan

[73] Assignee: TDK Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 09/091,264

[22] PCT Filed: Oct. 16, 1997

[86] PCT No.: PCT/JP97/03737

§ 371 Date: Jun. 17, 1998

§ 102(e) Date: Jun. 17, 1998

[87] PCT Pub. No.: WO98/18204

PCT Pub. Date: Apr. 30, 1998

[30] Foreign Application Priority Data

| Oct. 18, 1996 | [JP] | Japan | 8-297440 |
| Dec. 12, 1996 | [JP] | Japan | 8-352295 |
| Dec. 12, 1996 | [JP] | Japan | 8-352296 |
| Dec. 12, 1996 | [JP] | Japan | 8-352297 |

[51] Int. Cl.$^7$ ................................................ H01L 41/04
[52] U.S. Cl. .................................. 310/313 A; 310/360
[58] Field of Search .............................. 310/313 A, 360

[56] References Cited

U.S. PATENT DOCUMENTS

| 5,160,869 | 11/1992 | Nakahata et al. | 310/313 A |
| 5,432,392 | 7/1995 | Kadota et al. | 310/313 A |
| 5,444,322 | 8/1995 | Minami et al. | 310/313 D |
| 5,625,329 | 4/1997 | Koike | 333/195 |

FOREIGN PATENT DOCUMENTS

| 61-269410 | 11/1986 | Japan . |
| 62-40812 | 2/1987 | Japan . |
| 62-78904 | 4/1987 | Japan . |

(List continued on next page.)

OTHER PUBLICATIONS

IEEE Ultrasonics Symposium No. 1, 1995, Kakovkin et al, "Numerical and Experimental Investigation SAW in Langasite", pp. 389–392.

IEEE Ultrasonics Symposium No. 1, 1995, Aleksandrov et al, "Effects of Static Elecetric Field and if Mechanical Pressure in La3Ga5SiO14 Piezoelectric Single Crystals", pp. 409–412.

IEEE Ultrasonics Symposium No. 1, 1992, Gualtieri et al, "Piezoelectric Materials for SAW Application", pp. 403–412.

(List continued on next page.)

*Primary Examiner*—Nestor Ramirez
*Assistant Examiner*—Peter Medley
*Attorney, Agent, or Firm*—Oblon, Spivak, McClelland, Maier & Neustadt, P.C.

[57] ABSTRACT

A surface including interdigital electrode on the surface thereof, which is reduced in size and improved in selectivity, and has a broad band. To achieve this, a langasite single crystal belonging to a point group 32 is first used for the substrate. Secondly, I. a piezoelectric film is provided for covering the surface of the substrate and the surface of the interdigital electrode, II. a piezoelectric film is provided on the surface of the substrate and the interdigital electrode is provided on the surface of the piezoelectric film, III. a piezoelectric film is provided for covering the surface of the substrate and the surface of the interdigital electrode and an opposite electrode film is provided on the surface of the piezoelectric film, or IV. an opposite electrode film is provided on the surface of the substrate, a piezoelectric film is provided on the opposite electrode film and the interdigital electrode is provided on the surface of the piezoelectric film. The piezoelectric film is made up of zinc oxide, and has a piezoelectric axis oriented substantially perpendicularly with respect to the surface of the substrate. The cut angle of the substrate cut out of the langasite single crystal, the propagation direction of surface acoustic waves on the substrate, and the thickness of the piezoelectric film are optimized depending on how to provide the piezoelectric film.

40 Claims, 60 Drawing Sheets

FOREIGN PATENT DOCUMENTS

| 2-7525 | 2/1990 | Japan . |
|---|---|---|
| 2-9485 | 3/1990 | Japan . |
| 2-290315 | 11/1990 | Japan . |
| 8-204499 | 8/1996 | Japan . |
| WO 97/25776 | 7/1997 | WIPO . |

OTHER PUBLICATIONS

IEEE International Frequency Control Symposium No. 1, 1993, Silvestrova et al, "Present Stage of La3Ga5SiO14 Research", pp. 348–350.

IEEE International Frequency Control Symposium No. 1, 1993, Gotalskaya et al, "Pecularities of Technology, Physical Properties and Applicatons of New Piezoelectric Material Langasite(La3Ga5SiO14)", pp. 339–347.

IEEE International Frequency Control Symposium No. 1, 1994, Dubovik et al, "Langasite (La3Ga5SiO14) an Optical Piezoelectric: Growth and Properties", pp. 43–47.

IEEE Ultrasonics Symposium, 1995, I.B. Yakovkin, et al. "Numerical and Experimental Investigation Saw in Langasite", p. 389–392.

IEEE Ultrasonics Symposium, 1995, K.S. Aleksandrov, et al. "Effects of Static Electric Field and of Mechanical Pressure on Surface Acoustic Waves Propagation in $La_3Ga_5SiO_{14}$ Piezoelectric Single Crystals", p. 409–412.

IEEE Ultrasonics Symposium, 1992, J.G. Gualtieri, et al. "Piezoelectric Materials for Saw Application", p. 403–412.

IEEE International Frequency Control Symposium, 1993, I.M.Silvestrova "Present Stage of $La_3Ga_5SiO_{14}$ Research" p. 348–350.

IEEE International Frequency Control Symposium, 1993, A.N. Gotalskaya, et al. Pecularities of Technology, Physical Properties and Applications of New Piezoelectric Material Langasite ($La_3Ga_5SiO_{14}$) p. 339–347.

IEEE International Frequency Control Symposium, 1994, M.F. Dubovik, et al. "Langasite ($La_3Ga_5SiO_{14}$) an Optical Piezoelectric:Growth and Properties" p. 43–47.

($\Phi=0°, \Theta=90°, \psi=80°$)

($\Phi=0°, \Theta=90°, \psi=80°$)

($\Phi=0°, \Theta=90°, \psi=80°$)

($\Phi = 0°, \Theta = 90°, \psi = -80°$)

($\Phi = 0°, \Theta = 90°, \psi = -80°$)

($\Phi = 0°, \Theta = 90°, \psi = -80°$)

($\Phi=0°$, $\Theta=90°$, $\psi=40°$)

($\Phi=0°$, $\Theta=90°$, $\psi=40°$)

($\Phi=0°$, $\Theta=90°$, $\psi=40°$)

($\Phi=0°$, $\Theta=90°$, $\psi=-30°$)

($\Phi=0°$, $\Theta=90°$, $\psi=-30°$)

($\Phi=0°$, $\Theta=90°$, $\psi=-30°$)

($\Phi=0°, \Theta=90°, \psi=30°$)

($\Phi=0°, \Theta=90°, \psi=30°$)

($\Phi=0°, \Theta=90°, \psi=30°$)

($\Phi=0°, \Theta=90°, \psi=80°$)

($\Phi=0°, \Theta=90°, \psi=80°$)

($\Phi=0°, \Theta=90°, \psi=80°$)

SURFACE ACOUSTIC WAVE DEVICE

BACKGROUND OF THE INVENTION

1. Field of the Invention

The present invention relates to a surface acoustic wave device comprising an interdigital electrode on a single crystal substrate.

2. Discussion of the Background

In recent years, mobile communication terminal equipment inclusive of cellular telephones has been rapidly popularized. This terminal equipment is particularly desired to be reduced in size and weight for reason of portability. To achieve size and weight reductions for the terminal equipment, electronic parts used therewith, too, should be essentially reduced in size and weight. For this reason, surface acoustic wave devices favorable for size and weight reductions, i.e., surface acoustic wave filters are often used for high- and intermediate-frequency parts of the terminal equipment. A surface acoustic wave device has on the surface of a piezoelectric substrate an interdigital electrode for exciting, receiving, reflecting, and propagating surface acoustic waves.

Among characteristics important to a piezoelectric substrate used for surface acoustic wave devices, there are the surface wave velocity of surface acoustic waves (SAW velocity), the temperature coefficient of a center frequency in the case of filters and of a resonance frequency in the case of resonators (the temperature coefficient of frequency: TCF), and an electromechanical coupling factor ($k^2$). Set out in Table 1 are the characteristics of various piezoelectric substrate known so far for surface acoustic wave devices. Hereinafter, these piezoelectric substrates will be referred to by the symbols used in Table 1. In this regard, it is to be noted that TCV (the temperature coefficient of SAW velocity) is a quantity representing the temperature dependence of the velocity of surface acoustic waves (the SAW velocity); that is, it has a value equivalent to that of the aforesaid TCF representing the temperature dependence of the center or resonance frequency. A large TCV value implies that the center frequency of a surface acoustic wave filter varies significantly with temperature.

of electrode fingers formed on Ad substrates. To enable such filters to be operated at high frequencies, therefore, it is preferable to resort to substrates having high SAW velocities, for instance, 64LN, and 36LT. Also, wide pass-band widths of 20 MHz or more are required for filters used on high-frequency parts. To achieve such broad passbands, however, it is essentially required that piezoelectric substrates have a large electromechanical coupling factor $k^2$. For these reasons, much use is made of 64LN, and 36LT.

On the other hand, a frequency band of 70 to 300 MHz is used as an intermediate frequency for mobile terminal equipment. When a filter using this frequency band as a center frequency is constructed with the use of a surface acoustic wave device, the use of the aforesaid 64LN or 36LT as a piezoelectric substrate causes the width of an electrode finger formed on the substrate to be much larger than that of the aforesaid filter used for a high-frequency part.

This will now be explained with reference to roughly calculated specific values. Here let d represent the width of an electrode finger of a surface acoustic wave transducer that forms a surface acoustic wave filter, $f_0$ indicate the center frequency of the surface acoustic wave filter, and V denote the SAW velocity of the piezoelectric substrate used. For these values, equation (1) then holds roughly $$f_0 = V/(4d) \tag{1}$$

If a surface acoustic wave filter having a center frequency of 1 GHz is constructed on the assumption that the SAW velocity is 4,000 m/s, then the width of its electrode finger is calculated from equation (1) to be $$d = 4{,}000~(\text{m/s})/[(4 \times 1{,}000~(\text{MHz})] = 1~\mu\text{m}$$

on the other hand, when an intermediate-frequency filter having a center frequency of 100 MHz is constructed using this piezoelectric substrate having an SAW velocity of 4,000 m/s, the electrode finger width required for this is given by $$d = 4{,}000~(\text{m/s})/[(4 \times 100~(\text{MHz})] = 10~\mu\text{m}$$

Thus, the required electrode finger width is 10 times as large as that for the high-frequency part filter. A large electrode finger width implies that a surface acoustic wave device

TABLE 1

| Symbol | Composition | Cut Angle | Propagation Direction | SAW Velocity (m/s) | $k^2$ (%) | TCV (ppm/° C.) |
|---|---|---|---|---|---|---|
| 128LN | LiNbO$_3$ | 128°-Rotation Y | X | 3992 | 5.5 | −74 |
| 64LN | LiNbO$_3$ | 64°-Rotation Y | X | 4742 | 11.3 | −79 |
| LT112 | LiTaO$_3$ | X | 112°-Rotation Y | 3288 | 0.64 | −18 |
| 36LT | LiTaO$_3$ | 36°-Rotation Y | X | 4212 | 4.7 | −45 |
| ST Crystal | Quartz | ST | X | 3158 | 0.14 | 0 (primary coef.) |
| BGO | Bi$_{12}$GeO$_{20}$ | (100) | (011) | 1681 | 1.2 | −122 |

As can be seen from Table 1, 64LN and 36LT have an SAW velocity of 4,000 m/s or higher, and so are suitable to construct filters for high-frequency parts of terminal equipment. Referring now to the reason for this, various systems are practically employed for mobile communications represented by cellular telephones all over the world, and are all used at frequencies of the order of 1 GHz. Accordingly, filters used for high-frequency parts of terminal equipment have a center frequency of approximately 1 GHz. Surface acoustic wave filters have a center frequency substantially proportional to the SAW velocities of piezoelectric substrates used but almost inversely proportional to the widths itself becomes large. To make a surface acoustic wave intermediate-frequency filter small, therefore, it is necessary to use a piezoelectric substrate having a low SAW velocity V, as can be appreciated from the aforesaid equation (1).

Among piezoelectric substrates known to have very limited SAW velocity, there is BGO such as one already referred to in the aforesaid Table 1. A BGO piezoelectric substrate has an SAW velocity of 1,681 m/s. However, the BGO piezoelectric substrate is unsuitable to construct an intermediate-frequency filter for extracting one channel signal alone, because its temperature coefficient of SAW velocity or its TCV is as large as −122 ppm/° C. The reason is that TCV is the quantity indicative of the temperature dependence of SAW velocity as already noted, and that a large TCV value implies that the center frequency of the surface acoustic wave filter varies largely with temperature, as can again be seen from the aforesaid equation (1). Thus, large TCV is unsuitable for an intermediate-frequency filter because undesired signals may possibly be extracted from other channel adjacent to the desired channel.

Among piezoelectric substrates known to have relatively low SAW velocity there is ST quartz crystal such as one referred to in the aforesaid Table 1. The ST quartz crystal is suitable to construct an intermediate-frequency filter because its temperature coefficient of SAW velocity or its TCV is almost zero (with a primary temperature coefficient a of zero). For this reason, most of intermediate-frequency surface acoustic wave filters used so far for mobile communication terminal equipment are constructed of ST quartz crystal piezoelectric substrates.

However, the SAW velocity of the ST quartz crystal substrate is 3,158 m/s or is not on a sufficiently reduced level, and so presents some limitation on size reductions.

In addition, the electromechanical coupling factor $k^2$ of the ST quartz crystal is 0.14%, and so is relatively small. Small $k^2$ implies that only a filter having a narrow passband is achievable. Adopted mainly so far for mobile communications, that is, cellular telephones are analog systems with a very narrow channel band width of, for instance, 12.5 kHz according to the Japanese NTT standard, 30 kHz according to the U.S. AMPS standard, and 25 kHz according to the European TACS standard. Thus, the fact that the aforesaid ST quartz crystal has a small electromechanical coupling factor $k^2$ has offered no problem whatsoever. In recent years, however, digital mobile communication systems have been developed, put to practical use, and so rapidly widespread in view of making effective use of frequency resources, compatibility with digital data communications, etc. The channel width of this digital system is very wide, for instance, 200 kHz and 1.7 MHz in the European cellular telephone GSM and cordless telephone DECT modes, respectively. If ST quartz crystal substrates are used for surface acoustic wave filters, it is then difficult to construct such wide-band intermediate-frequency filters using them.

On the other hand, it is known that the electromechanical coupling factor of a surface acoustic surface device can be increased by forming a piezoelectric film made up of zinc oxide, tantalum oxide, CdS or the like on the surface of a piezoelectric substrate made up of LiNbO$_3$ or the like, as typically set forth in JP-A 8-204499. However, a conventional piezoelectric substrate such as an LiNbO$_3$ substrate is not preferable because its temperature coefficient of SAW velocity, TCV, is negative, and so its overall TCV is greatly shifted to a negative side when a zinc oxide film is provided thereon.

As explained above, a problem with a conventional surface acoustic wave device is that when a piezoelectric substrate such as the aforesaid 64LN, 36LT or the like is used, it is possible to make its passband broad, but device size becomes large because that substrate has high SAW velocity. Another problem is that when the aforesaid BGO substrate having low SAW velocity is used to achieve device size reductions, good-enough selectivity is not obtained due to too large a temperature coefficient of SAW velocity or TCV. In either case, characteristics good enough for any intermediate- frequency surface acoustic wave filter are unachievable.

The ST quartz crystal substrate having a small temperature coefficient of SAW velocity, TCV, presents some limitation on size reductions due to the fact that its SAW velocity is not sufficiently reduced, and makes it difficult to achieve wide band due to the fact that its electro- mechanical coupling factor is relatively small.

SUMMARY OF THE INVENTION

It is an object of the invention to provide a surface acoustic wave device which is of small size, and good-enough selectivity. Another object of the invention is to provide a surface acoustic wave device which is of small size, and broad passband. Yet another object of the invention is to provide a surface acoustic wave device which is of small size, and good-enough selectivity, and broad passband.

The aforesaid objects are achievable by any one of the embodiments recited below as 1 to 4.

Embodiment 1

(1) A surface acoustic wave device comprising a substrate, an interdigital electrode on a surface thereof, and a piezoelectric film for covering said surface of said substrate and a surface of said interdigital electrode, wherein:

said substrate is a langasite single crystal belonging to a point group 32, and said piezoelectric film is made up of zinc oxide.

(2) The surface acoustic wave device of (1), wherein said piezoelectric film has a piezoelectric axis oriented substantially perpendicularly with respect to said surface of said substrate.

(3) The surface acoustic wave device of (1), wherein:

when a cut angle of said substrate cut out of the langasite single crystal and a propagation direction of a surface acoustic wave on said substrate are represented in terms of Euler angles ($\phi$, $\theta$, $\psi$), $\phi$, $\theta$, and $\psi$ lie within the following general area I:

Area I $-5° \leq \phi \leq$ to 5°

$85° \leq \theta \leq 95°$ $-90° \leq \psi < 90°$ (4) The surface acoustic wave device of (1), wherein:

when a cut angle of said substrate cut out of the langasite single crystal and a propagation direction of a surface acoustic wave on said substrate are represented in terms of Euler angles ($\phi$, $\theta$, $\psi$), $\phi$, $\theta$,and $\psi$ lie within the following area I-1:

Area I-1

$-5° \leq \phi \leq 5°$ $85° \leq \theta \leq 95°$ $-90° \leq \psi < -70°$ (5) The surface acoustic wave device of (4), which satisfies:

$$h/\lambda = 0.2 \text{ to } 0.8$$

where h is a thickness of said piezoelectric film on said surface of said substrate, and $\lambda$ is a wavelength of said surface acoustic wave.

(6) The surface acoustic wave device of (1), wherein:

when a cut angle of said substrate cut out of the langasite single crystal and a propagation direction of a surface acoustic wave on said substrate are represented in terms of Euler angles ($\phi$, $\theta$, $\psi$), $\phi$, $\theta$, and $\psi$ lie within the following area I-2:

Area I-2

−5°≦φ≦5°

85°≦θ≦95°

−70°<ψ<−50°

(7) The surface acoustic wave device of (6), which satisfies:

$h/\lambda = 0.25$ to $0.7$ where h is a thickness of said piezoelectric film on said surface of said substrate, and λ is a wavelength of said surface acoustic wave.

(8) The surface acoustic wave device of (1), wherein:

when a cut angle of said substrate cut out of the langasite single crystal and a propagation direction of a surface acoustic wave on said substrate are represented in terms of Euler angles (φ, θ, ψ), φ, θ, and ψ lie within the following area I-3:

Area I-3

−5°≦φ≦5°

85°≦θ≦95°

−50°≦ψ<−35°

(9) The surface acoustic wave device of (8), which satisfies:

$h/\lambda = 0.25$ to $0.45$ where h is a thickness of said piezoelectric film on said surface of said substrate, and λ is a wavelength of said surface acoustic wave.

(10) The surface acoustic wave device of (1), wherein:

when a cut angle of said substrate cut out of the langasite single crystal and a propagation direction of a surface acoustic wave on said substrate are represented in terms of Euler angles (φ, θ, ψ), φ, θ, and ψ lie within the following area I-4:

Area I-4

−5°≦φ≦5°

85°≦θ≦95°

−35°≦ψ<−25°

(11) The surface acoustic wave device of (10), which satisfies:

$0 < h/\lambda \leq 0.5$ where h is a thickness of said piezoelectric film on said surface of said substrate, and λ is a wavelength of said surface acoustic wave.

(12) The surface acoustic wave device of (1), wherein:

when a cut angle of said substrate cut out of the langasite single crystal and a propagation direction of a surface acoustic wave on said substrate are represented in terms of Euler angles (φ, θ, ψ), φ, θ, and ψ lie within the following area I-5:

Area I-5

−5°≦φ≦5°

85°≦θ≦95°

−25°≦ψ≦−10°

(13) The surface acoustic wave device of (12), which satisfies:

$0 < h/\lambda \leq 0.45$ where h is a thickness of said piezoelectric film on said surface of said substrate, and λ is a wavelength of said surface acoustic wave.

(14) The surface acoustic wave device of (1), wherein:

when a cut angle of said substrate cut out of the langasite single crystal and a propagation direction of a surface acoustic wave on said substrate are represented in terms of Euler angles (φ, θ, ψ), φ, θ, and ψ lie within the following area I-6:

Area I-6

−5°≦φ≦5°

85°≦θ≦95°

10°≦ψ<25°

(15) The surface acoustic wave device of (14), which satisfies:

$0 < h/\lambda \leq 0.4$ where h is a thickness of said piezoelectric film on said surface of said substrate, and k is a wavelength of said surface acoustic wave.

(16) The surface acoustic wave device of (1), wherein:

when a cut angle of said substrate cut out of the langasite single crystal and a propagation direction of a surface acoustic wave on said substrate are represented in terms of Euler angles (φ, θ, ψ), φ, θ, and ψ lie within the following area I-7:

Area I-7

−5°≦φ≦5°

85°≦θ≦95°

25°≦ψ<35°

(17) The surface acoustic wave device of (16), which satisfies:

$0 < h/\lambda \leq 0.45$ where h is a thickness of said piezoelectric film on said surface of said substrate, and λ is a wavelength of said surface acoustic wave.

(18) The surface acoustic wave device of (1), wherein:

when a cut angle of said substrate cut out of the langasite single crystal and a propagation direction of a surface acoustic wave on said substrate are represented in terms of Euler angles (φ, θ, ψ), φ, θ, and ψ lie within the following area I-8:

Area I-8

−5°≦φ≦5°

85°≦θ≦95°

35°≦ψ<50°

(19) The surface acoustic wave device of (18), which satisfies:

$0 < h/\lambda \leq 0.4$ where h is a thickness of said piezoelectric film on said surface of said substrate, and λ is a wavelength of said surface acoustic wave.

(20) The surface acoustic wave device of (1), wherein:

when a cut angle of said substrate cut out of the langasite single crystal and a propagation direction of a surface acoustic wave on said substrate are represented in terms of Euler angles (φ, θ, ψ), φ, θ, and ψ lie within the following area I-9:

Area I-9

−5°≦φ≦5°

85°≦θ≦95°

50°≦ψ<70°

(21) The surface acoustic wave device of (20), which satisfies:

$$h/\lambda = 0.15 \text{ to } 0.7$$

where h is a thickness of said piezoelectric film on said surface of said substrate, and λ is a wavelength of said surface acoustic wave.

(22) The surface acoustic wave device of (1), wherein:
when a cut angle of said substrate cut out of the langasite single crystal and a propagation direction of a surface acoustic wave on said substrate are represented in terms of Euler angles (φ, θ, ψ), φ, θ, and ψ lie within the following area I-10:
Area I-10
$-5° \leq \phi \leq 5°$
$85° \leq \theta \leq 95°$
$70° \leq \psi < 90°$

(23) The surface acoustic wave device of (22), which satisfies:

$$h/\lambda = 0.15 \text{ to } 0.8$$

where h is a thickness of said piezoelectric film on said surface of said substrate, and λ is a wavelength of said surface acoustic wave.

Embodiment 2

(1) A surface acoustic wave device comprising a substrate, a piezoelectric film on a surface thereof, and an interdigital electrode on a surface of said piezoelectric film, wherein:
said substrate is a langasite single crystal belonging to a point group 32, and said piezoelectric film is made up of zinc oxide.

(2) The surface acoustic wave device of (1), wherein said piezoelectric film has a piezoelectric axis oriented substantially perpendicularly with respect to said surface of said substrate.

(3) The surface acoustic wave device of (1), wherein:
when a cut angle of said substrate cut out of the langasite single crystal and a propagation direction of a surface acoustic wave on said substrate are represented in terms of Euler angles (φ, θ, ψ), φ, θ, and ψ lie within the following general area II:
Area II
$-5° \leq \phi \leq 5°$
$85° \leq \theta \leq 95°$
$-90° \leq \psi < 90°$ (4) The surface acoustic wave device of (1), wherein:
when a cut angle of said substrate cut out of the langasite single crystal and a propagation direction of a surface acoustic wave on said substrate are represented in terms of Euler angles (φ, θ, ψ), φ, θ, and ψ lie within the following area II-1:
Area II-1
$-5° \leq \phi \leq 5°$
$85° \leq \theta \leq 95°$
$-90° \leq \psi < -70°$ (5) The surface acoustic wave device of (4), which satisfies:

$$h/\lambda = 0.05 \text{ to } 0.8$$

where h is a thickness of said piezoelectric film, and λ is a wavelength of said surface acoustic wave.

(6) The surface acoustic wave device of (1), wherein:
when a cut angle of said substrate cut out of the langasite single crystal and a propagation direction of a surface acoustic wave on said substrate are represented in terms of Euler angles (φ, θ, ψ), φ, θ, and ψ lie within the following area II-2:
Area II-2
$-5° \leq \phi \leq 5°$
$85° \leq \theta \leq 95°$
$-70° \leq \psi < -50°$ (7) The surface acoustic wave device of (6), which satisfies:

$$h/\lambda = 0.05 \text{ to } 0.75$$

where h is a thickness of said piezoelectric film, and λ is a wavelength of said surface acoustic wave.

(8) The surface acoustic wave device of (1), wherein:
when a cut angle of said substrate cut out of the langasite single crystal and a propagation direction of a surface acoustic wave on said substrate are represented in terms of Euler angles (φ, θ, ψ), φ, θ, and ψ lie within the following area II-3:
Area II-3
$-5° \leq \phi \leq 5°$
$85° \leq \theta \leq 95°$
$-50° \leq \psi < -35°$ (9) The surface acoustic wave device of (8), which satisfies:

$$0 < h/\lambda \leq 0.45$$

where h is a thickness of said piezoelectric film, and λ is a wavelength of said surface acoustic wave.

(10) The surface acoustic wave device of (1), wherein:
when a cut angle of said substrate cut out of the langasite single crystal and a propagation direction of a surface acoustic wave on said substrate are represented in terms of Euler angles (φ, θ, ψ), φ, θ, and ψ lie within the following area II-4:
Area II-4
$-5° \leq \phi \leq 5°$
$85° \leq \theta \leq 95°$
$-35° \leq \psi < -25°$

(11) The surface acoustic wave device of (10), which satisfies:

$$0 < h/\lambda \leq 0.5$$

where h is a thickness of said piezoelectric film, and λ is a wavelength of said surface acoustic wave.

(12) The surface acoustic wave device of (1), wherein:
when a cut angle of said substrate cut out of the langasite single crystal and a propagation direction of a surface acoustic wave on said substrate are represented in terms of Euler angles (φ, θ, ψ), φ, θ, and ψ lie within the following area II-5:
Area II-5
$-5° \leq \phi \leq 5°$
$85° \leq \theta \leq 95°$
$-25° \leq \psi < -10°$

(13) The surface acoustic wave device of (12), which satisfies:

$$0 < h/\lambda \leq 0.45$$

where h is a thickness of said piezoelectric film, and λ is a wavelength of said surface acoustic wave.

(14) The surface acoustic wave device of (1), wherein:

when a cut angle of said substrate cut out of the langasite single crystal and a propagation direction of a surface acoustic wave on said substrate are represented in terms of Euler angles (φ, θ, ψ), φ, θ, and ψ lie within the following area II-6:

Area II-6

−5°≦φ≦5°

85°≦θ≦95°

10°≦ψ<25°

(15) The surface acoustic wave device of (14), which satisfies:

$$0 < h/\lambda \leq 0.4$$

where h is a thickness of said piezoelectric film on said surface of said substrate, and λ is a wavelength of said surface acoustic wave.

(16) The surface acoustic wave device of (1), wherein:

when a cut angle of said substrate cut out of the langasite single crystal and a propagation direction of a surface acoustic wave on said substrate are represented in terms of Euler angles (φ, θ, ψ), φ, θ, and ψ lie within the following area II-7:

Area II-7

−5°≦φ≦5°

85°≦θ≦95°

25°≦ψ<35°

(17) The surface acoustic wave device of (16), which satisfies:

$$0 < h/\lambda \leq 0.45$$

where h is a thickness of said piezoelectric film, and λ is a wavelength of said surface acoustic wave.

(18) The surface acoustic wave device of (1), wherein:

when a cut angle of said substrate cut out of the langasite single crystal and a propagation direction of a surface acoustic wave on said substrate are represented in terms of Euler angles (φ, θ, ψ), φ, θ, and ψ lie within the following area II-8:

Area II-8

−5°≦φ≦5°

85°≦θ≦95°

35°≦ψ<50°

(19) The surface acoustic wave device of (18), which satisfies:

$$0 < h/\lambda < 0.4$$

where h is a thickness of said piezoelectric film, and λ is a wavelength of said surface acoustic wave.

(20) The surface acoustic wave device of (1), wherein:

when a cut angle of said substrate cut out of the langasite single crystal and a propagation direction of a surface acoustic wave on said substrate are represented in terms of Euler angles (φ, θ, ψ), φ, θ, and ψ lie within the following area II-9:

Area II-9

−5°≦φ≦5°

85°≦θ≦95°

50°≦ψ<70°

(21) The surface acoustic wave device of (20), which satisfies:

$$h/\lambda = 0.05 \text{ to } 0.7$$

where h is a thickness of said piezoelectric film, and λ is a wavelength of said surface acoustic wave.

(22) The surface acoustic wave device of (1), wherein:

when a cut angle of said substrate cut out of the langasite single crystal and a propagation direction of a surface acoustic wave on said substrate are represented in terms of Euler angles (φ, θ, ψ), φ, θ, and ψ lie within the following area II-10:

Area II-10

−5°≦φ≦5°

85°≦θ≦95°

70°≦ψ<90°

(23) The surface acoustic wave device of (22), which satisfies:

$$h/\lambda = 0.05 \text{ to } 0.8$$

where h is a thickness of said piezoelectric film, and λ is a wavelength of said surface acoustic wave.

Embodiment 3

(1) A surface acoustic wave device comprising a substrate, an interdigital electrode on a surface thereof, a piezoelectric film for covering said surface of said substrate and a surface of said interdigital electrode, and an opposite electrode film on a surface of said piezoelectric film, wherein:

said substrate is a langasite single crystal belonging to a point group 32, and said piezoelectric film is made up of zinc oxide.

(2) The surface acoustic wave device of (1), wherein said piezoelectric film has a piezoelectric axis oriented substantially perpendicularly with respect to said surface of said substrate.

(3) The surface acoustic wave device of (1), wherein:

when a cut angle of said substrate cut out of the langasite single crystal and a propagation direction of a surface acoustic wave on said substrate are represented in terms of Euler angles (φ, θ, ψ), φ, θ, and ψ lie within the following general area III:

Area III

−5°≦φ≦5°

85°≦θ≦95°

90°≦ψ<90°

(4) The surface acoustic wave device of (1), wherein:

when a cut angle of said substrate cut out of the langasite single crystal and a propagation direction of a surface acoustic wave on said substrate are represented in terms of Euler angles (φ, θ, ψ), φ, θ, and ψ lie within the following area III-1:

Area III-1

−5°≦φ≦5°

85°≦θ≦95°

90°≦ψ<−70°

(5) The surface acoustic wave device of (4), which satisfies:

$$0 < h/\lambda \leq 0.1$$

where h is a thickness of said piezoelectric film on said surface of said substrate, and λ is a wavelength of said surface acoustic wave.

(6) The surface acoustic wave device of (4), which satisfies:

$$h/\lambda = 0.3 \text{ to } 0.8$$

where h is a thickness of said piezoelectric film on said surface of said substrate, and λ is a wavelength of said surface acoustic wave.

(7) The surface acoustic wave device of (1), wherein:
when a cut angle of said substrate cut out of the langasite single crystal and a propagation direction of a surface acoustic wave on said substrate are represented in terms of Euler angles ($\phi$, $\theta$, $\psi$), $\phi$, $\theta$, and $\psi$ lie within the following area III-2:
Area III-2
$-5° \leq \phi \leq 5°$
$85° \leq \theta \leq 95°$
$70° \leq \psi < -50°$ (8) The surface acoustic wave device of (7), which satisfies:

$0 < h/\lambda \leq 0.1$ where h is a thickness of said piezoelectric film on said surface of said substrate, and $\lambda$ is a wavelength of said surface acoustic wave.

(9) The surface acoustic wave device of (7), which satisfies:

$h/\lambda = 0.35$ to $0.8$ where h is a thickness of said piezoelectric film on said surface of said substrate, and $\lambda$ is a wavelength of said surface acoustic wave.

(10) The surface acoustic wave device of (1), wherein:
when a cut angle of said substrate cut out of the langasite single crystal and a propagation direction of a surface acoustic wave on said substrate are represented in terms of Euler angles ($\phi$, $\theta$, $\psi$), $\phi$, $\theta$, and $\psi$ lie within the following area III-3:
Area III-3
$-5° \leq \phi \leq 5°$
$85° \leq \theta \leq 95°$
$-50° \leq \psi \leq -35°$ from which $-30°$ is excluded

(11) The surface acoustic wave device of (10), which satisfies:

$0 < h/\lambda \leq 0.15$ where h is a thickness of said piezoelectric film on said surface of said substrate, and $\lambda$ is a wavelength of said surface acoustic wave.

(12) The surface acoustic wave device of (10), which satisfies:

$h/\lambda = 0.35$ to $0.5$ where h is a thickness of said piezoelectric film on said surface of said substrate, and $\lambda$ is a wavelength of said surface acoustic wave.

(13) The surface acoustic wave device of (1), wherein:
when a cut angle of said substrate cut out of the langasite single crystal and a propagation direction of a surface acoustic wave on said substrate are represented in terms of Euler angles ( , $\theta$, $\psi$), $\phi$, $\theta$, and $\psi$ lie within the following area III-4:
Area III-4
$-5° \leq \phi \leq 5°$
$85° \leq \theta \leq 95°$
$-35° \leq \psi \leq -25°$

(14) The surface acoustic wave device of (13), which satisfies:

$0 < h/\lambda \leq 0.15$ where h is a thickness of said piezoelectric film on said surface of said substrate, and $\lambda$ is a wavelength of said surface acoustic wave.

(15) The surface acoustic wave device of (13), which satisfies:

$h/\lambda = 0.3$ to $0.5$ where h is a thickness of said piezoelectric film on said surface of said substrate, and $\lambda$ is a wavelength of said surface acoustic wave.

(16) The surface acoustic wave device of (1), wherein:
when a cut angle of said substrate cut out of the langasite single crystal and a propagation direction of a surface acoustic wave on said substrate are represented in terms of Euler angles ($\phi$, $\theta$, $\psi$), $\phi$, $\theta$, and $\psi$ lie within the following area III-5:
Area III-5
$-5° \leq \phi \leq 5°$
$85° \leq \theta \leq 95°$
$-25° \leq \psi \leq -10°$

(17) The surface acoustic wave device of (16), which satisfies:

$0 < h/\lambda \leq 0.15$ where h is a thickness of said piezoelectric film on said surface of said substrate, and $\lambda$ is a wavelength of said surface acoustic wave. (18) The surface acoustic wave device of (16), which satisfies:

$h/\lambda = 0.3$ to $0.45$ where h is a thickness of said piezoelectric film on said surface of said substrate, and $\lambda$ is a wavelength of said surface acoustic wave.

(19) The surface acoustic wave device of (1), wherein:
when a cut angle of said substrate cut out of the langasite single crystal and a propagation direction of a surface acoustic wave on said substrate are represented in terms of Euler angles ($\phi$, $\theta$, $\psi$), $\phi$, $\theta$, and $\psi$ lie within the following area III-6:
Area III-6
$-5° \leq \phi \leq 5°$
$85° \leq \theta \leq 95°$
$10° \leq \psi < 25°$

(20) The surface acoustic wave device of (19), which satisfies:

$0 < h/\lambda \leq 0.45$ where h is a thickness of said piezoelectric film on said surface of said substrate, and $\lambda$ is a wavelength of said surface acoustic wave.

(21) The surface acoustic wave device of (1), wherein:
when a cut angle of said substrate cut out of the langasite single crystal and a propagation direction of a surface acoustic wave on said substrate are represented in terms of Euler angles ($\phi$, $\theta$, $\psi$), $\phi$, $\theta$, and $\psi$ lie within the following area III-7:
Area III-7
$-5° \leq \phi \leq 5°$
$85° \leq \theta \leq 95°$
$25° \leq \psi < -50°$

(22) The surface acoustic wave device of (21), which satisfies:

$0 < h/\lambda \leq 0.5$ where h is a thickness of said piezoelectric film on said surface of said substrate, and $\lambda$ is a wavelength of said surface acoustic wave.

(23) The surface acoustic wave device of (1), wherein:

when a cut angle of said substrate cut out of the langasite single crystal and a propagation direction of a surface acoustic wave on said substrate are represented in terms of Euler angles ($\phi$, $\theta$, $\psi$), $\phi$, $\theta$, and $\psi$ lie within the following area III-8:

Area III-8
$-5° \leq \phi \leq 5°$
$85° \leq \theta \leq 95°$
$35° \leq \psi < 50°$

(24) The surface acoustic wave device of (23), which satisfies:

$$0 < h/\lambda \leq 0.45$$

where h is a thickness of said piezoelectric film on said surface of said substrate, and $\lambda$ is a wavelength of said surface acoustic wave.

(25) The surface acoustic wave device of (1), wherein:

when a cut angle of said substrate cut out of the langasite single crystal and a propagation direction of a surface acoustic wave on said substrate are represented in terms of Euler angles ($\phi$, $\theta$, $\psi$), $\phi$, $\theta$, and $\psi$ lie within the following area III-9:

Area III-9
$-5° \leq \phi \leq 5°$
$85° \leq \theta \leq 95°$
$50° \leq \psi < 70°$

(26) The surface acoustic wave device of (25), which satisfies:

$$0 < h/\lambda \leq 0.05$$

where h is a thickness of said piezoelectric film on said surface of said substrate, and $\lambda$ is a wavelength of said surface acoustic wave.

(27) The surface acoustic wave device of (25), which satisfies:

$$h/\lambda = 0.2 \text{ to } 0.8$$

where h is a thickness of said piezoelectric film on said surface of said substrate, and $\lambda$ is a wavelength of said surface acoustic wave.

(28) The surface acoustic wave device of (1), wherein:

when a cut angle of said substrate cut out of the langasite single crystal and a propagation direction of a surface acoustic wave on said substrate are represented in terms of Euler angles ($\phi$, $\theta$, $\psi$), $\phi$, $\theta$, and $\psi$ lie within the following area III-10:

Area III-10
$-5° \leq \phi \leq 5°$
$85° \leq \theta \leq 95°$
$70° \leq \psi < 90°$

(29) The surface acoustic wave device of (28), which satisfies:

$$0 < h/\lambda \leq 0.05$$

where h is a thickness of said piezoelectric film on said surface of said substrate, and $\lambda$ is a wavelength of said surface acoustic wave.

(30) The surface acoustic wave device of (28), which satisfies:

$$h/\lambda = 0.25 \text{ to } 0.8$$

where h is a thickness of said piezoelectric film on said surface of said substrate, and $\lambda$ is a wavelength of said surface acoustic wave.

Embodiment 4

(1) A surface acoustic wave device comprising a substrate, an opposite electrode film on a surface thereof, a piezoelectric film on said opposite electrode film, and an interdigital electrode on a surface of said piezoelectric film, wherein:

said substrate is a langasite single crystal belonging to a point group 32, and said piezoelectric film is made up of zinc oxide.

(2) The surface acoustic wave device of (1), wherein said piezoelectric film has a piezoelectric axis oriented substantially perpendicularly with respect to said surface of said substrate.

(3) The surface acoustic wave device of (1), wherein:

when a cut angle of said substrate cut out of the langasite single crystal and a propagation direction of a surface acoustic wave on said substrate are represented in terms of Euler angles ($\phi$, $\theta$, $\psi$), $\phi$, $\theta$, and $\psi$ lie within the following general area IV:

Area IV
$-5° \leq \phi \leq 5°$
$85° \leq \theta \leq 95°$
$-90° \leq \psi < 90°$ (4) The surface acoustic wave device of (1), wherein:

when a cut angle of said substrate cut out of the langasite single crystal and a propagation direction of a surface acoustic wave on said substrate are represented in terms of Euler angles ($\phi$, $\theta$, $\psi$), $\phi$, $\theta$, and $\psi$ lie within the following area IV-1:

Area IV-1
$-5° \leq \phi \leq 5°$
$85° \leq \theta \leq 95°$
$-90° \leq \psi < -70°$ (5) The surface acoustic wave device of (4), which satisfies:

$$h/\lambda = 0.05 \text{ to } 0.8$$

where h is a thickness of said piezoelectric film, and $\lambda$ is a wavelength of said surface acoustic wave.

(6) The surface acoustic wave device of (1), wherein:

when a cut angle of said substrate cut out of the langasite single crystal and a propagation direction of a surface acoustic wave on said substrate are represented in terms of Euler angles ($\phi$, $\theta$, $\psi$), $\phi$, $\theta$, and $\psi$ lie within the following area IV-2:

Area IV-2
$-5° \leq \phi \leq 5°$
$85° \leq \theta \leq 95°$
$-70° \leq \psi < -50°$ (7) The surface acoustic wave device of (6), which satisfies:

$$h/\lambda = 0.05 \text{ to } 0.8$$

where h is a thickness of said piezoelectric film, and $\lambda$ is a wavelength of said surface acoustic wave.

(8) The surface acoustic wave device of (1), wherein:

when a cut angle of said substrate cut out of the langasite single crystal and a propagation direction of a surface acoustic wave on said substrate are represented in terms of Euler angles ($\phi$, $\theta$, $\psi$), $\phi$, $\theta$, and $\psi$ lie within the following area IV-3:

Area IV-3

$-5° \leq \phi \leq 5°$ $85° \leq \theta \leq 95°$ $-50° \leq \psi < -35°$ (9) The surface acoustic wave device of (8), which satisfies:

$h/\lambda = 0.05$ to $0.45$ where h is a thickness of said piezoelectric film, and $\lambda$ is a wavelength of said surface acoustic wave.

(10) The surface acoustic wave device of (1), wherein:
when a cut angle of said substrate cut out of the langasite single crystal and a propagation direction of a surface acoustic wave on said substrate are represented in terms of Euler angles ($\phi$, $\theta$, $\psi$), $\phi$, $\theta$, and $\psi$ lie within the following area IV-4:

Area IV-4

$-5° \leq \phi \leq 5°$ $85° \leq \theta \leq 95°$ $-35° \leq \psi < -25°$

(11) The surface acoustic wave device of (10), which satisfies:

$h/\lambda = 0.05$ to $0.5$ where h is a thickness of said piezoelectric film, and $\lambda$ is a wavelength of said surface acoustic wave.

(12) The surface acoustic wave device of (1), wherein:
when a cut angle of said substrate cut out of the langasite single crystal and a propagation direction of a surface acoustic wave on said substrate are represented in terms of Euler angles ($\phi$, $\theta$, $\psi$), $\phi$, $\theta$, and $\psi$ lie within the following area IV-5:

Area IV-5

$-5° \leq \phi \leq 5°$ $85° \leq \theta \leq 95°$ $-25° \leq \psi \leq -10°$

(13) The surface acoustic wave device of (12), which satisfies:

$h/\lambda = 0.05$ to $0.45$ where h is a thickness of said piezoelectric film, and $\lambda$ is a wavelength of said surface acoustic wave.

(14) The surface acoustic wave device of (1), wherein:
when a cut angle of said substrate cut out of the langasite single crystal and a propagation direction of a surface acoustic wave on said substrate are represented in terms of Euler angles ($\phi$, $\theta$, $\psi$), $\phi$, $\theta$, and $\psi$ lie within the following area IV-6:

Area IV-6

$-5° \leq \phi \leq 5°$ $85° \leq \theta \leq 95°$ $10° \leq \psi < 25°$

(15) The surface acoustic wave device of (14), which satisfies:

$h/\lambda = 0.05$ to $0.45$ where h is a thickness of said piezoelectric film on said surface of said substrate, and X is a wavelength of said surface acoustic wave.

(16) The surface acoustic wave device of (1), wherein:
when a cut angle of said substrate cut out of the langasite single crystal and a propagation direction of a surface acoustic wave on said substrate are represented in terms of Euler angles ($\phi$, $\theta$, $\psi$), $\phi$, $\theta$, and $\psi$ lie within the following area IV-7:

Area IV-7

$-5° \leq \phi \leq 5°$ $85° \leq \theta \leq 95°$ $25° \leq \psi < 35°$

(17) The surface acoustic wave device of (16), which satisfies:

$h/\lambda = 0.05$ to $0.5$ where h is a thickness of said piezoelectric film, and $\lambda$ is a wavelength of said surface acoustic wave.

(18) The surface acoustic wave device of (1), wherein:
when a cut angle of said substrate cut out of the langasite single crystal and a propagation direction of a surface acoustic wave on said substrate are represented in terms of Euler angles ($\phi$, $\theta$, $\psi$), $\phi$, $\theta$, and $\psi$ lie within the following area IV-8:

Area IV-8

$-5° \leq \phi \leq 5°$ $85° \leq \theta \leq 95°$ $35° \leq \psi < 50°$

(19) The surface acoustic wave device of (18), which satisfies:

$h/\lambda = 0.05$ to $0.45$ where h is a thickness of said piezoelectric film, and $\lambda$ is a wavelength of said surface acoustic wave.

(20) The surface acoustic wave device of (1), wherein:
when a cut angle of said substrate cut out of the langasite single crystal and a propagation direction of a surface acoustic wave on said substrate are represented in terms of Euler angles ($\phi$, $\theta$, $\psi$), $\phi$, $\theta$, and $\psi$ lie within the following area IV-9:

Area IV-9

$-5° \leq \phi \leq 5°$ $85° \leq \theta \leq 95°$ $50° \leq \psi < 70°$

(21) The surface acoustic wave device of (20), which satisfies:

$h/\lambda = 0.05$ to $0.8$ where h is a thickness of said piezoelectric film, and $\lambda$ is a wavelength of said surface acoustic wave.

(22) The surface acoustic wave device of (1), wherein:
when a cut angle of said substrate cut out of the langasite single crystal and a propagation direction of a surface acoustic wave on said substrate are represented in terms of Euler angles ($\phi$, $\theta$, $\psi$), $\phi$, $\theta$, and $\psi$ lie within the following area IV-10:

Area IV-10

$-5° \leq \phi \leq 5°$ $85° \leq \theta \leq 95°$ $70° \leq \psi < 90°$

(23) The surface acoustic wave device of (22), which satisfies:

$h/\lambda = 0.05$ to $0.8$ where h is a thickness of said piezoelectric film, and $\lambda$ is a wavelength of said surface acoustic wave.

DESCRIPTION OF THE PREFERRED EMBODIMENTS

Embodiment 1

Figure 1:
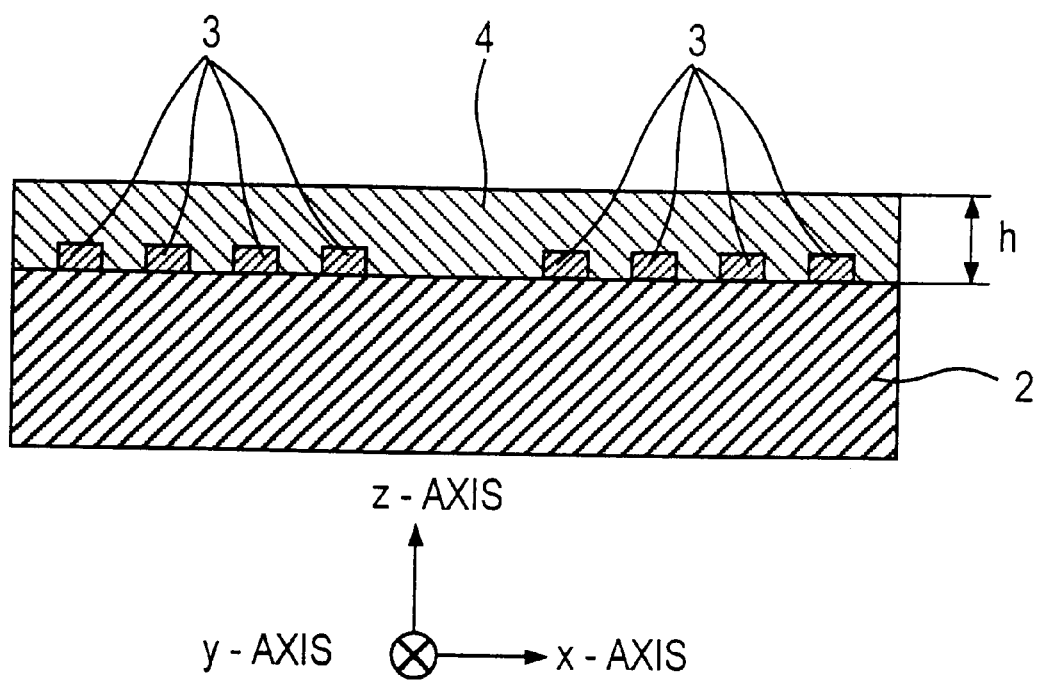
FIG. 1 is a sectional representation of one exemplary construction of the surface acoustic wave device according to embodiment 1 of the invention.

In embodiment 1, the langasite single crystal substrate is used as the substrate material for a surface acoustic wave device, and φ, θ, and ψ representing the cut angle of the substrate cut out of the langasite single crystal and the propagation direction of surface acoustic waves on the substrate are selected from within the general area I. This makes it possible to decrease the SAW velocity, increase the electromechanical coupling factor, and decrease the temperature coefficient of SAW velocity or TCV. In embodiment 1, the piezoelectric film made up of zinc oxide is further provided on the surface of the langasite single crystal substrate. Then, the thickness of the piezoelectric film is controlled depending on the cut angle of the substrate out of the langasite single crystal and the propagation direction of surface acoustic waves on the substrate, thereby achieving a further increase in the electromechanical coupling factor and/or a further TCV decrease. This in turn enables to reduce the size of a surface acoustic wave device, and improve the passband width, and temperature stability of a surface acoustic wave device when it is used as a filter. In particular, it is possible to achieve a surface acoustic wave filter best suited for use for mobile communication terminal equipment operated at intermediate frequencies.

The areas I-1 to I-10 are encompassed in the general area I, and a preferable thickness range for the piezoelectric film exists per each area. At areas I-1 and I-10 of these areas, the absolute value of TCV can be extremely reduced by a selection of the thickness of the piezoelectric film and, in some cases, can be substantially reduced to zero. It is thus possible to achieve a surface acoustic wave device that is particularly excellent in selectivity.

It is known that the electromechanical coupling factor of a surface acoustic wave device can be increased by forming a piezoelectric film of zinc oxide, tantalum oxide, CdS or the like on the surface of a piezoelectric substrate of $LiNbO_3$ or the like, as typically set forth in JP-A 8-204499. Never until now, however, is a surface acoustic wave device comprising a piezoelectric film formed on the surface of a langasite single crystal substrate proposed in the art. Here, the langasite substrate can have a positive TCV by a selection of the cut angle thereof out of the langasite single crystal and the propagation direction of surface acoustic waves thereon. On the other hand, the zinc oxide film has a negative TCV. When the zinc oxide film is formed on the langasite substrate, both TCVs are offset each other so that the combined TCV can be extremely reduced. In this regard, a conventional piezoelectric substrate such as an $LiNbO_3$ substrate having a negative TCV is not preferable because, when combined with a zinc oxide film, the combined TCV is greatly shifted to a negative side. According to embodiment 1 wherein a specific langasite substrate is used in combination with the zinc oxide film, it is possible to realize TCV decreases which would be unachievable by a conventional piezoelectric substrate and film combination.

Embodiment 2

In embodiment 2, a piezoelectric film and an interdigital electrode are formed on a piezoelectric substrate in the described order to construct a surface acoustic wave device. A langasite single crystal substrate is used for the piezoelectric substrate while a zinc oxide film is used for the piezoelectric film. By the provision of the piezoelectric film it is possible to increase the electromechanical coupling factor.

It is known that the electromechanical coupling factor can be increased by forming a piezoelectric film on the surface of a piezoelectric substrate, as typically disclosed in JP-A 8-204499. When a conventional piezoelectric substrate such as an $LiNbO_3$ substrate having a negative TCV is used in combination with a zinc oxide film, however, the combined TCV is greatly shifted to a negative side.

In the present invention, the langasite single crystal is used for the substrate material. The langasite substrate can have a positive TCV by a selection of the cut angle thereof out of the langasite single crystal and the propagation direction of surface acoustic waves thereon. On the other hand, the zinc oxide film has a negative TCV. When the zinc oxide film is formed on the langasite substrate, both TCVs are offset each other so that the combined TCV can be extremely reduced. It is thus possible to realize a surface acoustic wave device unachievable by a conventional piezoelectric substrate and film combination, i.e., a surface acoustic wave device having an increased electromechanical coupling factor and a reduced TCV absolute value.

JP-A 8-204499 also discloses that a piezoelectric film is formed on an interdigital electrode provided on a piezoelectric substrate. In embodiment 2 of the invention, on the other hand, the interdigital electrode is formed on the piezoelectric film provided on the piezoelectric substrate. In other words, a homogeneous piezoelectric film is obtainable in embodiment 2 because the piezoelectric film grows on the flat surface of the langasite single crystal substrate. It is thus possible to eliminate or substantially reduce frequency variations ascribable to the irregularity of the piezoelectric film.

The areas II-1 to II-10 are encompassed in the general area II, and a preferable thickness range for the piezoelectric film exists per each area. At areas II-1 and II-10 of these areas, the absolute value of TCV can be extremely reduced by a selection of the thickness of the piezoelectric film and, in some cases, can be substantially reduced to zero. It is thus possible to achieve a surface acoustic wave device that is particularly excellent in selectivity.

Embodiment 3

Figure 31:
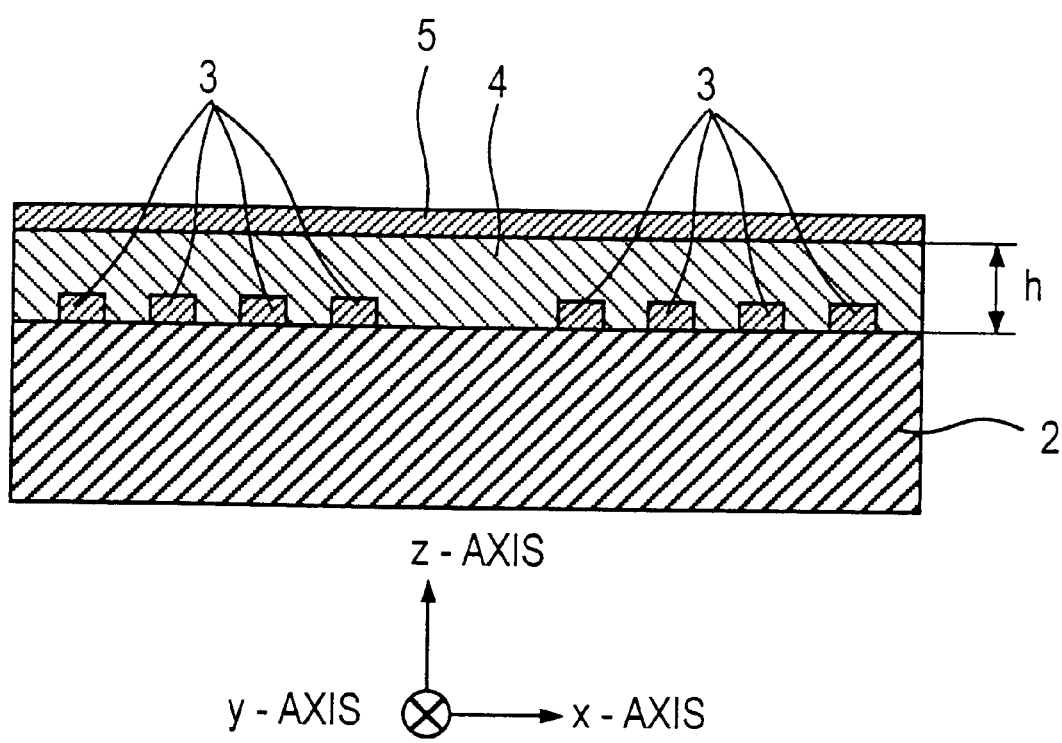
FIG. 31 is a sectional representation of one exemplary construction of the surface acoustic wave device according to embodiment 3 of the invention.
Figure 32:
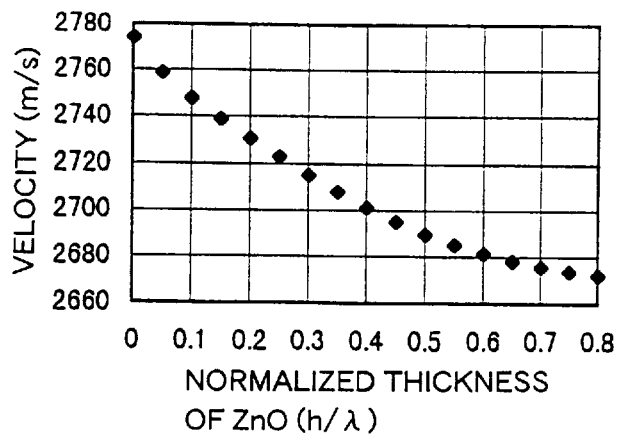
FIGS. 32A, 32B, and 32C are generally illustrative of varying normalized thickness h/λ of ZnO film vs. characteristic change relations for a surface acoustic wave device comprising a langasite single crystal substrate making use of area III-1, and an interdigital electrode, a ZnO film and an opposite electrode film formed on the surface thereof in this order, and are a graph for SAW velocity changes, a graph for electromechanical coupling factor $k^2$ changes, and a graph for TCV (a temperature coefficient of SAW velocity) changes, respectively.
Figure 32:
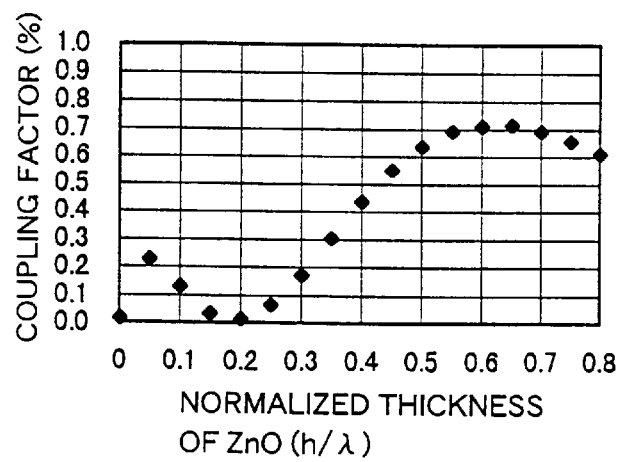
Figure 32:
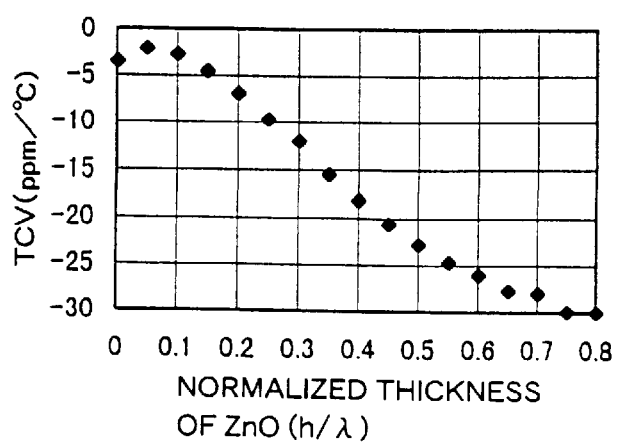
Figure 33:
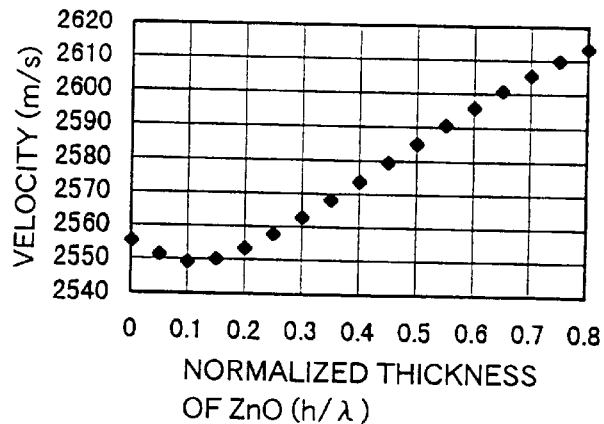
FIGS. 33A, 33B, and 33C are generally illustrative of varying normalized thickness h/λ of ZnO film vs. characteristic change relations for a surface acoustic wave device comprising a langasite single crystal substrate making use of area III-2, and an interdigital electrode, a ZnO film and an opposite electrode film formed on the surface thereof in this order, and are a graph for SAW velocity changes, a graph for electromechanical coupling factor $k^2$ changes, and a graph for TCV (a temperature coefficient of SAW velocity) changes, respectively.
Figure 33:
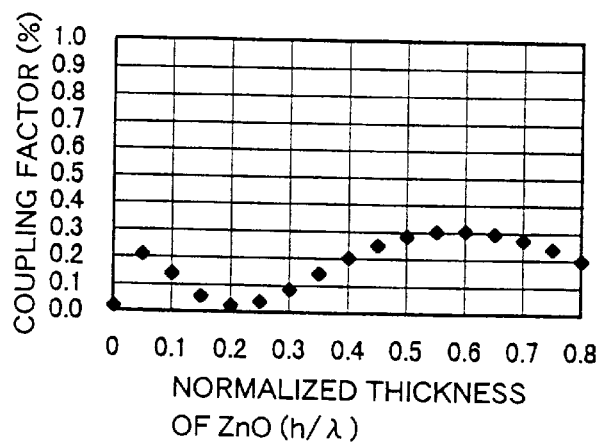
Figure 33:
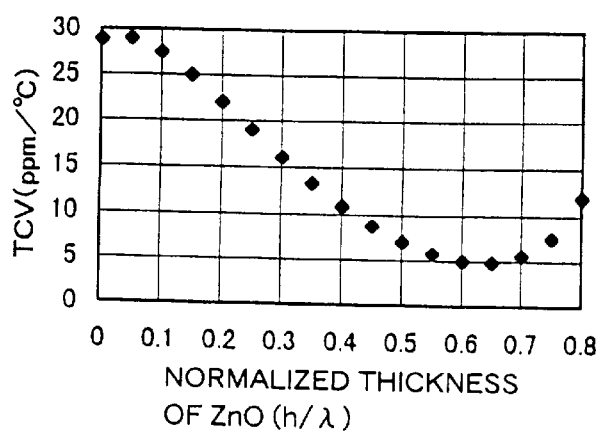
Figure 34:
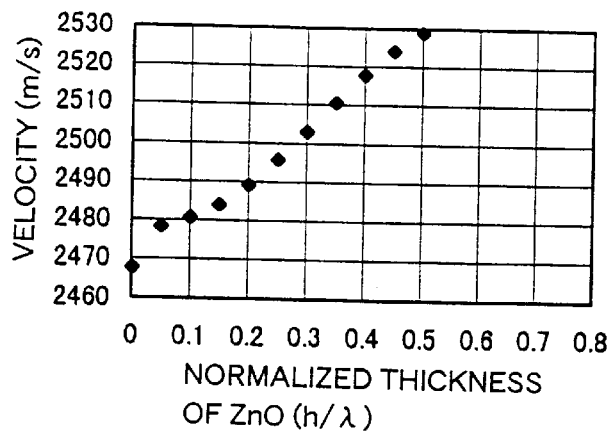
FIGS. 34A, 34B, and 34C are generally illustrative of varying normalized thickness h/λ of ZnO film vs. characteristic change relations for a surface acoustic wave device comprising a langasite single crystal substrate making use of area III-3, and an interdigital electrode, a ZnO film and an opposite electrode film formed on the surface thereof in this order, and are a graph for SAW velocity changes, a graph for electromechanical coupling factor $k^2$ changes, and a graph for TCV (a temperature coefficient of SAW velocity) changes, respectively.
Figure 34:
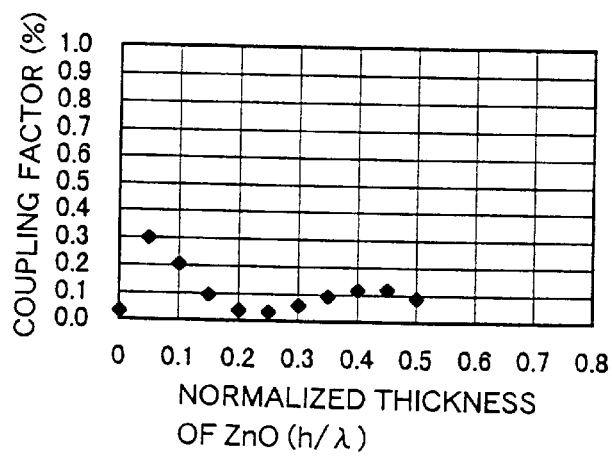
Figure 34:
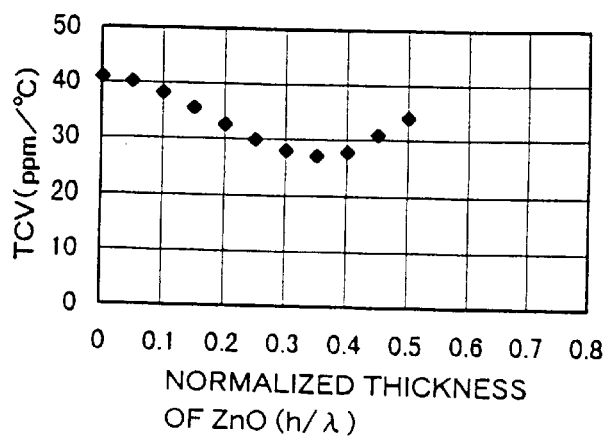
Figure 35:
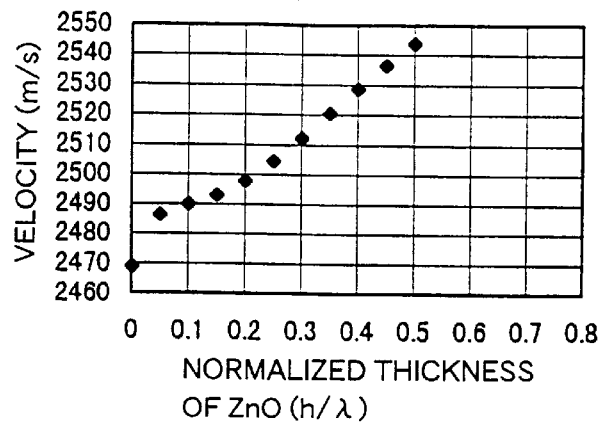
FIGS. 35A, 35B, and 35C are generally illustrative of varying normalized thickness h/λ of ZnO film vs. characteristic change relations for a surface acoustic wave device comprising a langasite single crystal substrate making use of area III-4, and an interdigital electrode, a ZnO film and an opposite electrode film formed on the surface thereof in this order, and are a graph for SAW velocity changes, a graph for electromechanical coupling factor $k^2$ changes, and a graph for TCV (a temperature coefficient of SAW velocity) changes, respectively.
Figure 35:
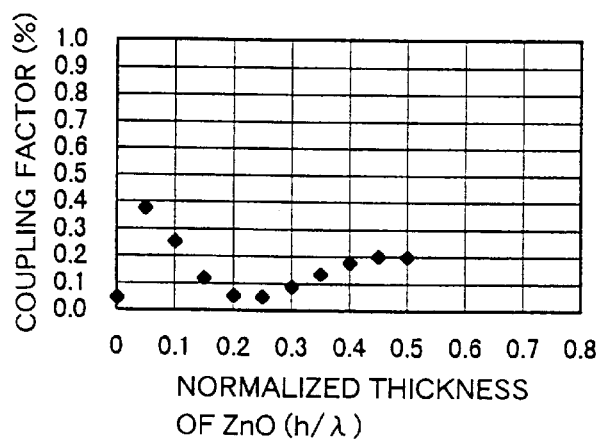
Figure 35:
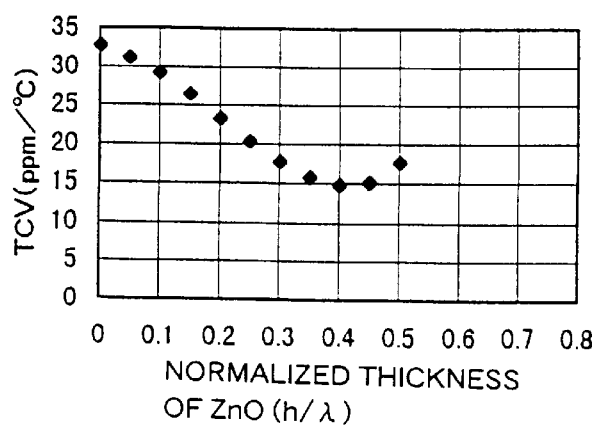
Figure 36:
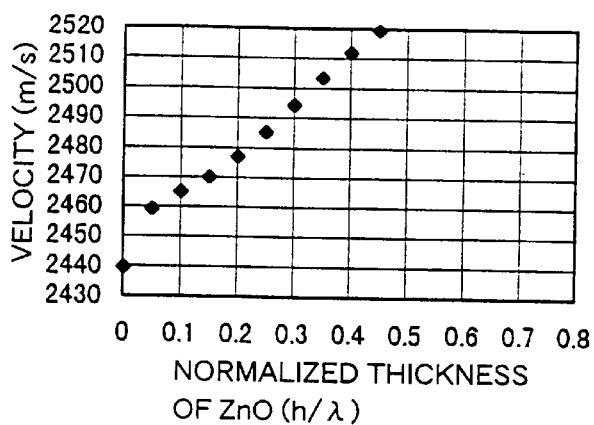
FIGS. 36A, 36B, and 36C are generally illustrative of varying normalized thickness h/λ of ZnO film vs. characteristic change relations for a surface acoustic wave device comprising a langasite single crystal substrate making use of area III-5, and an interdigital electrode, a ZnO film and an opposite electrode film formed on the surface thereof in this order, and are a graph for SAW velocity changes, a graph for electromechanical coupling factor $k^2$ changes, and a graph for TCV (a temperature coefficient of SAW velocity) changes, respectively.
Figure 36:
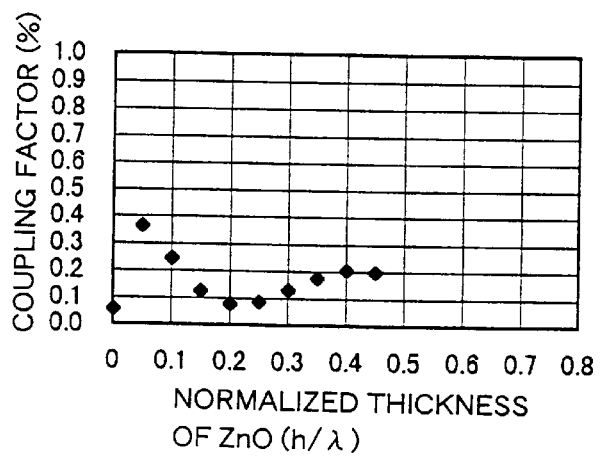
Figure 36:
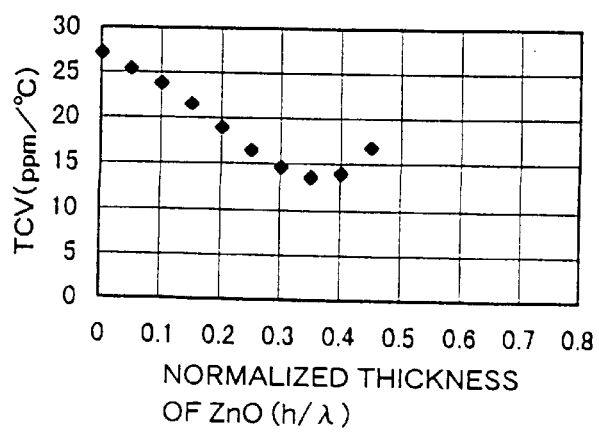
Figure 37:
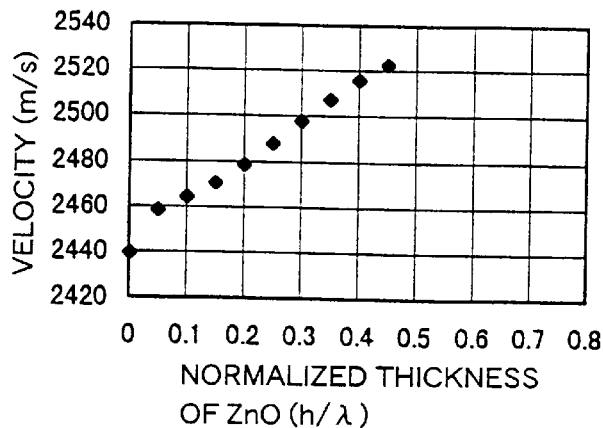
FIGS. 37A, 37B, and 37C are generally illustrative of varying normalized thickness h/λ of ZnO film vs. characteristic change relations for a surface acoustic wave device comprising a langasite single crystal substrate making use of area III-6, and an interdigital electrode, a ZnO film and an opposite electrode film formed on the surface thereof, and are a graph for SAW velocity changes, a graph for electromechanical coupling factor $k^2$ changes, and a graph for TCV (a temperature coefficient of SAW velocity) changes, respectively.
Figure 37:
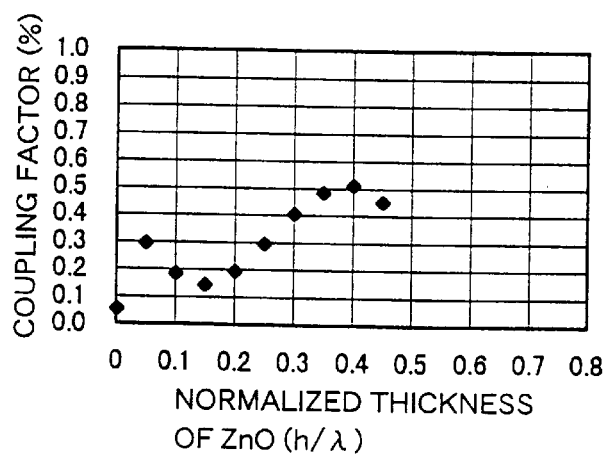
Figure 37:
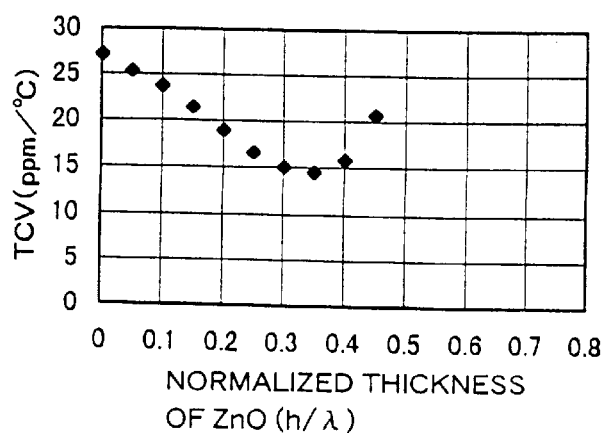
Figure 38:
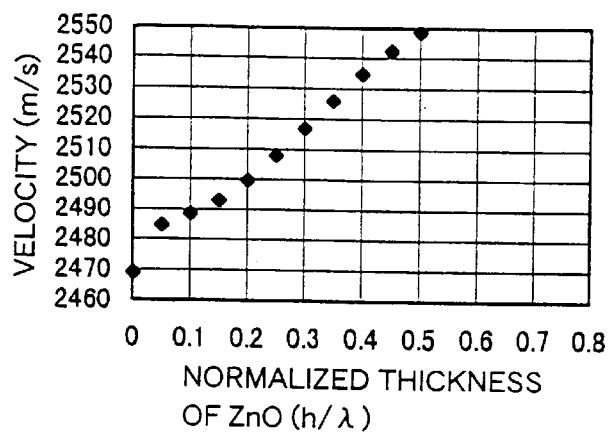
FIGS. 38A, 38B, and 38C are generally illustrative of varying normalized thickness h/λ of ZnO film vs. characteristic change relations for a surface acoustic wave device comprising a langasite single crystal substrate making use of area III-7, and an interdigital electrode, a ZnO film and an opposite electrode film formed on the surface thereof in this order, and are a graph for SAW velocity changes, a graph for electromechanical coupling factor $k^2$ changes, and a graph for TCV (a temperature coefficient of SAW velocity) changes, respectively.
Figure 38:
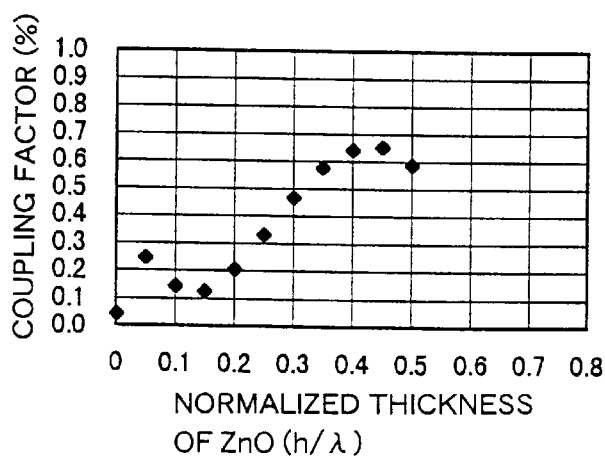
Figure 38:
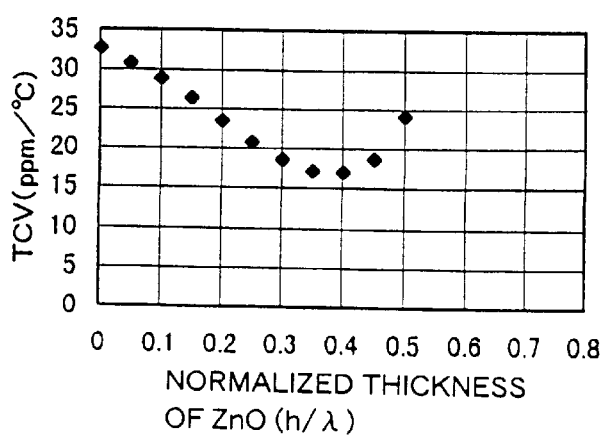

In embodiment 3 of the invention, a piezoelectric film 4 is provided on a piezoelectric substrate 2 to construct a surface acoustic wave device, as shown in FIG. 31. A langasite single crystal substrate is used for the piezoelectric substrate while a zinc oxide film is used for the piezoelectric film, and an opposite electrode film 5 is further provided on the piezoelectric film. By the provision of the piezoelectric film and opposite electrode film it is possible to increase the electromechanical coupling factor of the device.

It is known that the electromechanical coupling factor can be increased by forming a piezoelectric film on the surface of a piezoelectric substrate, as typically disclosed in JP-A 8-204499. When a conventional piezoelectric substrate such as an $LiNbO_3$ substrate having a negative TCV is used in combination with a zinc oxide film, however, the combined TCV is greatly shifted to a negative side.

It is also known that even when a piezoelectric film is relatively thin, an increased electromechanical coupling factor can be obtained by opposing an interdigital electrode to an opposite electrode film with the piezoelectric film interleaved between them, as typically described in "Surface Wave Device, and Its Application", pp. 98–109, published by Nikkan Kogyo Shinbun-Sha (1978). In a conventional surface acoustic wave device provided with an opposite electrode film, however, a non-piezoelectric substrate such as a glass, silicon or sapphire substrate, rather than a piezoelectric substrate, is used. A possible explanation of this could be that too large a shift of TCV to a negative side occurs in the case of a conventional piezoelectric substrate and film combination, as mentioned above.

In embodiment 3 of the invention, the langasite single crystal is used for the substrate material. The langasite substrate can have a positive TCV by a selection of the cut angle thereof out of the langasite single crystal and the propagation direction of surface acoustic waves thereon. On the other hand, the zinc oxide film has a negative TCV. When the zinc oxide film is formed on the langasite substrate, both TCVs are offset each other so that the combined TCV can be extremely reduced. It is thus possible to realize a surface acoustic wave device unachievable by a conventional piezoelectric substrate and film combination, i.e., a surface acoustic wave device having an increased electromechanical coupling factor and a reduced TCV absolute value.

In embodiment 3 of the invention, $\phi$, $\theta$, and $\psi$ representing the cut angle of the substrate cut out of the langasite single crystal and the propagation direction of surface acoustic waves on the substrate are selected from within the general area III. This makes it possible to decrease the SAW velocity, increase the electromechanical coupling factor, and decrease the temperature coefficient of SAW velocity or TCV. Then, the thickness of the piezoelectric film is controlled depending on the cut angle of the substrate out of the langasite single crystal and the propagation direction of surface acoustic waves on the substrate, thereby achieving a further increase in the electromechanical coupling factor and/or a further TCV decrease. This in turn enables to reduce the size of a surface acoustic wave device, and improve the passband width, and temperature stability of a surface acoustic wave device when it is used as a filter. In particular, it is possible to achieve a surface acoustic wave filter best suited for use for mobile communication terminal equipment operated at intermediate frequencies.

The areas III-1 to III-10 are encompassed in the general area III, and a preferable thickness range for the piezoelectric film exists per each area. At areas III-1 and III-10 of these areas, the absolute value of TCV can be extremely reduced by a selection of the thickness of the piezoelectric film and, in some cases, can be reduced to substantially zero. It is thus possible to achieve a surface acoustic wave device that is particularly excellent in selectivity.

Embodiment 4

Figure 46:
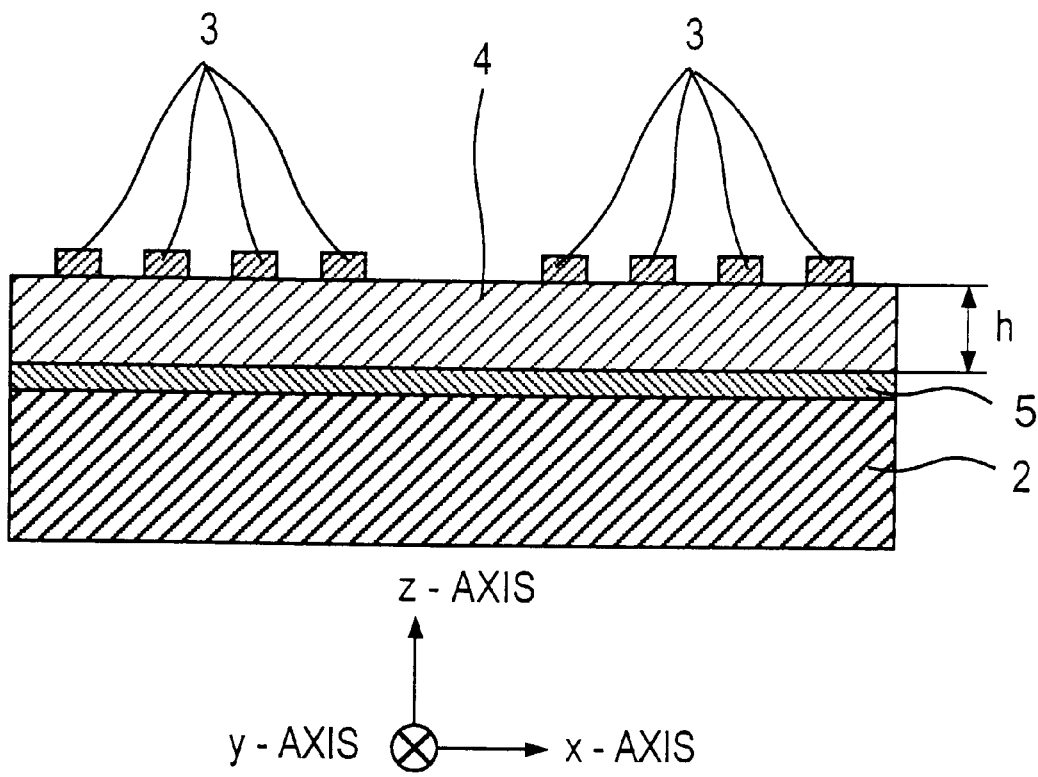
FIG. 46 is a sectional representation of one exemplary construction of the surface acoustic wave device according to embodiment 4 of the invention.

In embodiment 4 of the invention, a piezoelectric film 4 is provided on a piezoelectric substrate 2 to make a surface acoustic wave device, as shown in FIG. 46. A langasite single crystal substrate is used for the piezoelectric substrate while a zinc oxide film is used for the piezoelectric film, and an opposite electrode film 5 is further interleaved between the piezoelectric film and the substrate. By the provision of the piezoelectric film and opposite electrode film it is possible to increase the electromechanical coupling factor of the device.

It is known that the electromechanical coupling factor can be increased by forming a piezoelectric film on the surface of a piezoelectric substrate, as typically disclosed in JP-A 8-204499. When a conventional piezoelectric substrate such as an $LiNbO_3$ substrate having a negative TCV is used in combination with a zinc oxide film, however, the combined TCV is greatly shifted to a negative side.

It is also known that even when a piezoelectric film is relatively thin, an increased electromechanical coupling factor can be obtained by opposing an interdigital electrode to an opposite electrode film with the piezoelectric film interleaved between them, as typically described in "Surface Wave Device, and Its Application", pp. 98–109, published by Nikkan Kogyo Shinbun-Sha (1978). In a conventional surface acoustic wave device provided with an opposite electrode film, however, a non-piezoelectric substrate such as a glass, silicon or sapphire substrate, rather than a piezoelectric substrate, is used. A possible explanation of this could be that too large a shift of TCV to a negative side occurs in the case of a conventional piezoelectric substrate and film combination.

In embodiment 4 of the invention, the langasite single crystal is used for a substrate material. The langasite substrate can have a positive TCV by a selection of the cut angle thereof out of the langasite single crystal and the propagation direction of surface acoustic waves thereon. On the other hand, the zinc oxide film has a negative TCV. When the zinc oxide film is formed on the langasite substrate, both TCVs are offset each other so that the combined TCV can be extremely reduced. It is thus possible to realize a surface acoustic wave device unachievable by a conventional piezoelectric substrate and film combination, i.e., a surface acoustic wave device having an increased electromechanical coupling factor and a reduced TCV absolute value.

JP-A 8-204499 also discloses that a piezoelectric film is formed on an interdigital electrode provided on a piezoelectric substrate. In embodiment 4 of the invention, on the other hand, the opposite electrode film and piezoelectric films are formed on the piezoelectric substrate, and the interdigital electrode is formed on the piezoelectric film. In other words, a homogeneous piezoelectric film can be obtained in embodiment 4 because the piezoelectric film grows on the flat surface of the opposite electrode film. It is thus possible to eliminate or substantially reduce frequency variations ascribable to the irregularity of the piezoelectric film.

In embodiment 4 of the invention, $\phi$, $\theta$, and $\psi$ representing the cut angle of the substrate cut out of the langasite single crystal and the propagation direction of surface acoustic waves on the substrate are selected from within the general area IV. This makes it possible to decrease the SAW velocity, increase the electromechanical coupling factor, and decrease the temperature coefficient of SAW velocity or TCV. Then, the thickness of the piezoelectric film is controlled depending on the cut angle of the substrate out of the langasite single crystal and the propagation direction of surface acoustic waves on the substrate, thereby achieving a further increase in the electromechanical coupling factor and/or a further TCV decrease. This in turn enables to reduce the size of a surface acoustic wave device, and improve the passband width, and temperature stability of a surface acoustic wave device when it is used as a filter. In particular, it is possible to achieve a surface acoustic wave filter best suited for use for mobile communication terminal equipment operated at intermediate frequencies.

The areas IV-1 to IV-10 are encompassed in the general area IV, and a preferable thickness range for the piezoelectric film exists per each area. At areas IV-1 and IV-10 of these areas, the absolute value of TCV can be extremely reduced by a selection of the thickness of the piezoelectric film and, in some cases, can be substantially reduced to zero. It is thus possible to achieve a surface acoustic wave device that is particularly excellent in selectivity.

It is here to be noted that "NUMERICAL AND EXPERIMENTAL INVESTIGATION SAW IN LANGASITE", 1995 IEEE ULTRASONICS SYMPOSIUM, Vol. 1,389 (reference publication 1), for instance, gives a report of numerically calculated SAW velocity, $k^2/2$, TCD (the temperature coefficient of SAW delay time), etc. for langasite single crystal substrates found to be (0°, 30°, 90°)

(0°, 53°, 90°)

(0°, 61°, 0°)

(0°, 147°, 22°)

(0°, 147°, 18°)

(0°, 32°, 40°)

(0°, 156°, 0°)

(0°, θ°, 0°)

(0°, 25°, ψ)

when the cut angles of the substrates cut out of the langasite single crystal and the propagation direction of surface acoustic waves on the substrates are represented in terms of Euler angles ($\phi$, $\theta$, $\psi$). Also, "Effects of Electric Field and of Mechanical Pressure on Surface Acoustic Waves Propagation in $La_3Ga_5SiO_{14}$ Piezoelectric Single Crystals", 1995 IEEE ULTRASONICS SYMPOSIUM, Vol. 1, 409 (reference publication 2) gives a report of numerically calculated $k^2$ or the like for substrates represented in terms of Euler angles ($\phi$, $\theta$, $\psi$), that is, (90°, 90°, ψ)
(0°, 90°, ψ)
(0°, 0°, ψ)
(0°, θ, 0°)
(90°, θ, 0°)
(φ, 90°, 0°)

Further, an article "A study on SAW propagation characteristics on a langasite crystal plate" in "The 17th Symposium Preprint on the Fundamentals and Applications of Ultrasonic Electronics" (reference publication 3) presents a report of numerically calculated $k^2$, TCD, etc. for substrates represented in terms of Euler angles (φ, θ, ψ), viz., (90°, 90°, ψ)

and of actually found TCD for substrates represented in terms of (0°, 0°, 90°)
(90°, 90°, 175°)
(90°, 90°, 25°)

Fruthermore, an article "Propagation direction dependence of Rayleigh waves on a langasite plate" on page 21 of materials distributed at the 51th Study Meeting in the 150th Committee of Surface Acoustic Wave Device Technology, the Japan Society for the Promotion of Science (reference publication 4) presents a report of numerically calculated $k^2$, etc. for substrates represented in terms of Euler angles (φ, θ, ψ), viz., (0°, 0°, ψ)
(90°, 90°, ψ)

and of TCD calculated from series resonance frequencies actually found for substrates represented in terms of (0°, 0°, 90°)
(90°, 90°, 175°)
(90°, 90°, 15°)
(90°, 90°, 21°)
(90°, 90°, 25°)

This reference publication 4 was issued on Jan. 27, 1997, or after the filing of a basic application of this application. Still further, an article "Propagation characteristics of surface acoustic waves on $La_3Ga_5SiO_{14}$" in "The 17th Symposium Preprint on the Fundamentals and Applications of Ultrasonic Electronics" (reference publication 5) presents a report of numerically calculated $k^2$, etc. for substrates represented in terms of Euler angles (φ, θ, ψ), viz., (90°, 90°, ψ)
(0°, 90°, ψ)
(0°, 0°, ψ)
(0°, θ, 0°)

Each of the aforesaid reference publications refers to the properties of the langasite single crystal substrate per se. Nowhere in these publications, however, is the provision of a piezoelectric film formed of zinc oxide on this langasite single crystal substrate disclosed whatsoever. In the present invention, the piezoelectric film formed of zinc oxide is controlled to the optimum thickness depending on the cut angle of the substrate out of the langasite single crystal and the propagation direction of surface acoustic waves on the substrate for the purpose of achieving a further increase in the electromechanical coupling factor and/or a further TCV decrease. Thus, the present invention cannot be easily anticipated by the reference publications mentioned above.

Embodiment 1

One exemplary architecture of the surface acoustic wave device according to embodiment 1 is shown in FIG. 1. This surface acoustic wave device comprises a substrate 2, a set of an input side interdigital electrode 3 and an output side interdigital electrode 3 formed on the surface of the substrate 2, and a piezoelectric film 4 provided to cover the substrate 2 and the interdigital electrodes 3 and 3. In each embodiment of the invention, a langasite single crystal is used for the substrate 2. The langasite single crystal is a crystal type belonging to a point group 32. In each embodiment of the invention, zinc oxide (ZnO) is used for the piezoelectric film 4. The piezoelectric film has a piezoelectric axis oriented substantially perpendicularly with respect to the surface of the substrate.

In FIG. 1, x, y, and z-axes are perpendicular to one another. The x, and y-axes lie in a plane direction of the substrate 2, and the x-axis defines a propagation direction of surface acoustic waves. The z-axis perpendicular to the substrate plane defines a cut angle (cut plane) of the substrate cut out of the single crystal. Relations between these x, y and z-axes and the X, Y and Z-axes of the langasite single crystal may be represented in terms of Euler angles (φ, θ, ψ).

When, in the surface acoustic wave device according to embodiment 1, the cut angle of the substrate out of the langasite single crystal and the propagation direction of surface acoustic waves are represented in terms of Euler angles (φ, θ, ψ), φ, θ, and ψ exist in each of the areas mentioned above.

By selecting φ, θ and ψ from the general area I and providing a piezoelectric film of suitable thickness, it is possible to decrease the SAW velocity, increase the electromechanical coupling factor, and decrease the temperature coefficient of SAW velocity or TCV. This in turn enables to reduce the size of a surface acoustic wave device, and improve the passband width, and temperature stability of a surface acoustic wave device when it is used as a filter. In particular, it is possible to achieve a surface acoustic wave filter best suited for use for mobile communication terminal equipment operated at intermediate frequencies. More illustratively, the temperature coefficient of SAW velocity or TCV of the substrate can be in the range of −35 to 60 ppm/° C., the SAW velocity of the substrate can be up to 2,900 m/s, and the coupling factor of the substrate can be 0.1% or higher. In some cases, much better characteristics may be obtained.

At areas I-1, I-6, I-7, I-8, I-9, and I-10, a broader passband surface acoustic wave device can be achieved because a coupling factor of 0.4% or higher can be attained. At areas I-1, I-7, and I-10, a much broader surface acoutstic wave device can be achieved because a coupling factor of 0.7% or higher can be attained.

At areas I-1, and I-10, TCV can be extremely reduced and, in some cases, can be reduced to zero, and so a surface acoustic wave device having good-enough temperature stability can be achieved. Especially at area I-1, it is possible to achieve a surface acoustic wave device of broad passband and good-enough temperature stability because a large coupling factor can be obtained with a small TCV by a selection of the thickness of the piezoelectric film.

It is to be noted that the primary temperature coefficient is herein used as the temperature coefficient of SAW velocity, TCV. Even when a temperature vs. acoustic velocity curve takes the form of a quadratic curve (the primary temperature coefficient is zero), the quadratic curve may be approximated to a primary straight line by the method of least squares to calculate TCV. Specifically, TCV is found by dividing a change Δv of SAW velocity per unit temperature by SAW velocity $v_0$ at 0° C.

The cut direction of the substrate may be identified by means of x-ray diffraction.

The langasite single crystal used in the present invention is generally represented by a chemical formula $La_3GaSiO_{14}$, and known from Proc. IEEE International Frequency Control Sympo. vol. 1994, pp. 48–57(1994) as an example. In the present invention, the langasite single crystal is applied to a surface acoustic wave device substrate. If, in this case, the cut direction of crystal and the propagation direction of surface acoustic waves are specifically selected, it is then possible to achieve a surface acoustic wave device having such high characteristics as mentioned above. Langasite single crystals, if they are found by x-ray diffraction to be mainly composed of a langasite phase alone, may be used herein. In other words, the langasite single crystal used herein is not always limited to that represented by the aforesaid chemical formula. For instance, at least one part of each site for La, Ga, and Si may have been substituted by other element, or the number of oxygen may depart from the aforesaid stoichiometric composition. In addition, the langasite single crystal may contain inevitable impurities such as Al, Zr, Fe, Ce, Nd, Pt, and Ca. No particular limitation is imposed on how to produce the langasite single crystals; that is, they may be produced by ordinary single crystal growth processes, for instance, the CZ process.

In embodiment 1, the preferable thickness for the piezoelectric film may be determined depending on where ($\phi$, $\theta$, $\psi$) exist. More illustratively, preferable $h/\lambda$ exists for each area, as already mentioned. Here, h is the thickness of the piezoelectric film, $\lambda$ is the wavelength of a surface acoustic wave, and $h/\lambda$ is a value obtained by normalizing the thickness of the piezoelectric film by the wavelength of the surface acoustic wave. Generally at areas I-2 to I-9 included in the general area I, the larger the $h/\lambda$ value is, the greater will be the electromechanical coupling factor and the SAW velocity. At areas I-1, and I-10, the larger the $h/\lambda$ value is, the lower will be the SAW velocity. Thus, the range where a large-enough electromechanical coupling factor is obtained with a low-enough SAW velocity is selected for each area. The temperature coefficient of SAW velocity or TCV of a substrate having a piezoelectric film is shifted in a negative direction with an $h/\lambda$ increase. When the substrate per se has a positive TCV, therefore, it is possible to achieve a TCV decrease by the provision of the piezoelectric film.

In each embodiment of the invention, no particular limitation is imposed on how to form the piezoelectric film; that is, the piezoelectric film may be formed by any desired process if it yields a piezoelectric film having a piezoelectric axis oriented substantially perpendicularly with respect to the surface of the substrate. Such a process, for instance, include a sputtering process, an ion plating process, and a CVD process. If these processes are used under appropriately preselected film-formation conditions, it is possible to easily obtain a piezoelectric film having a piezoelectric or c-axis substantially perpendicularly with respect to the surface of the substrate.

Substrate size is not particularly critical in each embodiment of the invention, and may generally be of the order of 1 to 20 mm in the propagation direction of surface acoustic waves and of the order of 0.5 to 5 mm in a direction perpendicular thereto. Substrate thickness is generally at least three times as large as the pitch of the interdigital electrodes (corresponding to the wavelength of a surface acoustic wave) formed on the substrate, and is usually of the order of 0.2 to 0.5 mm. However, it is to be noted that an experimental sample prepared for the purpose of estimating the performance of the substrate may, in some cases, have a thickness exceeding the aforesaid upper limit of 0.5 mm. When, for instance, the pitch of an interdigital electrode is 320 $\mu$m for experimental purposes, the thickness of the substrate is at least 0.96 mm.

In the present invention, each of the interdigital electrodes 3 formed on the substrate 2 is a periodically striped thin film electrode for exciting, receiving, reflecting, and propagating surface acoustic waves. The interdigital electrode is patterned so as to achieve the aforesaid preselected propagation direction of surface acoustic waves. The interdigital electrode may be formed as by evaporation or sputtering, using Au or Al. The electrode finger width of the interdigital electrode may be determined depending on the frequency to which the surface acoustic wave device is applied, and may generally be of the order of 2 to 10 $\mu$m at the frequency band to which the present invention is preferably applied. The thickness of the interdigital electrode is usually of the order of 0.03 to 1.5 $\mu$m.

The surface acoustic wave device according to each embodiment of invention lends itself well to filters used at a frequency band of 10 to 500 MHz in general, and 10 to 300 MHz in particular. The surface acoustic wave device of the present invention is useful for making a surface acoustic wave delay element small as well, because of its slow SAW velocity.

Embodiment 2

Figure 16:
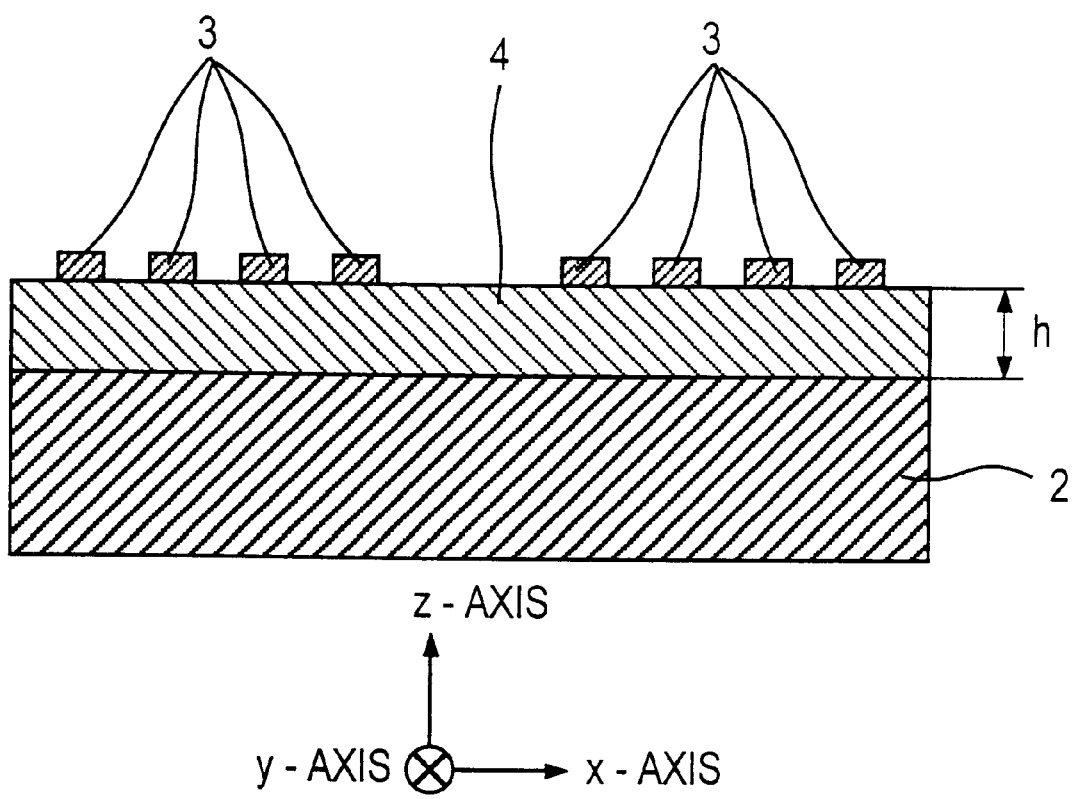
FIG. 16 is a sectional representation of one exemplary construction of the surface acoustic wave device according to embodiment 2 of the invention.

One exemplary architecture of the surface acoustic wave device according to embodiment 2 is shown in FIG. 16. This surface acoustic wave device comprises a substrate 2, a piezoelectric film 4 on the surface of the substrate 2, and a set of an input side interdigital electrode 3 and an output side interdigital electrode 3 formed on the surface of the piezoelectric film 4.

When, in the surface acoustic wave device according to embodiment 2, the cut angle of the substrate out of the langasite single crystal and the propagation direction of surface acoustic waves are represented in terms of Euler angles ($\phi$, $\theta$, $\psi$), $\phi$, $\theta$, and $\psi$ exist in each of the areas mentioned above.

By selecting $\phi$, $\theta$ and $\psi$ from the general area II and providing a piezoelectric film of suitable thickness, it is possible to decrease the SAW velocity, increase the electromechanical coupling factor, and decrease the temperature coefficient of SAW velocity or TCV. This in turn enables to reduce the size of a surface acoustic wave device, and improve the passband width, and temperature stability of a surface acoustic wave device when it is used as a filter. In particular, it is possible to achieve a surface acoustic wave filter best suited for use for mobile communication terminal equipment operated at intermediate frequencies. More illustratively, the temperature coefficient of SAW velocity or TCV of the substrate can be in the range of −35 to 60 ppm/° C., the SAW velocity of the substrate can be up to 2,900 m/s, and the coupling factor of the substrate can be 0.1% or greater. In some cases, much better characteristics may be obtained.

At the general area II, a broad band surface acoustic wave device can be achieved because a coupling factor of 0.4% or greater can be obtained. At areas II-1, and II-10, a broader band surface acoustic wave device can be achieved because a coupling factor of 0.8% or greater can be obtained.

At areas II-1, and II-10, a surface acoustic wave device of good-enough temperature stability can be achieved because TCV can be extremely reduced. At areas II-1, and II-10, a surface acoustic wave device of much broader passband and better temperature stability can be achieved because a great coupling factor can be obtained with a small TCV by a selection of the thickness of the piezoelectric film.

In embodiment 2, the preferable thickness for the piezoelectric film may be determined depending on where ($\phi$, $\theta$, $\psi$) exist. More illustratively, preferable h/$\lambda$ exists for each area. Here, h is the thickness of the piezoelectric film, $\lambda$ is the wavelength of a surface acoustic wave, and h/$\lambda$ is a value obtained by normalizing the thickness of the piezoelectric film by the wavelength of the surface acoustic wave. Generally at areas II-2 to II-9 included in the general area II, the larger the h/$\lambda$ value is, the greater will be the electromechanical coupling factor and the SAW velocity. At areas II-1, and II-10, the larger the h/$\lambda$ value is, the lower will be the SAW velocity. The temperature coefficient of SAW velocity or TCV of a substrate having a piezoelectric film is generally shifted in a negative direction with an h/$\lambda$ increase. When the substrate per se has a positive TCV, therefore, it is possible to achieve a TCV decrease by the provision of the piezoelectric film.

It is therefore preferable to select h/$\lambda$ for each area in such a way that the necessary characteristic or characteristics of the SAW velocity, electromechanical coupling factor and TCV are well improved. In each area, there is a specific h/$\lambda$ range where these characteristics are practically satisfied as already mentioned.

Embodiment 3

One exemplary architecture of the surface acoustic wave device according to embodiment 3 is shown in FIG. 31. This surface acoustic wave device comprises a substrate 2, a set of an input side interdigital electrode 3 and an output side interdigital electrode 3 on the surface of the substrate 2, and a piezoelectric film 4 provided to cover the substrate 2 and the interdigital electrodes 3 and 3. In addition, an opposite electrode film 5 is formed on the surface of the piezoelectric film 4.

When, in the surface acoustic wave device according to embodiment 3, the cut angle of the substrate out of the langasite single crystal and the propagation direction of surface acoustic waves are represented in terms of Euler angles ($\phi$, $\theta$, $\psi$), $\phi$, $\theta$, and $\psi$ exist in each of the areas mentioned above.

By selecting $\phi$, $\theta$ and $\psi$ from the general area III and providing a piezoelectric film and an opposite electrode film, each of suitable thickness, it is possible to decrease the SAW velocity, increase the electromechanical coupling factor, and decrease the temperature coefficient of SAW velocity or TCV. This in turn enables to reduce the size of a surface acoustic wave device, and improve the passband width, and temperature stability of a surface acoustic wave device when it is used as a filter. In particular, it is possible to achieve a surface acoustic wave filter best suited for use for mobile communication terminal equipment operated at intermediate frequencies. More illustratively, the temperature coefficient of SAW velocity or TCV of the substrate can be in the range of −35 to 60 ppm/° C., the SAW velocity of the substrate can be up to 2,900 m/s, and the coupling factor of the substrate can be 0.1% or greater. In some cases, much better characteristics may be obtained.

At the general area III, the electromechanical coupling factor has two peaks with respect to the thickness of the piezoelectric film. The peak of the electromechanical coupling factor on a thin piezoelectric film side has a practically large-enough value of 0.13% or greater. Especially at area III-4, the peak value of the coupling factor is 0.37%. The peak of the electromechanical coupling factor on a thick piezoelectric film side, too, has a large-enough value of 0.15% or greater. At this time, TCV shows an about 20 ppm/° C. improvement as compared with that in the absence of a piezoelectric film.

In embodiment 3, the preferable thickness for the piezoelectric film may be determined depending on where ($\phi$, $\theta$, $\psi$) exist. More illustratively, preferable h/$\lambda$ exists for each area. Here, h is the thickness of the piezoelectric film, $\lambda$ is the wavelength of a surface acoustic wave, and h/$\lambda$ is a value obtained by normalizing the thickness of the piezoelectric film by the wavelength of the surface acoustic wave. The larger the h/$\lambda$ value is, the lower will be the SAW velocity at areas III-1 and III-10, and the higher will be the SAW velocity at areas III-2 to III-9. As mentioned just above, at the general area III the electromechanical coupling factor has two peaks with respect to h/$\lambda$. When the electromechanical coupling factor shows a peak on a large h/$\lambda$ side, the absolute value of TCV becomes small. The temperature coefficient of SAW velocity or TCV of a substrate having a piezoelectric film is shifted in a negative direction with an h/$\lambda$ increase. When the substrate per se has a positive TCV, therefore, it is possible to achieve a TCV decrease by the provision of the piezoelectric film.

It is therefore preferable to select h/$\lambda$ for each area in such a way that the necessary characteristic or characteristics of the SAW velocity, electromechanical coupling factor and TCV are well improved. In each area, there is a specific h/$\lambda$ range where these characteristics are practically satisfied as already mentioned.

The opposite electrode film 5 may be of such size as to cover the whole of the piezoelectric film 4. Insofar as this embodiment is concerned, however, the opposite electrode film may be formed at least at a zone opposite to the interdigital electrodes 3 on the input and output sides. The thickness of the opposite electrode film is preferably in the range of 0.03 to 0.1 $\mu$m. Too thin an opposite electrode film is not preferable because no continuous film is obtained or a electric potential in the plane of the film becomes inhomogeneous due to an electrical resistance increase. Too thick an opposite electrode film is again not preferable because there is an increase in the mass load of the opposite electrode film. The material, and formation of the opposite electrode film may be the same as described in conjunction with the interdigital electrodes. The opposite electrode film is not always required to be grounded or otherwise connected; it may be placed in an electrically isolated state.

Embodiment 4

One exemplary architecture of the surface acoustic wave device according to embodiment 4 is shown in FIG. 46. This surface acoustic wave device comprises a substrate 2, an opposite electrode film 5 provided on the surface of the substrate 2, a piezoelectric film 4 provided on the surface of the opposite electrode film 5, and a set of an input side interdigital electrode 3 and an output side interdigital electrode 3 provided on the surface of the piezoelectric film 4.

When, in the surface acoustic wave device according to embodiment 4, the cut angle of the substrate out of the langasite single crystal and the propagation direction of surface acoustic waves are represented in terms of Euler angles ($\phi$, $\theta$, $\psi$), $\phi$, $\theta$, and $\psi$ exist in each of the areas mentioned above.

By selecting $\phi$, $\theta$ and $\psi$ from the general area IV and providing a piezoelectric film and an opposite electrode film, each of suitable thickness, it is possible to decrease the SAW velocity, increase the electromechanical coupling factor, and decrease the temperature coefficient of SAW velocity or TCV. This in turn enables to reduce the size of a surface acoustic wave device, and improve the passband width, and temperature stability of a surface acoustic wave device when it is used as a filter. In particular, it is possible to achieve a surface acoustic wave filter best suited for use for mobile communication terminal equipment operated at intermediate frequencies. More illustratively, the temperature coefficient of SAW velocity or TCV of the substrate can be in the range of −35 to 60 ppm/° C., the SAW velocity of the substrate can be up to 2,900 m/s, and the coupling factor of the substrate can be 0.1% or greater. In some cases, much better characteristics may be obtained.

At the general area IV, a broad passband surface acoustic wave device can be achieved because a coupling factor of 0.2% or greater can be obtained. Especially at areas IV-1, and IV-10, a much broader passband surface acoustic wave device can be achieved because a coupling factor of 0.8% or greater can be obtained.

At areas IV-1, and IV-10, a surface acoustic wave device of good-enough temperature stability can be achieved because TCV can be extremely reduced and, in some cases, can be reduced to zero. At areas IV-1, and IV-10, a surface acoustic wave device of much broader passband and better temperature stability can be achieved because a great coupling factor can be obtained with a small TCV by a selection of the thickness of the piezoelectric film.

In embodiment 4, the preferable thickness for the piezoelectric film may be determined depending on where ($\phi$, $\theta$, $\psi$) exist, as already noted. More illustratively, preferable h/λ exists for each area. Here, h is the thickness of the piezoelectric film, X is the wavelength of a surface acoustic wave, and h/λ is a value obtained by normalizing the thickness of the piezoelectric film by the wavelength of the surface acoustic wave. Generally at areas IV-2 to IV-9 included in the general area IV, the larger the h/λ value is, the greater will be the electromechanical coupling factor and the SAW velocity. At areas IV-1, and IV-10, the larger the h/λ value is, the lower will be the SAW velocity. The temperature coefficient of SAW velocity or TCV of a substrate having a piezoelectric film is generally shifted in a negative direction with an h/λ increase. When the substrate per se has a positive TCV, therefore, it is possible to achieve a TCV decrease by the provision of the piezoelectric film.

It is therefore preferable to select h/λ for each area in such a way that the necessary characteristic or characteristics of the SAW velocity, electromechanical coupling factor and TCV are well improved. In each area, there is a specific h/λ range where these characteristics are practically satisfied as already mentioned.

Insofar as this embodiment is concerned, the opposite electrode film 5 may be formed at least at a zone opposite to the interdigital electrodes 3 on the input and output sides. To make the piezoelectric film 4 homogeneous, however, it is preferable to cover the whole of the substrate 2 with the opposite electrode film. The thickness of the opposite electrode film is preferably in the range of 0.03 to 0.1 μm. Too thin an opposite electrode film is not preferable because no continuous film is obtained or a electric potential in the plane of the film becomes inhomogeneous due to an electrical resistance increase. Too thick an opposite electrode film is again not preferable because there is an increase in the mass load of the opposite electrode film. The material, and formation of the opposite electrode film may be the same as described in conjunction with the interdigital electrodes. The opposite electrode film is not always required to be grounded or otherwise connected; it may be placed in an electrically isolated state.

EXAMPLE

The present invention will now be explained with reference to examples.

Example 1-1

(Embodiment 1)

A langasite single crystal was grown by the CZ process, and a substrate was cut out of this single crystal. A surface acoustic wave transducer comprising a set of an input side interdigital electrode and an output side interdigital electrode was formed on the surface of the substrate, and a ZnO film was formed thereon by means of a magnetron sputtering process to fabricate a surface acoustic wave device. The interdigital electrodes, each being a normal type electrode of the same shape, were formed of Al by evaporation, and had a thickness of 0.1 μm, an electrode finger width d of 15 μm and an electrode pitch (4 d) of 60 μm (corresponding to the wavelength λ of a surface acoustic wave), with the number of electrode finger pairs being 40 and the aperture width of electrode fingers being 60λ (=3.6 mm). However, when output signals were faint, interdigital electrodes with only the aperture width changed to 100λ were used in place of the aforesaid interdigital electrodes. In addition, when the normalized thickness, h/λ, of the ZnO film exceeded 0.4, the electrode pitch was halved to 30 μm, and the aperture width was correspondingly halved to 1.8 mm (=60λ).

In the instant example, $\phi$ and $\theta$ were 0° and 90° when the cut angle of the substrate in this device out of the langasite single crystal and the propagation direction of surface acoustic waves thereon were expressed in terms of Euler angles ($\phi$, $\theta$ and $\psi$). For $\psi$ to determine the x-axis or the propagation direction of surface acoustic waves, the values shown in FIGS. 2A to 10C were selected from within the general area I. The thickness, h, of the ZnO film on the substrate was selected in such a way that the aforesaid normalized thickness, h/λ, was between 0.05 and 0.8. Changes in the SAW velocity, electromechanical coupling factor $k^2$, and temperature coefficient of SAW velocity, TCV, were examined at varied h/λ's in each propagation direction. The SAW velocity was found from the center frequency of the filter, and the electromechanical coupling factor $k^2$ was determined from a two-terminal admittance measured of the surface acoustic wave transducer, using a well-known Smith's equivalent circuit model. The results of the SAW velocity, $k^2$, and TCV measured in each propagation direction are plotted in FIGS. 2A to 10C.

At points with nothing plotted in each figure, surface acoustic wave signals could not be detected. With consideration for the results of the electromechanical coupling factor obtained, a possible explanation of this could be that when the propagation direction is in this range, the electromechanical coupling factor becomes too small for efficient conversion of electrical signals to surface acoustic wave signals, and vice versa. As the normalized thickness, h/λ, of the ZnO film increased, the surface acoustic wave mode vanished, resulting in the generation of bulk waves. For this reason, data obtained after the generation of bulk waves are not plotted at all.

The graphs showing the SAW velocity, and k2 changes indicate that if the cut angle of the substrate from the crystal and the propagation direction of surface acoustic waves lie in the general area I, the SAW velocity can then be reduced to 2,900 m/s or lower. This is more favorable for achieving a size reduction of a surface acoustic wave device, as compared with a conventional ST quartz crystal. It is also found that within the general area I an electromechanical coupling factor of 0.1% or greater can be obtained. It is thus possible to obtain a much greater electromechanical coupling factor by a selection of the thickness of the ZnO film.

Referring further to the graphs showing the TCV changes, when the substrate per se has a positive TCV, in other words, when TCV is positive at a normalized thickness, h/λ, of 0, it is found that TCV is shifted from a positive to a negative direction with an h/λ increase; improvements are made in the temperature properties. When the substrate itself has a negative TCV, on the other hand, TCV is greatly shifted to a negative side due to the provision of the ZnO film and an increase in its normalized thickness. Even in this case, the absolute value of TCV is not so great (of the order of 35 ppm/° C. or lower); it is found that the substrate can be much more improved in terms of temperature stability over a conventional BGO substrate.

In what follows, each area will be explained at great length.

Figure 2A:
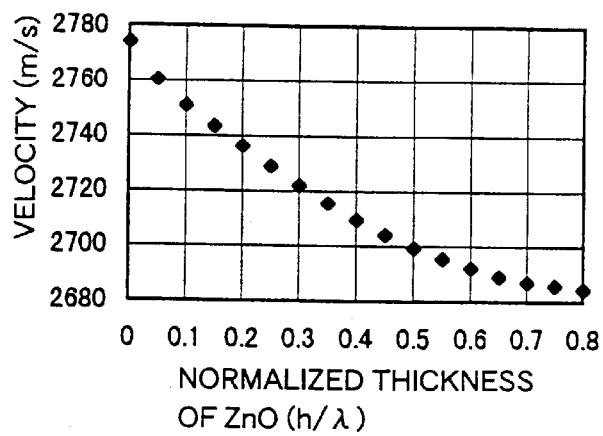
FIGS. 2A, 2B, and 2C are generally illustrative of varying normalized thickness h/λ of ZnO film vs. characteristic change relations for a surface acoustic wave device comprising a langasite single crystal substrate making use of area I-1 and a ZnO film formed on the surface thereof, and are a graph for SAW velocity changes, a graph for electromechanical coupling factor $k^2$ changes, and a graph for TCV (a temperature coefficient of SAW velocity) changes, respectively.
Figure 2B:
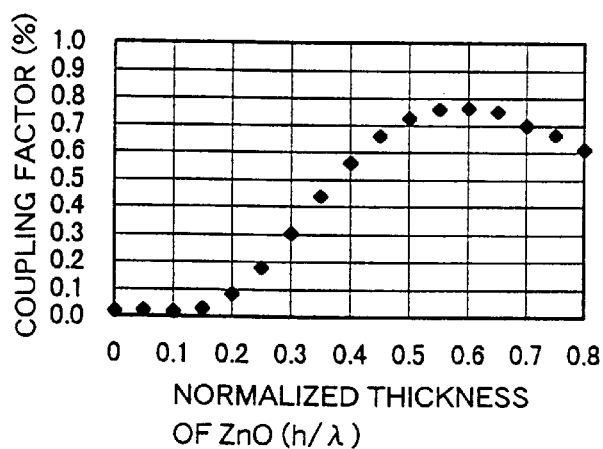
Figure 2C:
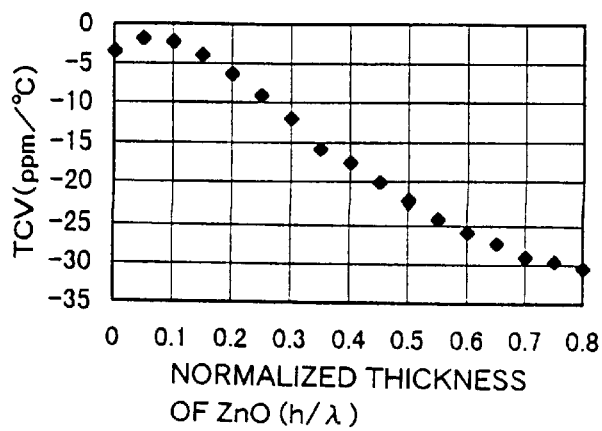
Figure 3:
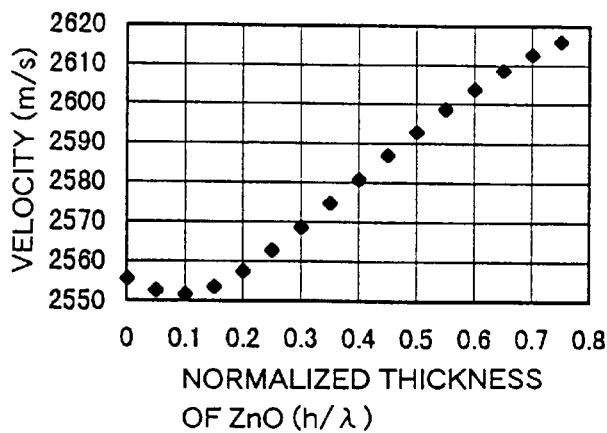
FIGS. 3A, 3B, and 3C are generally illustrative of varying normalized thickness h/λ of ZnO film vs. characteristic change relations for a surface acoustic wave device comprising a langasite single crystal substrate making use of area I-2 and a ZnO film formed on the surface thereof, and are a graph for SAW velocity changes, a graph for electromechanical coupling factor $k^2$ changes, and a graph for TCV (a temperature coefficient of SAW velocity) changes, respectively.
Figure 3:
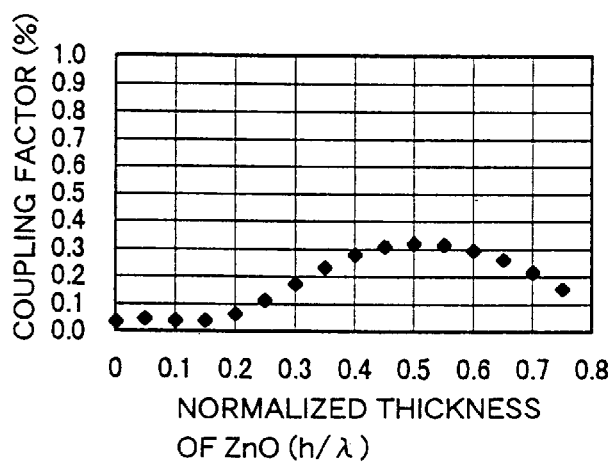
Figure 3:
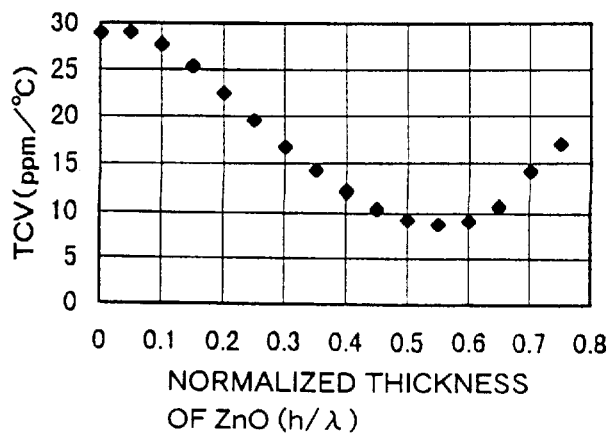

A device making use of area I-1 can have a very great electromechanical coupling factor of 0.76% when h/λ=0.6, as can be seen from FIGS. 2B, and 2C. At this time, TCV=−26 ppm/° C.; good-enough temperature properties are obtained.

A device making use of area I-2 can have a great electromechanical coupling factor of 0.32% when h/λ=0.5, as can be seen from FIGS. 3B, and 3C. At this time, TCV=9 ppm/° C.; very excellent temperature properties are obtained.

Figure 4A:
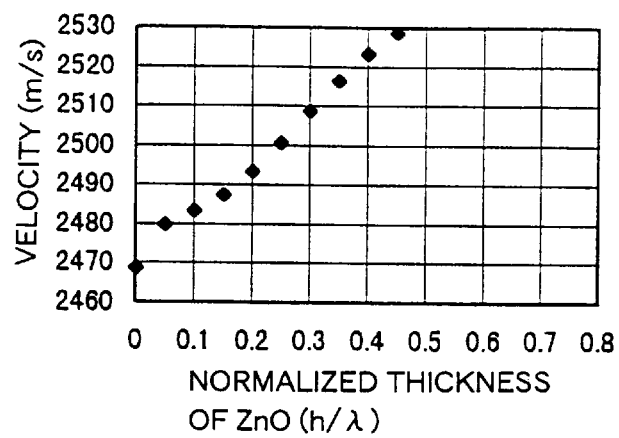
FIGS. 4A, 4B, and 4C are generally illustrative of varying normalized thickness h/λ of ZnO film vs. characteristic change relations for a surface acoustic wave device comprising a langasite single crystal substrate making use of area I-3 and a ZnO film formed on the surface thereof, and are a graph for SAW velocity changes, a graph for electromechanical coupling factor $k^2$ changes, and a graph for TCV (a temperature coefficient of SAW velocity) changes, respectively.
Figure 4B:
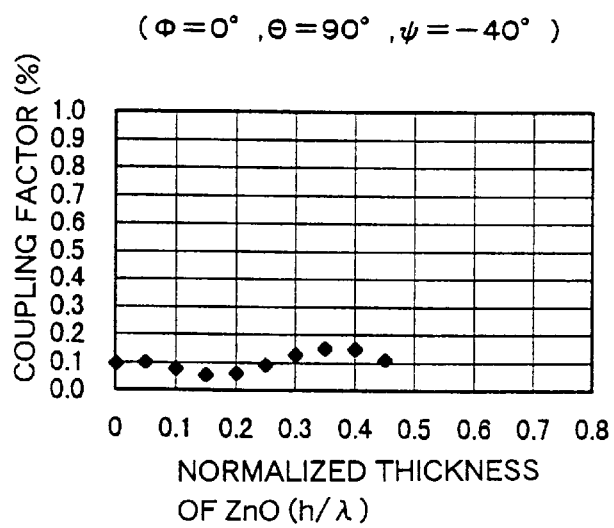
Figure 4C:
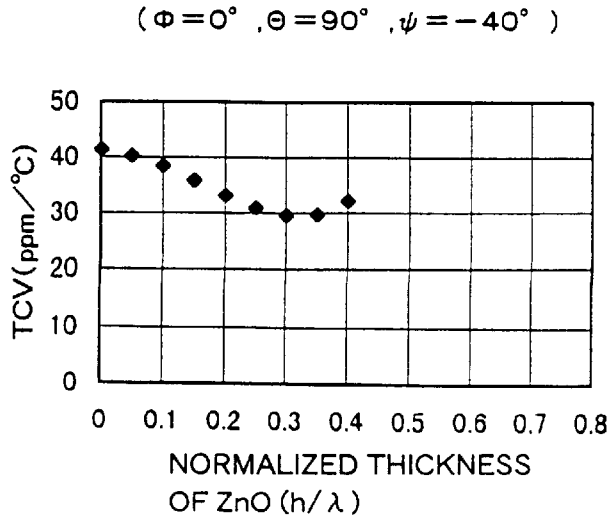
Figure 5:
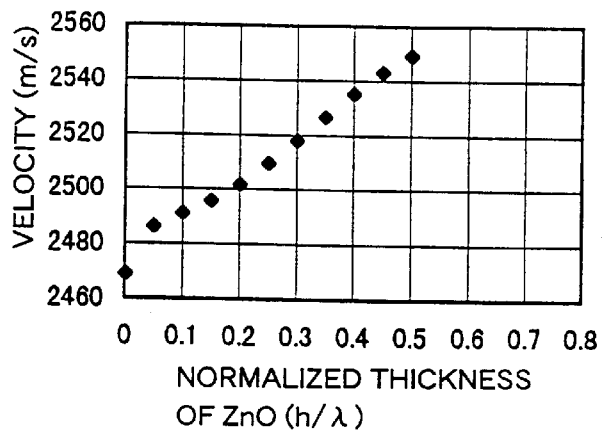
FIGS. 5A, 5B, and 5C are generally illustrative of varying normalized thickness h/λ of ZnO film vs. characteristic change relations for a surface acoustic wave device comprising a langasite single crystal substrate making use of area I-4 and a ZnO film formed on the surface thereof, and are a graph for SAW velocity changes, a graph for electromechanical coupling factor $k^2$ changes, and a graph for TCV (a temperature coefficient of SAW velocity) changes, respectively.
Figure 5:
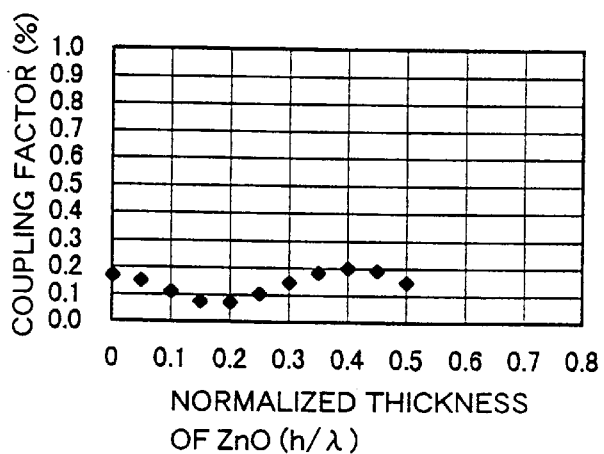
Figure 5:
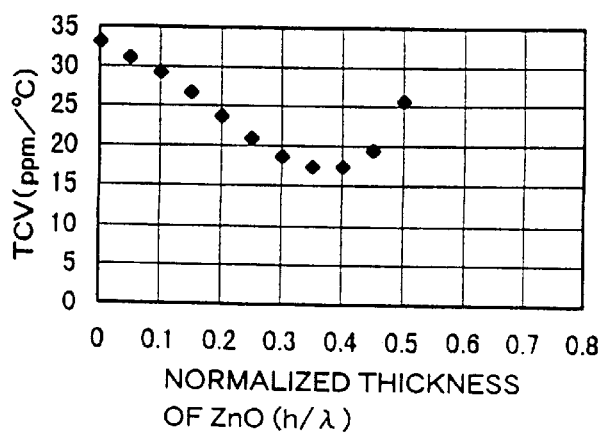

A device making use of area I-3 can have an electromechanical coupling factor of 0.15% when h/λ=0.4, as can be seen from FIGS. 4B, and 4C. At this time, TCV=32 ppm/° C.; good-enough temperature properties are obtained.

A device making use of area I-4 can have a great electromechanical coupling factor of 0.19% when h/λ=0.4, as can be seen from FIGS. 5B, and 5C. At this time, TCV=17 ppm/° C.; good-enough temperature properties are obtained.

Figure 6A:
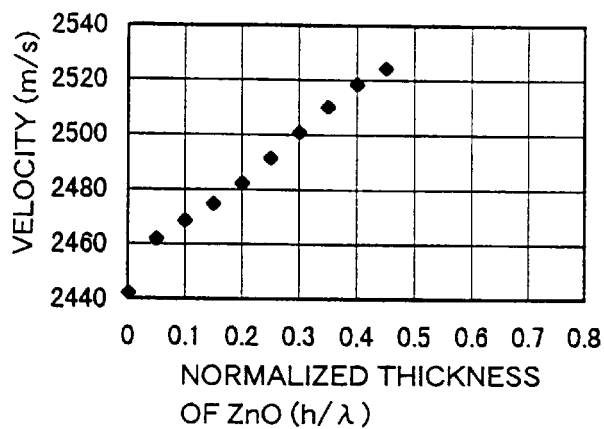
FIGS. 6A, 6B, and 6C are generally illustrative of varying normalized thickness h/λ of ZnO film vs. characteristic change relations for a surface acoustic wave device comprising a langasite single crystal substrate making use of area I-5 and a ZnO film formed on the surface thereof, and are a graph for SAW velocity changes, a graph for electromechanical coupling factor $k^2$ changes, and a graph for TCV (a temperature coefficient of SAW velocity) changes, respectively.
Figure 6B:
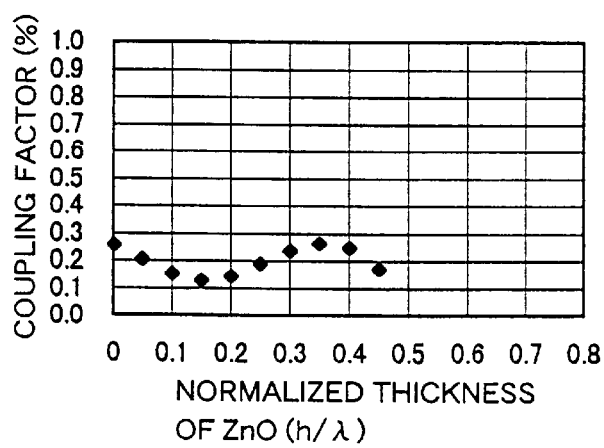
Figure 6C:
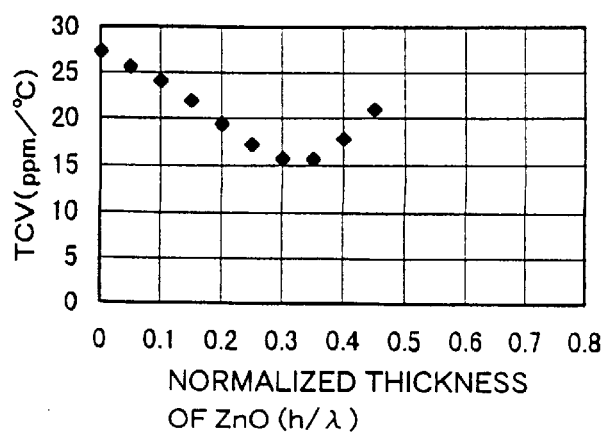

A device making use of area I-5 can have a great electromechanical coupling factor of 0.25% when h/λ=0.35, as can be seen from FIGS. 6B, and 6C. At this time, TCV=16 ppm/° C.; good-enough temperature properties are obtained.

Figure 7A:
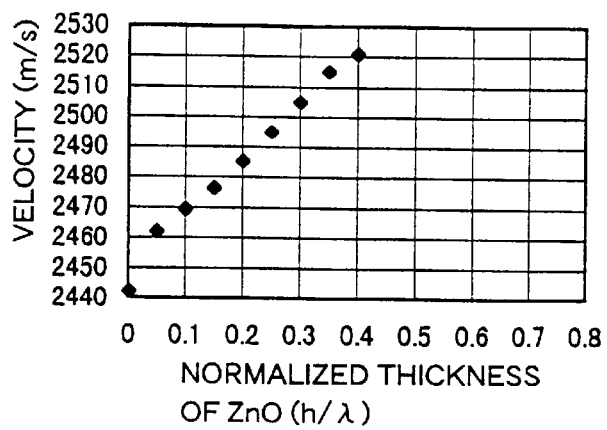
FIGS. 7A, 7B, and 7C are generally illustrative of varying normalized thickness h/λ of ZnO film vs. characteristic change relations for a surface acoustic wave device comprising a langasite single crystal substrate making use of area I-6 and a ZnO film formed on the surface thereof, and are a graph for SAW velocity changes, a graph for electromechanical coupling factor $k^2$ changes, and a graph for TCV (a temperature coefficient of SAW velocity) changes, respectively.
Figure 7B:
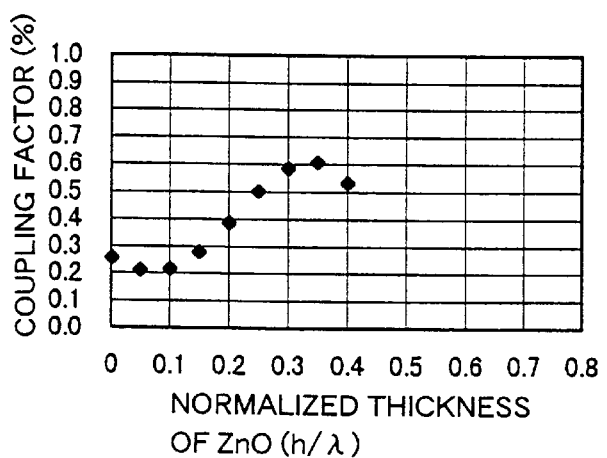
Figure 7C:
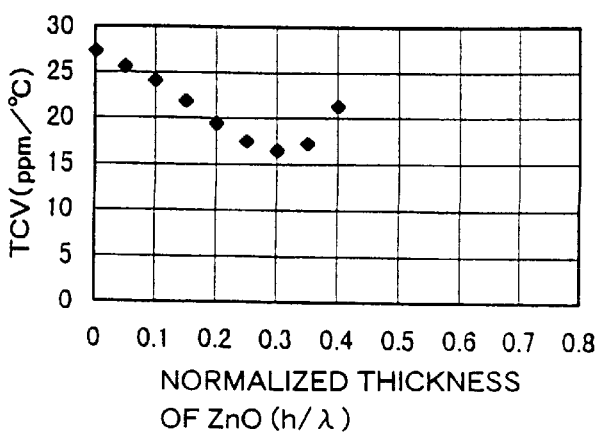

A device making use of area I-6 can have a very great electromechanical coupling factor of 0.61% when h/λ=0.35, as can be seen from FIGS. 7B, and 7C. At this time, TCV=17 ppm/° C.; good-enough temperature properties are obtained.

Figure 8A:
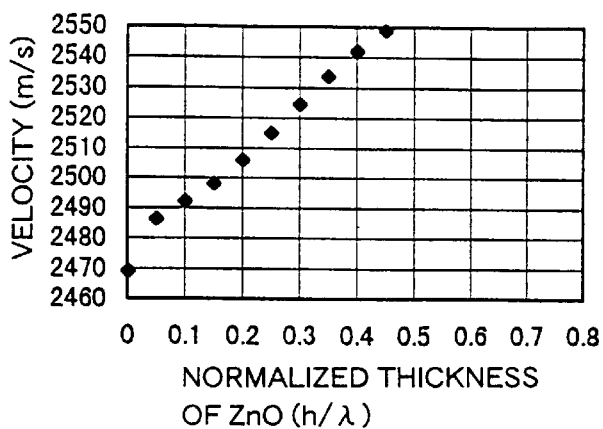
FIGS. 8A, 8B, and 8C are generally illustrative of varying normalized thickness h/λ of ZnO film vs. characteristic change relations for a surface acoustic wave device comprising a langasite single crystal substrate making use of area I-7 and a ZnO film formed on the surface thereof, and are a graph for SAW velocity changes, a graph for electromechanical coupling factor $k^2$ changes, and a graph for TCV (a temperature coefficient of SAW velocity) changes, respectively.
Figure 8B:
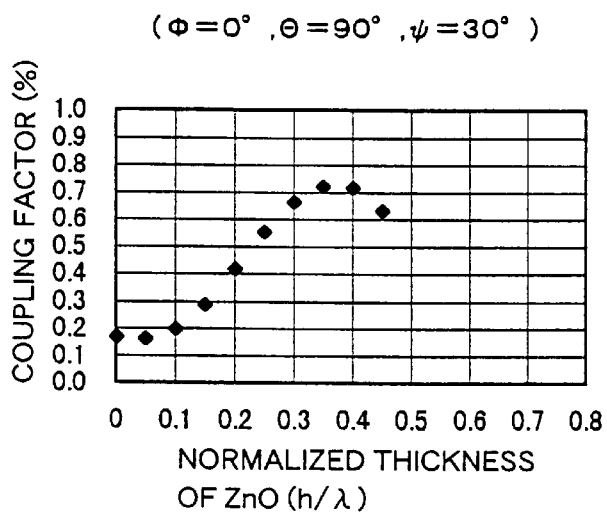
Figure 8C:
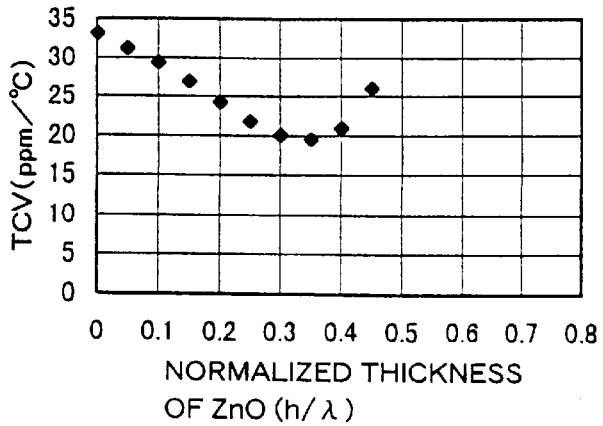

A device making use of area I-7 can have a very great electromechanical coupling factor of 0.72% when h/λ=0.35, as can be seen from FIGS. 8B, and 8C. At this time, TCV=19 ppm/° C.; good-enough temperature properties are obtained.

Figure 9A:
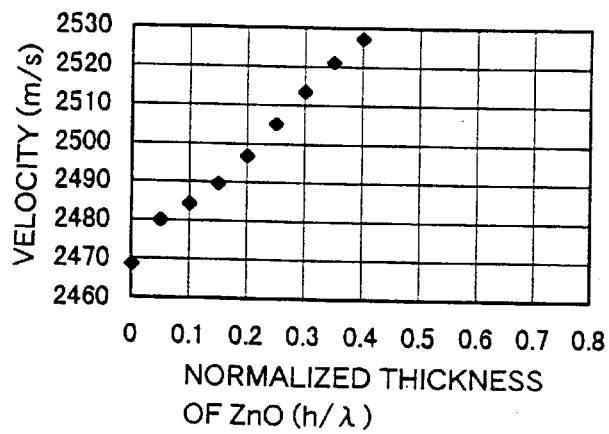
FIGS. 9A, 9B, and 9C are generally illustrative of varying normalized thickness h/λ of ZnO film vs. characteristic change relations for a surface acoustic wave device comprising a langasite single crystal substrate making use of area I-8 and a ZnO film formed on the surface thereof, and are a graph for SAW velocity changes, a graph for electromechanical coupling factor $k^2$ changes, and a graph for TCV (a temperature coefficient of SAW velocity) changes, respectively.
Figure 9B:
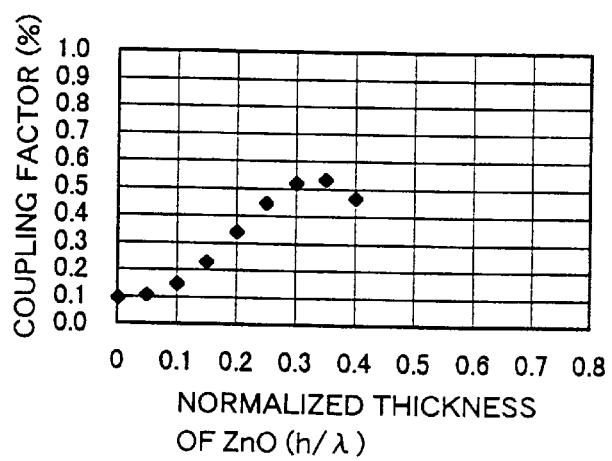
Figure 9C:
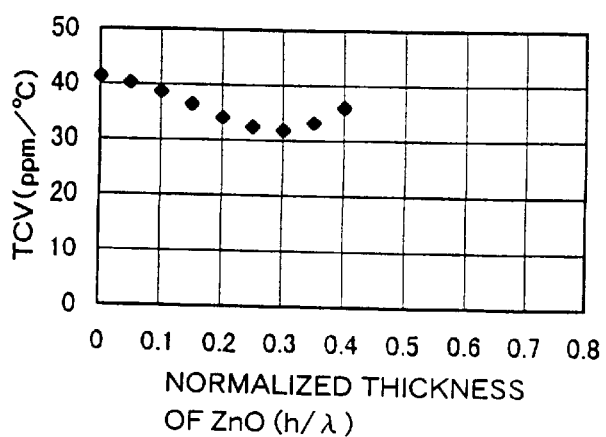

A device making use of area I-8 can have a very great electromechanical coupling factor of 0.53% when h/λ=0.35, as can be seen from FIGS. 9B, and 9C. At this time, TCV=33 ppm/° C.; good-enough temperature properties are obtained.

Figure 10A:
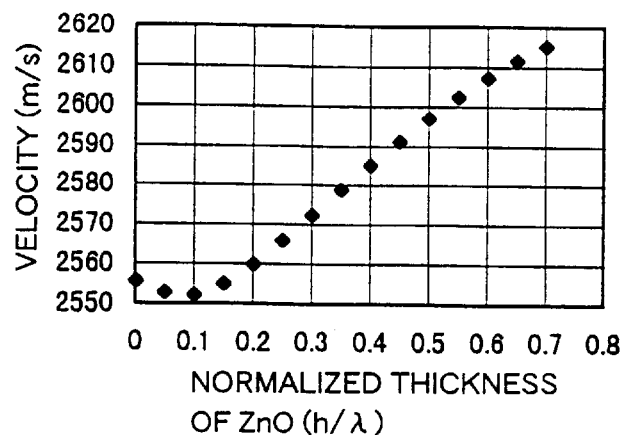
FIGS. 10A, 10B, and 10C are generally illustrative of varying normalized thickness h/λ of ZnO film vs. characteristic change relations for a surface acoustic wave device comprising a langasite single crystal substrate making use of area I-9 and a ZnO film formed on the surface thereof, and are a graph for SAW velocity changes, a graph for electromechanical coupling factor $k^2$ changes, and a graph for TCV (a temperature coefficient of SAW velocity) changes, respectively.
Figure 10B:
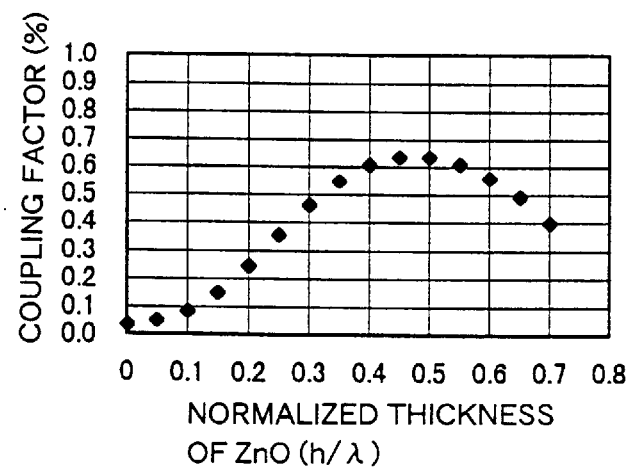
Figure 10C:
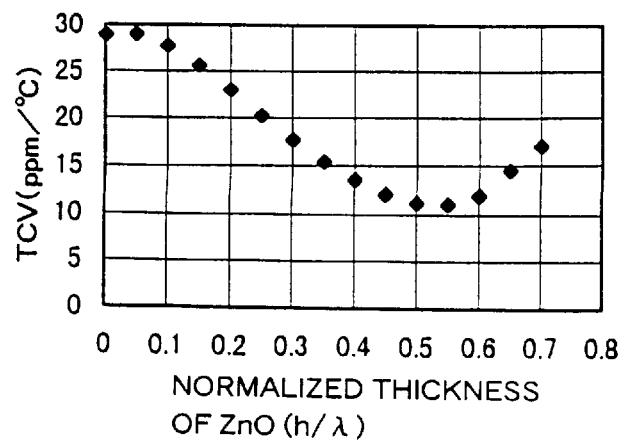

A device making use of area I-9 can have a very great electromechanical coupling factor of 0.63% when h/λ=0.5, as can be seen from FIGS. 10B, and 10C. At this time, TCV=12 ppm/° C.; good-enough temperature properties are obtained.

Figure 11:
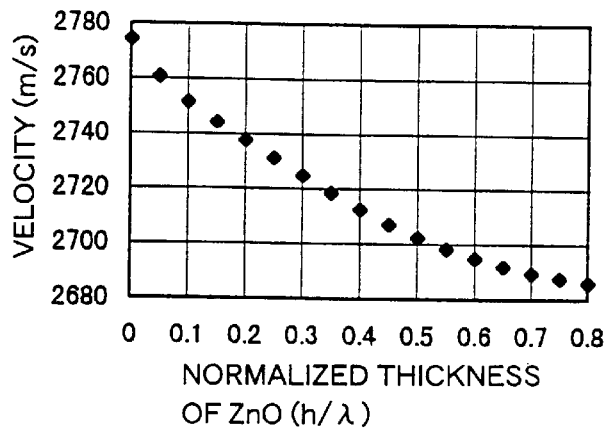
FIGS. 11A, 11B, and 11C are generally illustrative of varying normalized thickness h/λ of ZnO film vs. characteristic change relations for a surface acoustic wave device comprising a langasite single crystal substrate making use of area I-10 and a ZnO film formed on the surface thereof, and are a graph for SAW velocity changes, a graph for electromechanical coupling factor $k^2$ changes, and a graph for TCV (a temperature coefficient of SAW velocity) changes, respectively.
Figure 11:
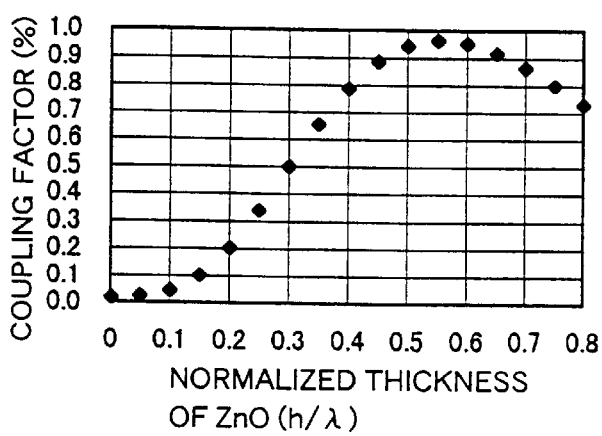
Figure 11:
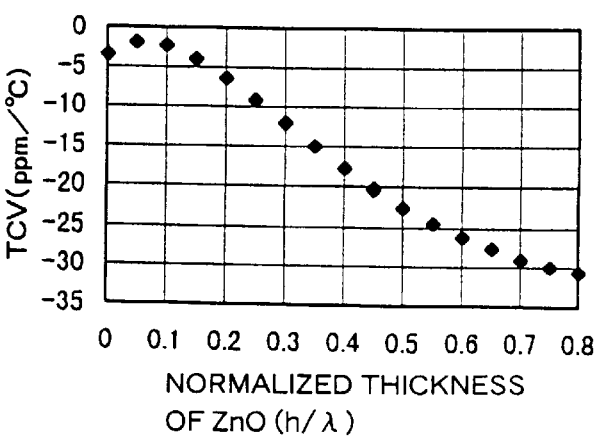

A device making use of area I-10 can have a very great electromechanical coupling factor of 0.96% when h/λ=0.55, as can be seen from FIGS. 11B, and 11C. At this time, TCV=−24 ppm/° C.; good-enough temperature properties are obtained.

Example 1-2

(Embodiment 1)

Surface acoustic wave devices were fabricated as in example 1-1 with the exception that φ and θ were 0° and 90°, respectively, and ψ to determine the x-axis or the propagation direction of surface acoustic waves was varied at intervals of 2° between −80° and −66°. It is to be noted that these values for φ, θ and ψ were included in area I-1. For these devices, the TCV vs. h/λ (normalized thickness) relations were examined. The results are plotted in FIG. 12. Also, the $k^2$ vs. h/λ relations were examined. The results are plotted in FIG. 13.

Figure 12:
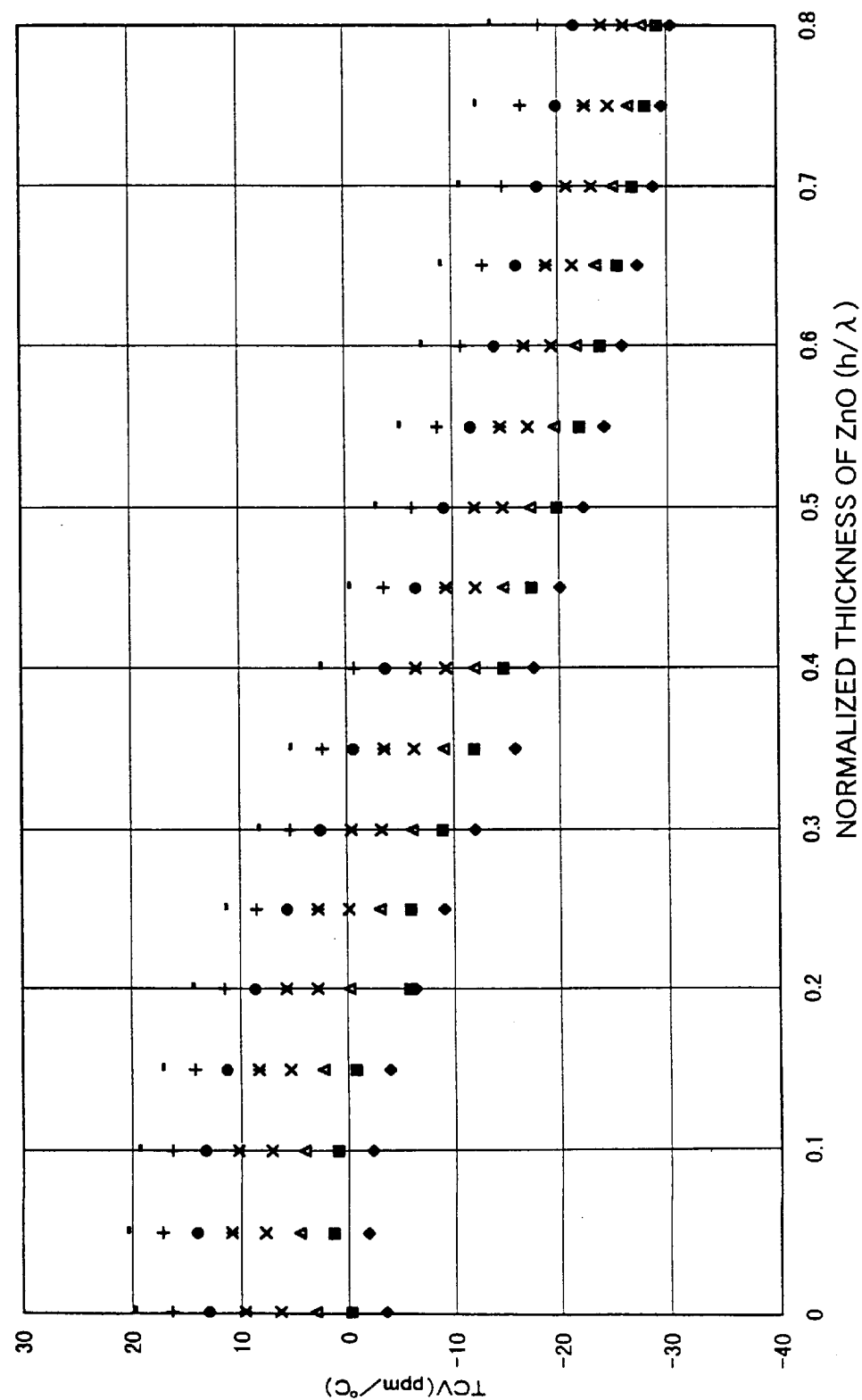
FIG. 12 is a graph illustrative of TCV (a temperature coefficient of SAW velocity) changes for a surface acoustic wave device comprising a langasite single crystal substrate making use of area I-1 and a ZnO film formed on the surface thereof, when the normalized thickness h/λ of the ZnO film and ψ for defining the propagation direction of a surface acoustic wave are varied.
Figure 13:
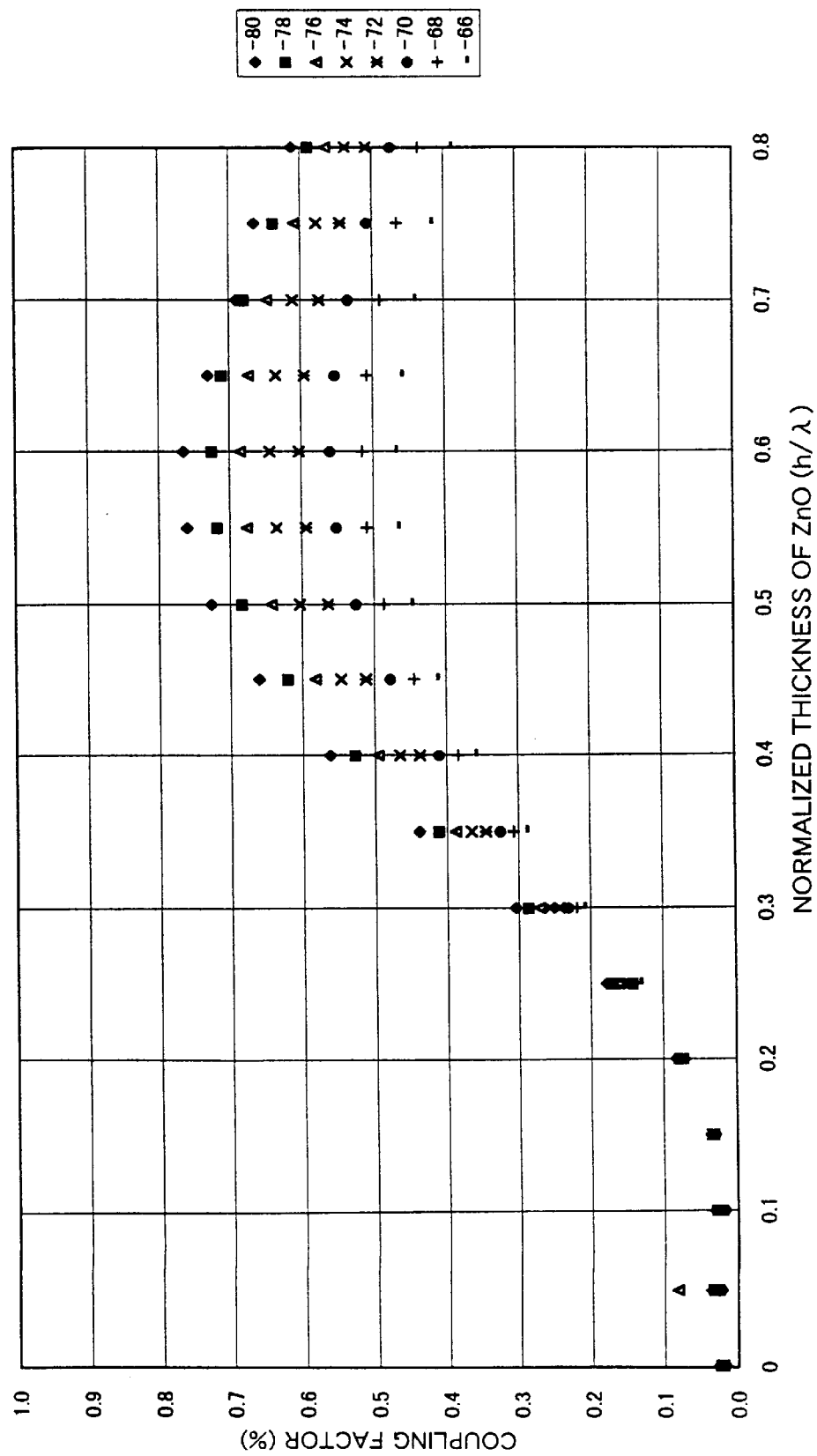
FIG. 13 is a graph illustrative of electromechanical coupling factor $k^2$ changes for a surface acoustic wave device comprising a langasite single crystal substrate making use of area I-1 and a ZnO film formed on the surface thereof, when the normalized thickness h/λ of the ZnO film and ψ for defining the propagation direction of a surface acoustic wave are varied.

From FIG. 12, on the one hand, it is seen that, at area I-1, a so-called zero temperature property is obtained and the thickness of the ZnO film at which the zero temperature property is obtained varies depending on the propagation direction of surface acoustic waves. From FIG. 13, on the other hand, it is seen that as the ZnO film becomes thick, the electromechanical coupling factor tends to become large. Therefore, if the thickness of the ZnO film is determined in such a manner that the zero temperature property is obtained and if, at this time, the propagation direction is selected in such a manner that a large-enough electromechanical coupling factor is obtained, it is then possible to achieve a surface acoustic wave device having the zero temperature property and a large electromechanical coupling factor. If, for instance, the propagation direction ψ is −70 and the normalized thickness, h/λ, of ZnO is 0.35, it is then possible to achieve a small size yet broad passband surface acoustic wave device having excellent temperature properties because TCV is substantially reduced to zero and a very large $k^2$ of 0.32% is obtained.

Example 1-3

(Embodiment 1)

Surface acoustic wave devices were fabricated as in example 1-1 with the exception that φ and θ were 0° and 90°, respectively, and ψ to determine the x-axis or the propagation direction of surface acoustic waves was varied at intervals of 2° between 66° and 80°. It is to be noted that these values for φ, θ and ψ were included in area I-10. For these devices, the TCV vs. h/λ (normalized thickness) relations were examined. The results are plotted in FIG. 14. Also, the $k^2$ vs. h/λ relations were examined. The results are plotted in FIG. 15.

Figure 14:
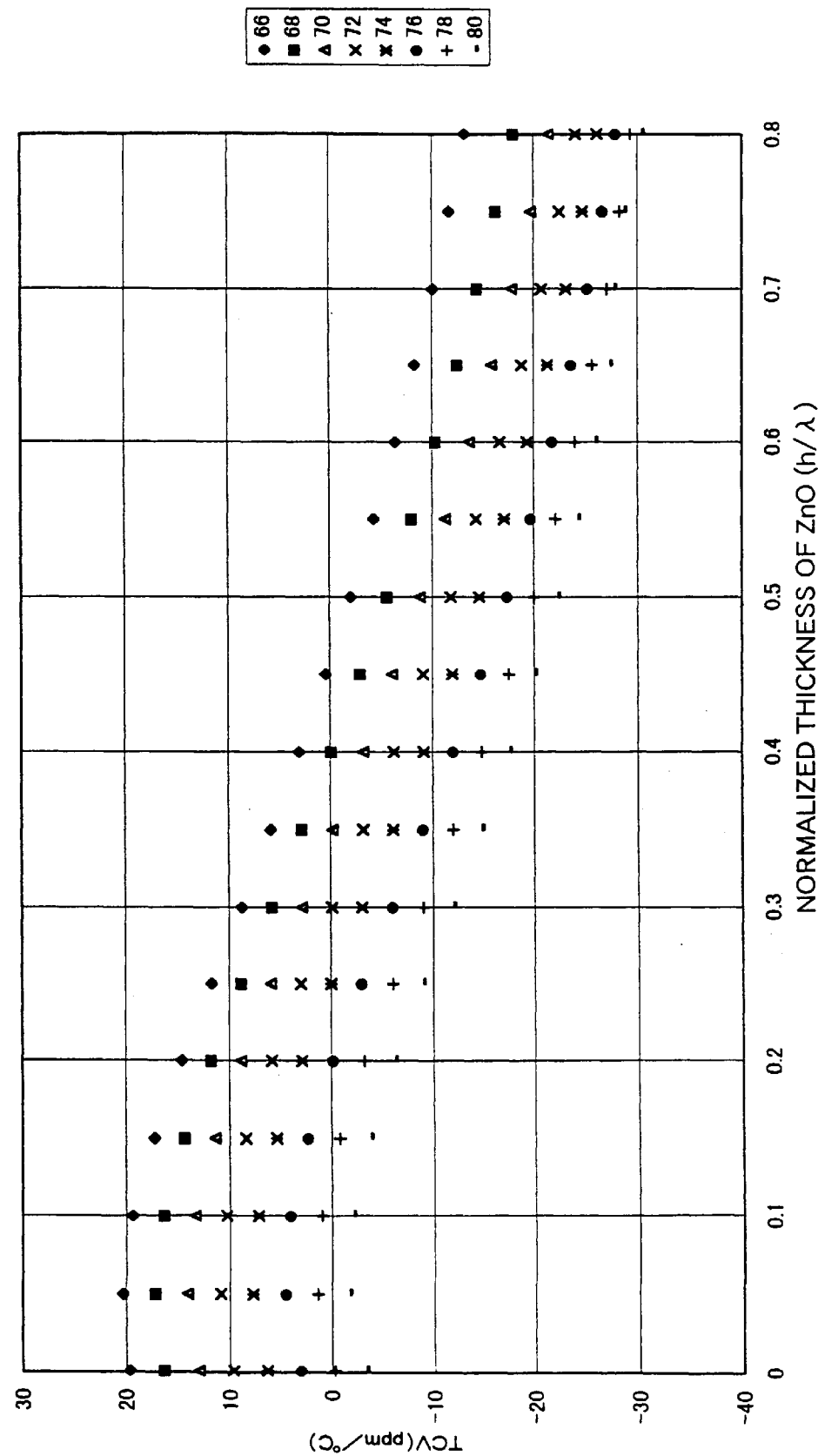
FIG. 14 is a graph illustrative of TCV (a temperature coefficient of SAW velocity) changes for a surface acoustic wave device comprising a langasite single crystal substrate making use of area I-10 and a ZnO film formed on the surface thereof, when the normalized thickness h/λ of the ZnO film and ψ for defining the propagation direction of a surface acoustic wave are varied.
Figure 15:
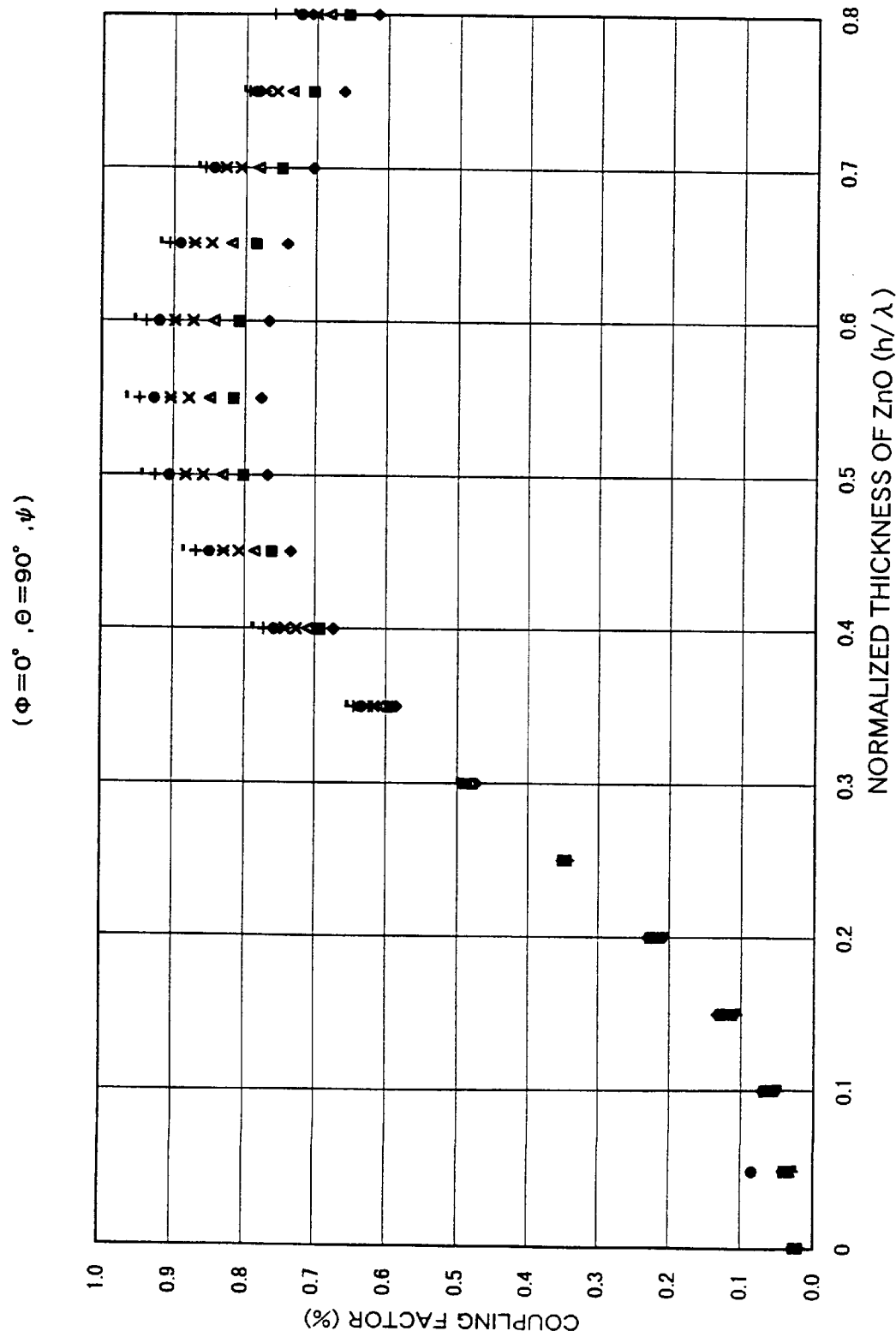
FIG. 15 is a graph illustrative of electromechanical coupling factor $k^2$ changes for a surface acoustic wave device comprising a langasite single crystal substrate making use of area I-10 and a ZnO film formed on the surface thereof, when the normalized thickness h/λ of the ZnO film and ψ for defining the propagation direction of a surface acoustic wave are varied.

From FIG. 14, on the one hand, it is seen that, at area I-10, the zero temperature property is obtained and the thickness of the ZnO film at which the zero temperature property is obtained varies depending on the propagation direction of surface acoustic waves. From FIG. 15, on the other hand, it is seen that as the ZnO film becomes thick, the electromechanical coupling factor tends to become large. Therefore, if the thickness of the ZnO film is determined in such a manner that a large-enough electromechanical coupling factor is obtained and if, at this time, the propagation direction is selected in such a manner that the zero temperature property is obtained, it is then possible to achieve a surface acoustic wave device having the zero temperature property and a large electromechanical coupling factor. If, for instance, the propagation direction ψ is 70° and the normalized thickness, h/=, of ZnO is 0.35, it is then possible to achieve a small size yet broad passband surface acoustic wave device having excellent temperature properties because TCV is substantially reduced to zero and a very large $k^2$ of 0.6% is obtained.

Example 2-1

(Embodiment 2)

A langasite single crystal was grown by the CZ process, and a 0.35 mm thick substrate was cut out of this single crystal. A ZnO film was formed on the surface of the substrate by a magnetron sputtering process, and a surface acoustic wave transducer comprising a set of an input side interdigital electrode and an output side interdigital electrode was formed on the surface of the ZnO film to fabricate a surface acoustic wave device. The interdigital electrodes, each being a normal type electrode of the same shape, were formed of Al by evaporation, and had a thickness of 0.1 $\mu$m, an electrode finger width d of 15 $\mu$m and an electrode pitch (4 d) of 60 $\mu$m (corresponding to the wavelength $\lambda$ of a surface acoustic wave), with the number of electrode finger pairs being 40 and the aperture width of electrode fingers being 60$\lambda$ (=3.6 mm). However, when output signals were faint, interdigital electrodes with only the aperture width changed to 100$\lambda$ were used in place of the aforesaid interdigital electrodes. In addition, when the normalized thickness, h/$\lambda$, of the ZnO film exceeded 0.4, the electrode pitch was halved to 30 $\mu$m, and the aperture width was correspondingly halved to 1.8 mm (=60$\lambda$).

In the instant example, $\phi$ and $\theta$ were 0° and 90° when the cut angle of the substrate in this device out of the langasite single crystal and the propagation direction of surface acoustic waves thereon were expressed in terms of Euler angles ($\phi$, $\theta$ and $\psi$). For $\psi$ to determine the x-axis or the propagation direction of surface acoustic waves, the values shown in FIGS. 17A to 26C were selected from within the general area II. The thickness, h, of the ZnO film on the substrate was selected in such a way that the aforesaid normalized thickness, h/$\lambda$, was between 0.05 and 0.8. For the purpose of comparison, a surface acoustic wave device with h/$\lambda$=0, i.e., with no ZnO film formed thereon, was prepared. Changes in the SAW velocity, electromechanical coupling factor $k^2$, and temperature coefficient of SAW velocity, TCV, were examined at varied h/$\lambda$'s in each propagation direction. The SAW velocity was found from the center frequency of the filter, and the electromechanical coupling factor $k^2$ was determined from a two-terminal admittance measured of the surface acoustic wave transducer, using a well-known Smith's equivalent circuit model. The results of the SAW velocity, $k^2$, and TCV measured in each propagation direction are plotted in FIGS. 17A to 26C.

As the normalized thickness, h/$\lambda$, of the ZnO film increased, the surface acoustic wave mode vanished, resulting in the generation of bulk waves. For this reason, data obtained after the generation of bulk waves are not plotted at all.

The graphs showing the SAW velocity, and $k^2$ changes indicate that if the cut angle of the substrate from the crystal and the propagation direction of surface acoustic waves lie in the general area II, the SAW velocity can then be reduced to 2,900 m/s or lower. This is more favorable for achieving a size reduction of a surface acoustic wave device, as compared with a conventional ST quartz crystal. It is also found that within the general area II an electromechanical coupling factor of 0.1% or greater can be obtained. It is thus possible to obtain a much greater electromechanical coupling factor by a selection of the thickness of the ZnO.

Referring further to the graphs showing the TCV changes, when the substrate per se has a positive TCV, in other words, when TCV is positive at a normalized thickness, h/$\lambda$, of 0, it is found that TCV is shifted from a positive to a negative direction with an h/$\lambda$ increase; improvements are made in the temperature properties. When the substrate itself has a Inegative TCV, on the other hand, TCV is greatly shifted to a negative side due to the provision of the ZnO film and an increase in its normalized thickness. Even in this case, the absolute value of TCV is not so great (of the order of 35 ppm/° C. or lower); it is found that the substrate can be much more improved in terms of temperature stability over a conventional BGO substrate.

In what follows, each area will be explained at great length.

Figure 17A:
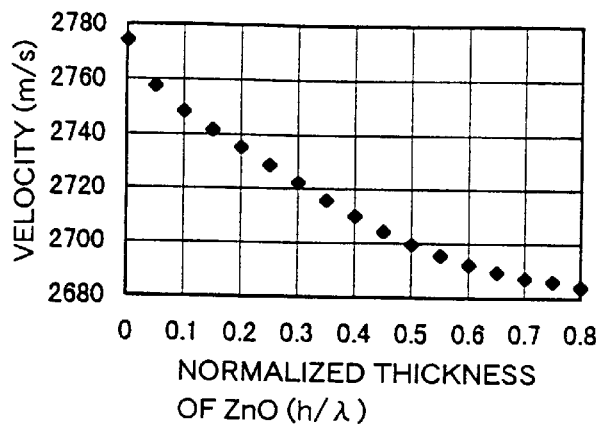
FIGS. 17A, 17B, and 17C are generally illustrative of varying normalized thickness h/λ of ZnO film vs. characteristic change relations for a surface acoustic wave device comprising a langasite single crystal substrate making use of area II-1, and a ZnO film and an interdigital electrode formed on the surface thereof, and are a graph for SAW velocity changes, a graph for electromechanical coupling factor k2 changes, and a graph for TCV (a temperature coefficient of SAW velocity) changes, respectively.
Figure 17B:
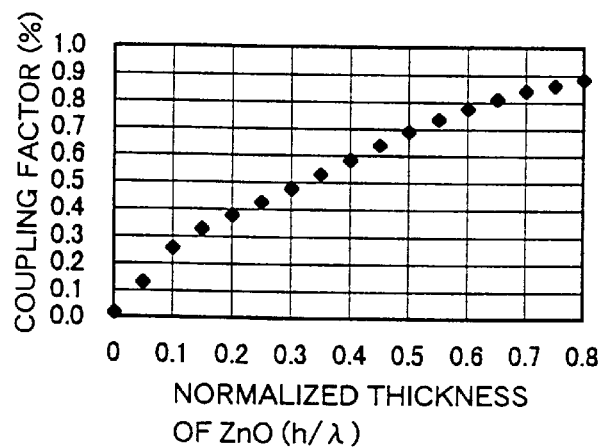
Figure 17C:
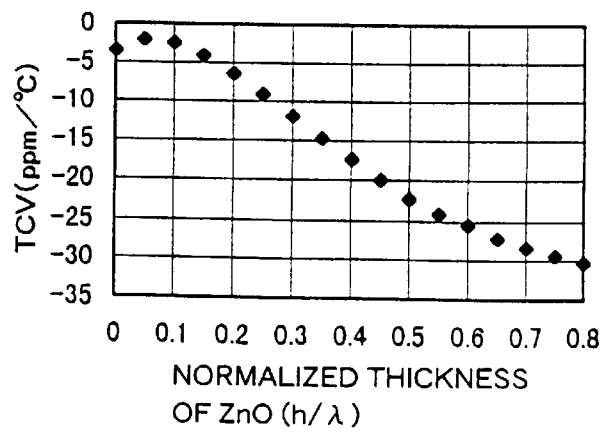
Figure 18:
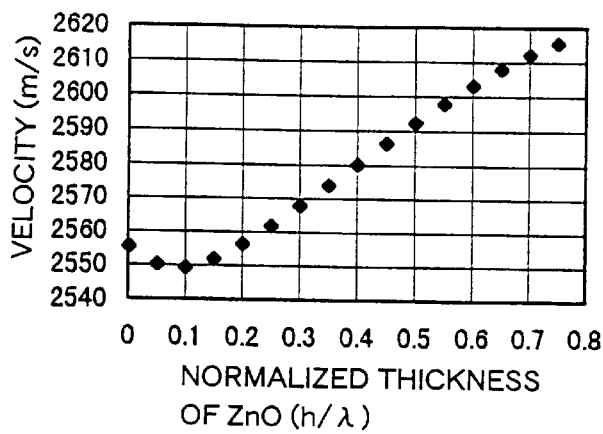
FIGS. 18A, 18B, and 18C are generally illustrative of varying normalized thickness h/λ of ZnO film vs. characteristic change relations for a surface acoustic wave device comprising a langasite single crystal substrate making use of area II-2, and a ZnO film and an interdigital electrode formed on the surface thereof, and are a graph for SAW velocity changes, a graph for electromechanical coupling factor $k^2$ changes, and a graph for TCV (a temperature coefficient of SAW velocity) changes, respectively.
Figure 18:
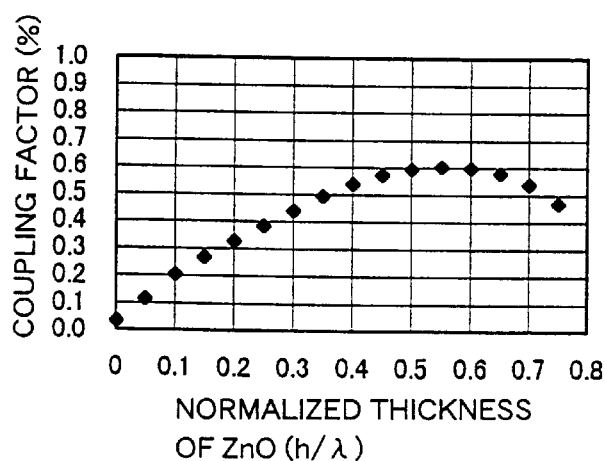
Figure 18:
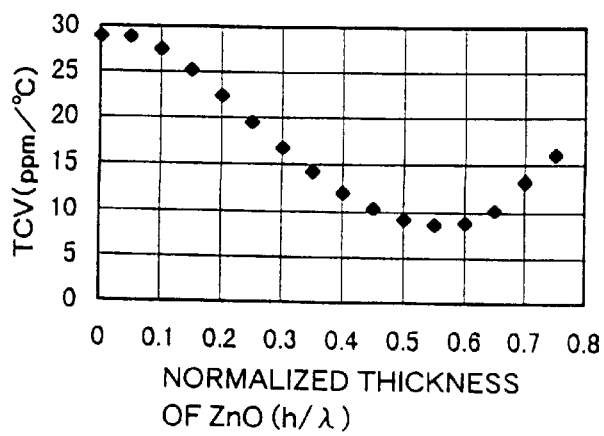
Figure 19:
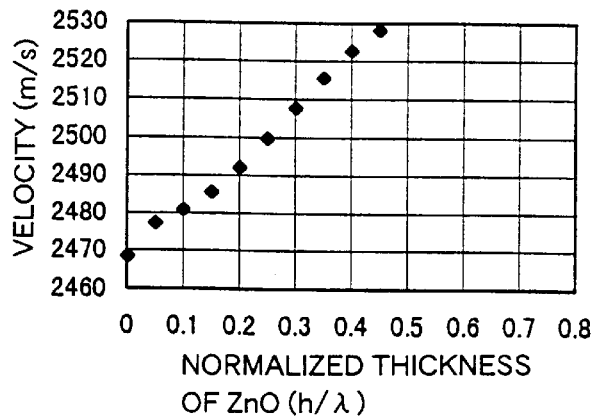
FIGS. 19A, 19B, and 19C are generally illustrative of varying normalized thickness h/λ of ZnO film vs. characteristic change relations for a surface acoustic wave device comprising a langasite single crystal substrate making use of area II-3, and a ZnO film and an interdigital electrode formed on the surface thereof, and are a graph for SAW velocity changes, a graph for electromechanical coupling factor $k^2$ changes, and a graph for TCV (a temperature coefficient of SAW velocity) changes, respectively.
Figure 19:
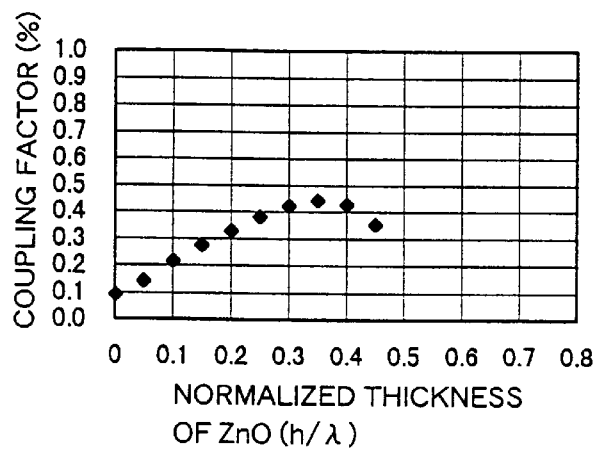
Figure 19:
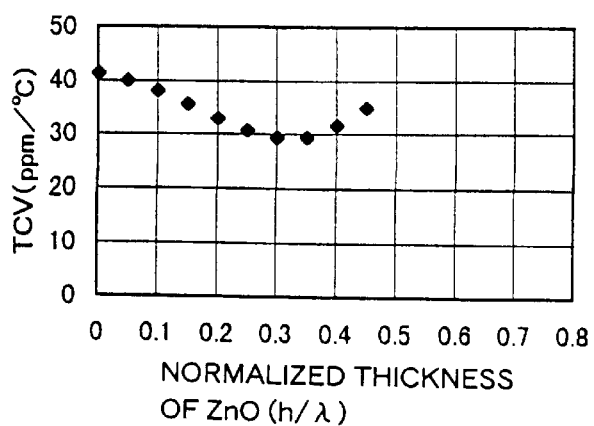
Figure 20:
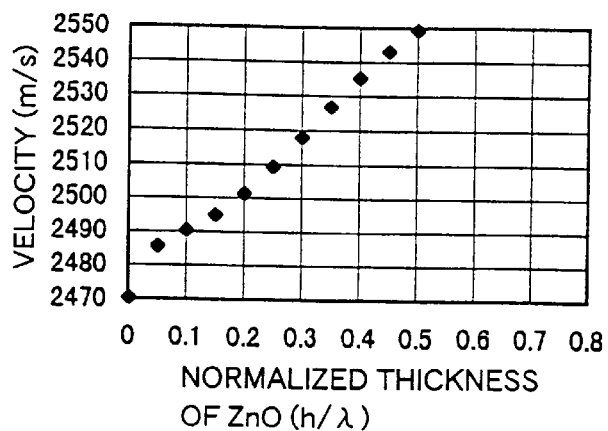
FIGS. 20A, 20B, and 20C are generally illustrative of varying normalized thickness h/λ of ZnO film vs. characteristic change relations for a surface acoustic wave device comprising a langasite single crystal substrate making use of area II-4, and a ZnO film and an interdigital electrode formed on the surface thereof, and are a graph for SAW velocity changes, a graph for electromechanical coupling factor k2 changes, and a graph for TCV (a temperature coefficient of SAW velocity) changes, respectively.
Figure 20:
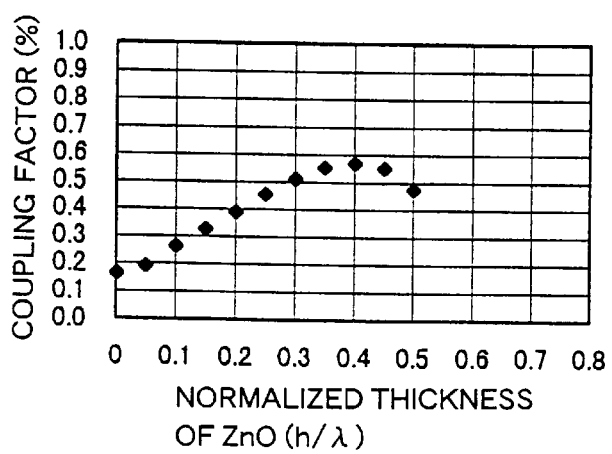
Figure 20:
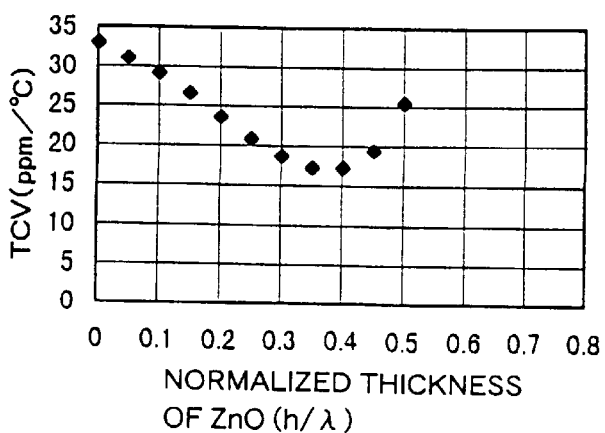
Figure 21:
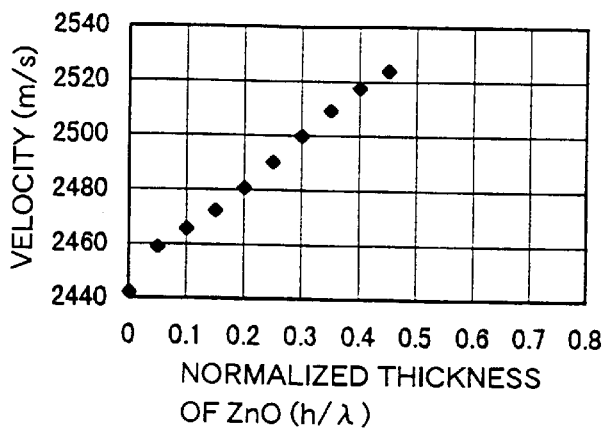
FIGS. 21A, 21B, and 21C are generally illustrative of varying normalized thickness h/λ of ZnO film vs. characteristic change relations for a surface acoustic wave device comprising a langasite single crystal substrate making use of area II-5, and a ZnO film and an interdigital electrode formed on the surface thereof, and are a graph for SAW velocity changes, a graph for electromechanical coupling factor $k^2$ changes, and a graph for TCV (a temperature coefficient of SAW velocity) changes, respectively.
Figure 21:
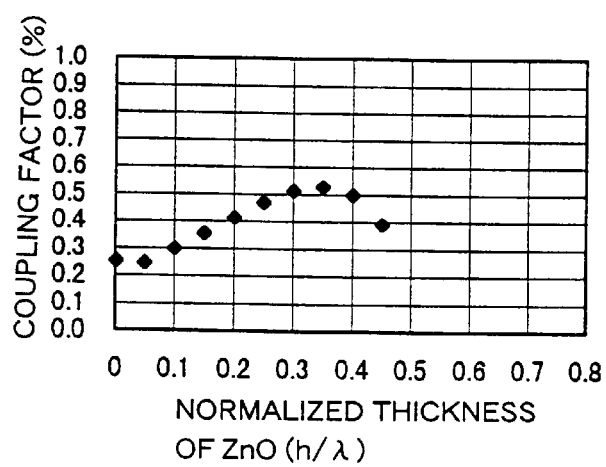
Figure 21:
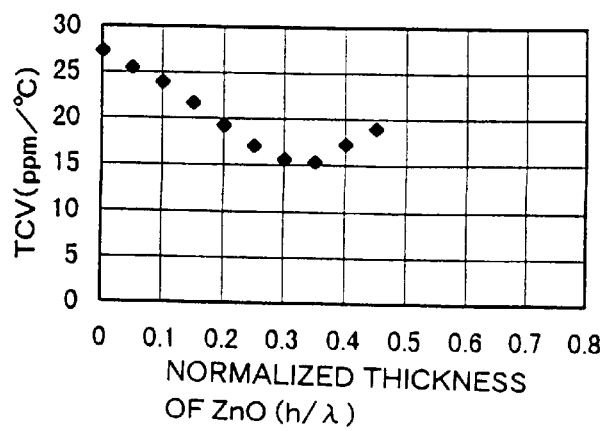
Figure 22:
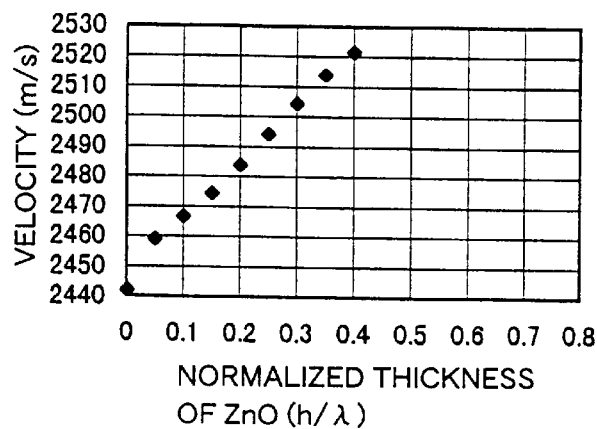
FIGS. 22A, 22B, and 22C are generally illustrative of varying normalized thickness h/λ of ZnO film vs. characteristic change relations for a surface acoustic wave device comprising a langasite single crystal substrate making use of area II-6, and a ZnO film and an interdigital electrode formed on the surface thereof, and are a graph for SAW velocity changes, a graph for electromechanical coupling factor $k^2$ changes, and a graph for TCV (a temperature coefficient of SAW velocity) changes, respectively.
Figure 22:
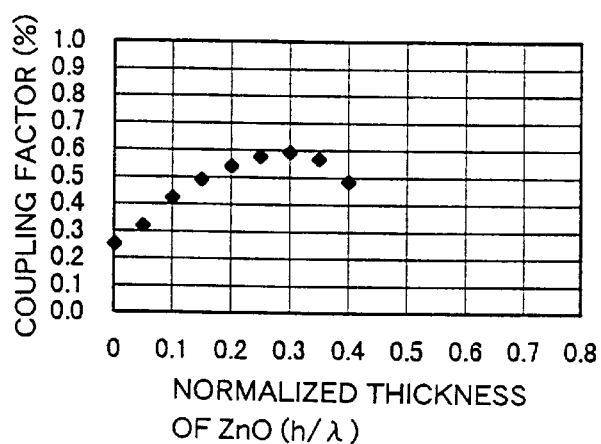
Figure 22:
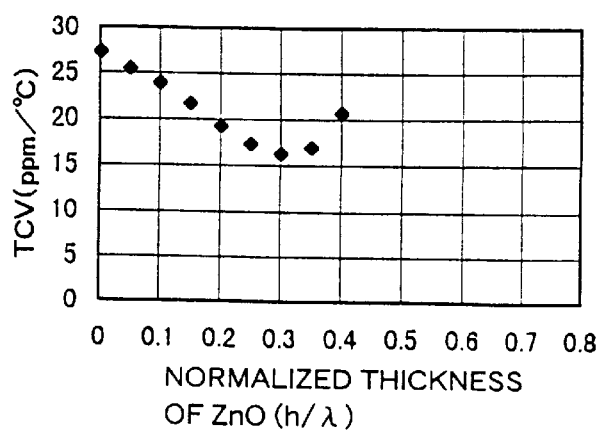
Figure 23:
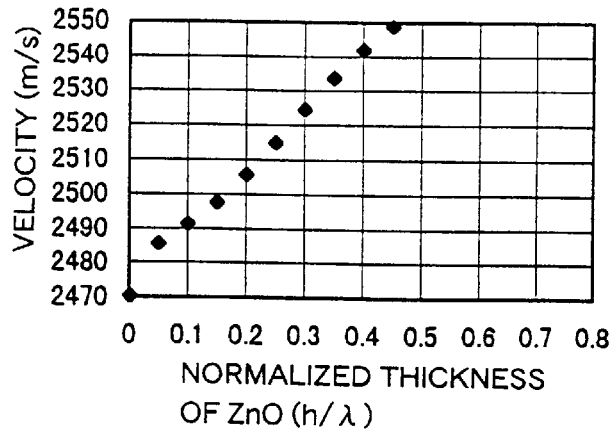
FIGS. 23A, 23B, and 23C are generally illustrative of varying normalized thickness h/λ of ZnO film vs. characteristic change relations for a surface acoustic wave device comprising a langasite single crystal substrate making use of area II-7, and a ZnO film and an interdigital electrode formed on the surface thereof, and are a graph for SAW velocity changes, a graph for electromechanical coupling factor $k^2$ changes, and a graph for TCV (a temperature coefficient of SAW velocity) changes, respectively.
Figure 23:
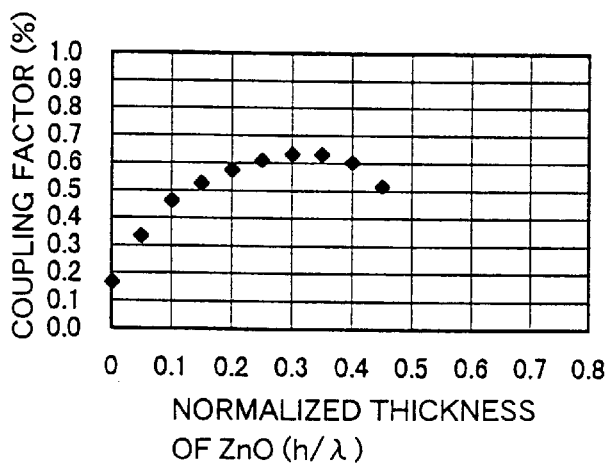
Figure 23:
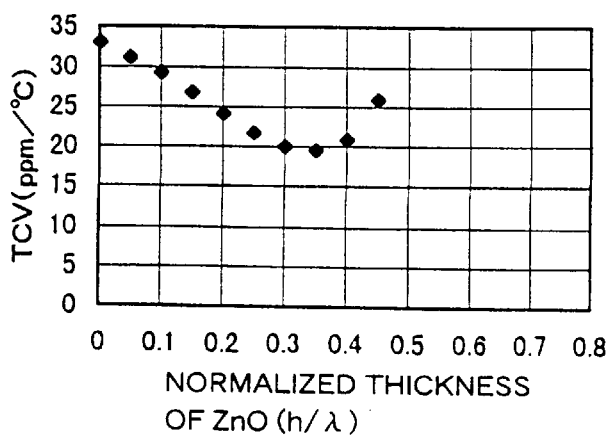
Figure 24:
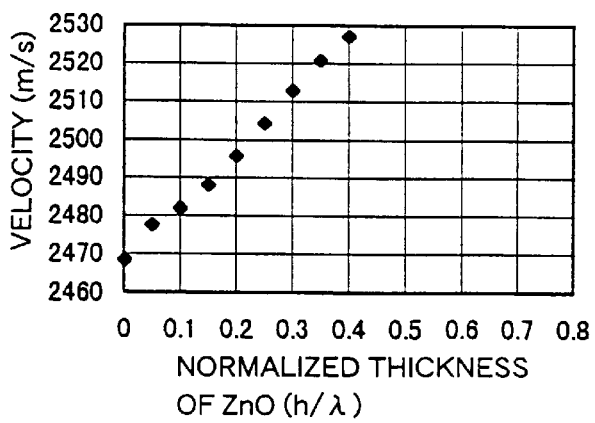
FIGS. 24A, 24B, and 24C are generally illustrative of varying normalized thickness h/λ of ZnO film vs. characteristic change relations for a surface acoustic wave device comprising a langasite single crystal substrate making use of area II-8, and a ZnO film and an interdigital electrode formed on the surface thereof, and are a graph for SAW velocity changes, a graph for electromechanical coupling factor $k^2$ changes, and a graph for TCV (a temperature coefficient of SAW velocity) changes, respectively.
Figure 24:
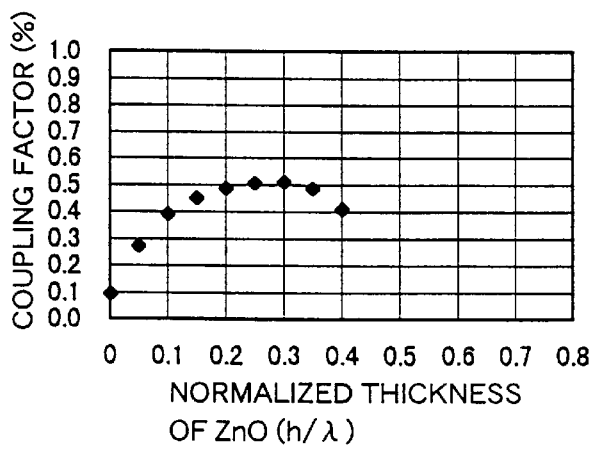
Figure 24:
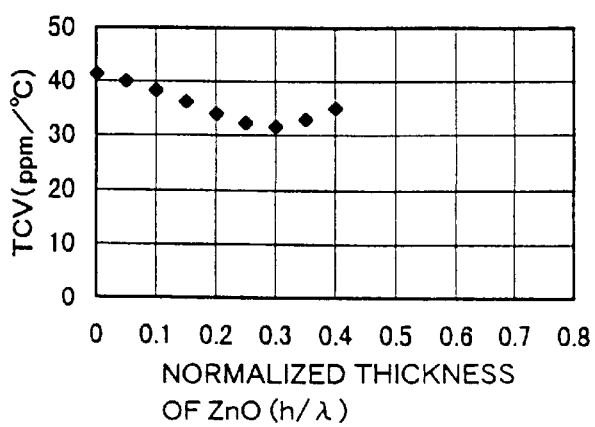
Figure 25:
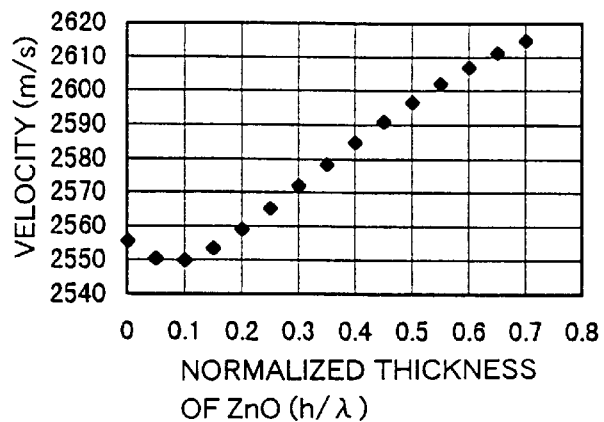
FIGS. 25A, 25B, and 25C are generally illustrative of varying normalized thickness h/λ of ZnO film vs. characteristic change relations for a surface acoustic wave device comprising a langasite single crystal substrate making use of area II-9, and a ZnO film and an interdigital electrode formed on the surface thereof, and are a graph for SAW velocity changes, a graph for electromechanical coupling factor $k^2$ changes, and a graph for TCV (a temperature coefficient of SAW velocity) changes, respectively.
Figure 25:
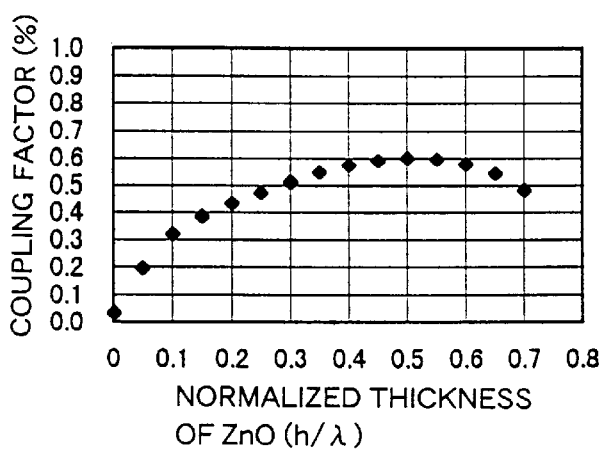
Figure 25:
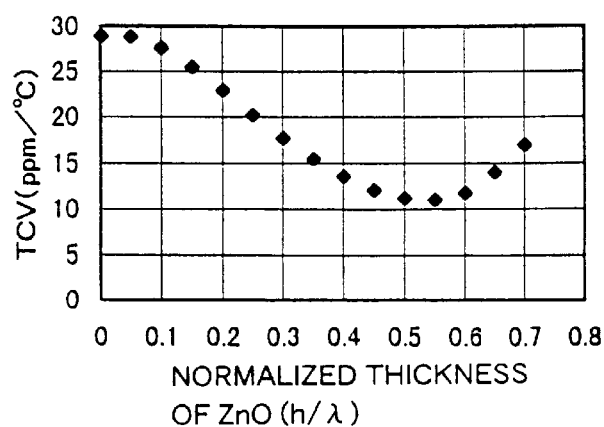
Figure 26:
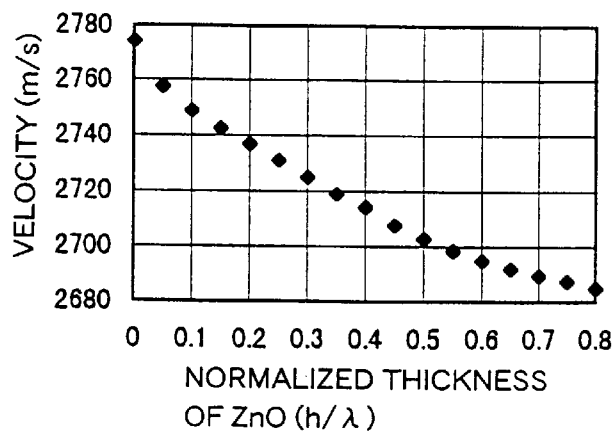
FIGS. 26A, 26B, and 26C are generally illustrative of varying normalized thickness h/λ of ZnO film vs. characteristic change relations for a surface acoustic wave device comprising a langasite single crystal substrate making use of area II-10, and a ZnO film and an interdigital electrode formed on the surface thereof, and are a graph for SAW velocity changes, a graph for electromechanical coupling factor $k^2$ changes, and a graph for TCV (a temperature coefficient of SAW velocity) changes, respectively.
Figure 26:
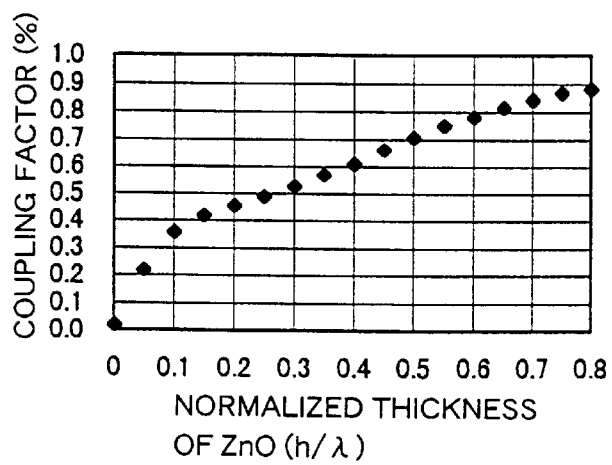
Figure 26:
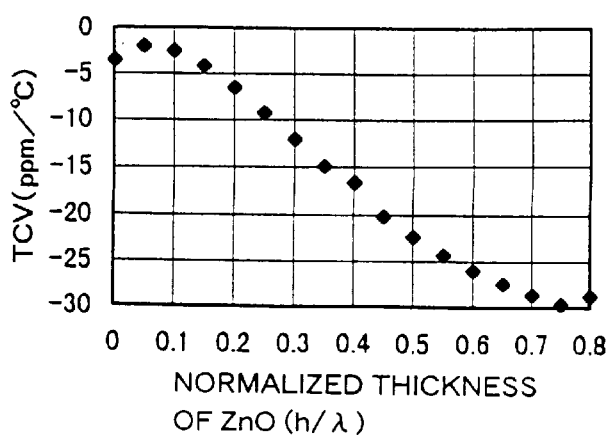

A device making use of area II-1 can have a very great electromechanical coupling factor of 0.88% when h/$\lambda$=0.8, as can be seen from FIGS. 17B, and 17C. At this time, TCV=−30 ppm/° C.; good-enough temperature properties are obtained. A device making use of area II-2 can have a great electromechanical coupling factor of 0.6% when h/$\lambda$=0.55, as can be seen from FIGS. 18B, and 18C. At this time, TCV=9 ppm/° C.; very excellent temperature properties are obtained.

A device making use of area II-3 can have an electromechanical coupling factor of 0.44% when h/$\lambda$=0.35, as can be seen from FIGS. 19B, and 19C. At this time, TCV=29 ppm/° C.; good-enough temperature properties are obtained.

A device making use of area II-4 can have a great electromechanical coupling factor of 0.56% when h/$\lambda$=0.4, as can be seen from FIGS. 20B, and 20C. At this time, TCV=17 ppm/° C.; good-enough temperature properties are obtained.

A device making use of area II-5 can have a very great electromechanical coupling factor of 0.53% when h/$\lambda$=0.35, as can be seen from FIGS. 21B, and 21C. At this time, TCV=15 ppm/° C.; good-enough temperature properties are obtained.

A device making use of area II-6 can have a very great electromechanical coupling factor of 0.59% when h/$\lambda$=0.3, as can be seen from FIGS. 22B, and 22C. At this time, TCV=16 ppm/° C.; very excellent temperature properties are obtained.

A device making use of area II-7 can have a very great electromechanical coupling factor of 0.63% when h/$\lambda$=0.35, as can be seen from FIGS. 23B, and 23C. At this time, TCV=19 ppm/° C.; good-enough temperature properties are obtained.

A device making use of area II-8 can have a very great electromechanical coupling factor of 0.51% when h/$\lambda$=0.3, as can be seen from FIGS. 24B, and 24C. At this time, TCV=32 ppm/° C.; good-enough temperature properties are obtained.

A device making use of area II-9 can have a very great electromechanical coupling factor of 0.59% when h/$\lambda$=0.55, as can be seen from FIGS. 25B, and 25C. At this time, TCV=11 ppm/° C.; good-enough temperature properties are obtained.

A device making use of area II-10 can have a very great electromechanical coupling factor of 0.86% when h/$\lambda$=0.75, as can be seen from FIGS. 26B, and 26C. At this time, TCV=−30 ppm/° C.; good-enough temperature properties are obtained.

Example 2-2

(Embodiment 2)

Surface acoustic wave devices were fabricated as in example 2-1 with the exception that $\phi$ and $\theta$ were 0° and 90°, respectively, and $\psi$ to determine the x-axis or the propagation direction of surface acoustic waves was varied at intervals of 2° between −80° and −66°. It is to be noted that these values for $\phi$, $\theta$ and $\psi$ were included in area II-1. For these devices, the TCV vs. h/$\lambda$ (normalized thickness) relations were examined. The results are plotted in FIG. 27. Also, the $k^2$ vs. h/$\lambda$ relations were examined. The results are plotted in FIG. 28.

Figure 27:
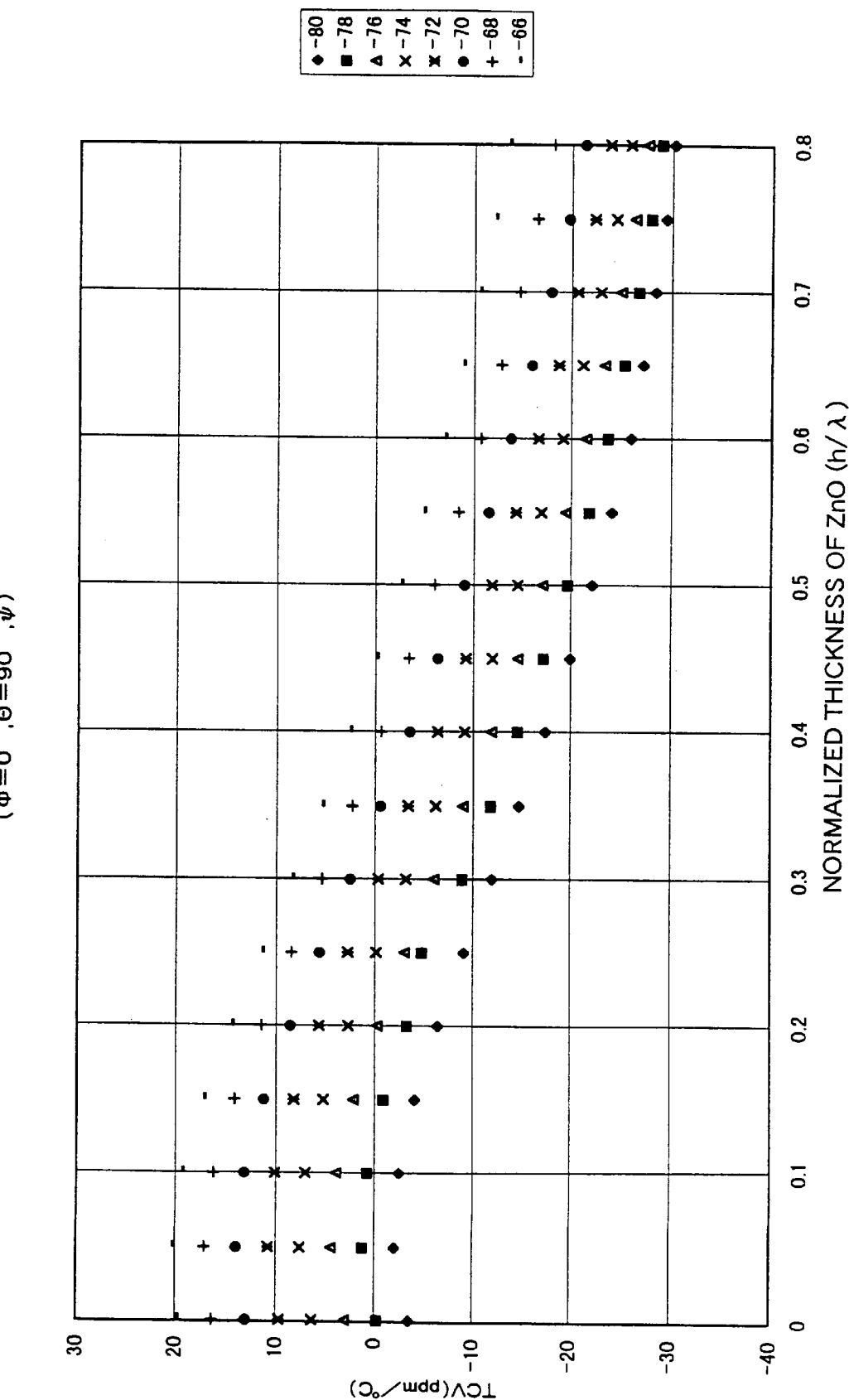
FIG. 27 is a graph illustrative of TCV (a temperature coefficient of SAW velocity) changes for a surface acoustic wave device comprising a langasite single crystal substrate making use of area II-1, and a ZnO film and an interdigital electrode formed on the surface thereof, when the normalized thickness h/λ of the ZnO film and ψ for defining the propagation direction of a surface acoustic wave are varied.
Figure 28:
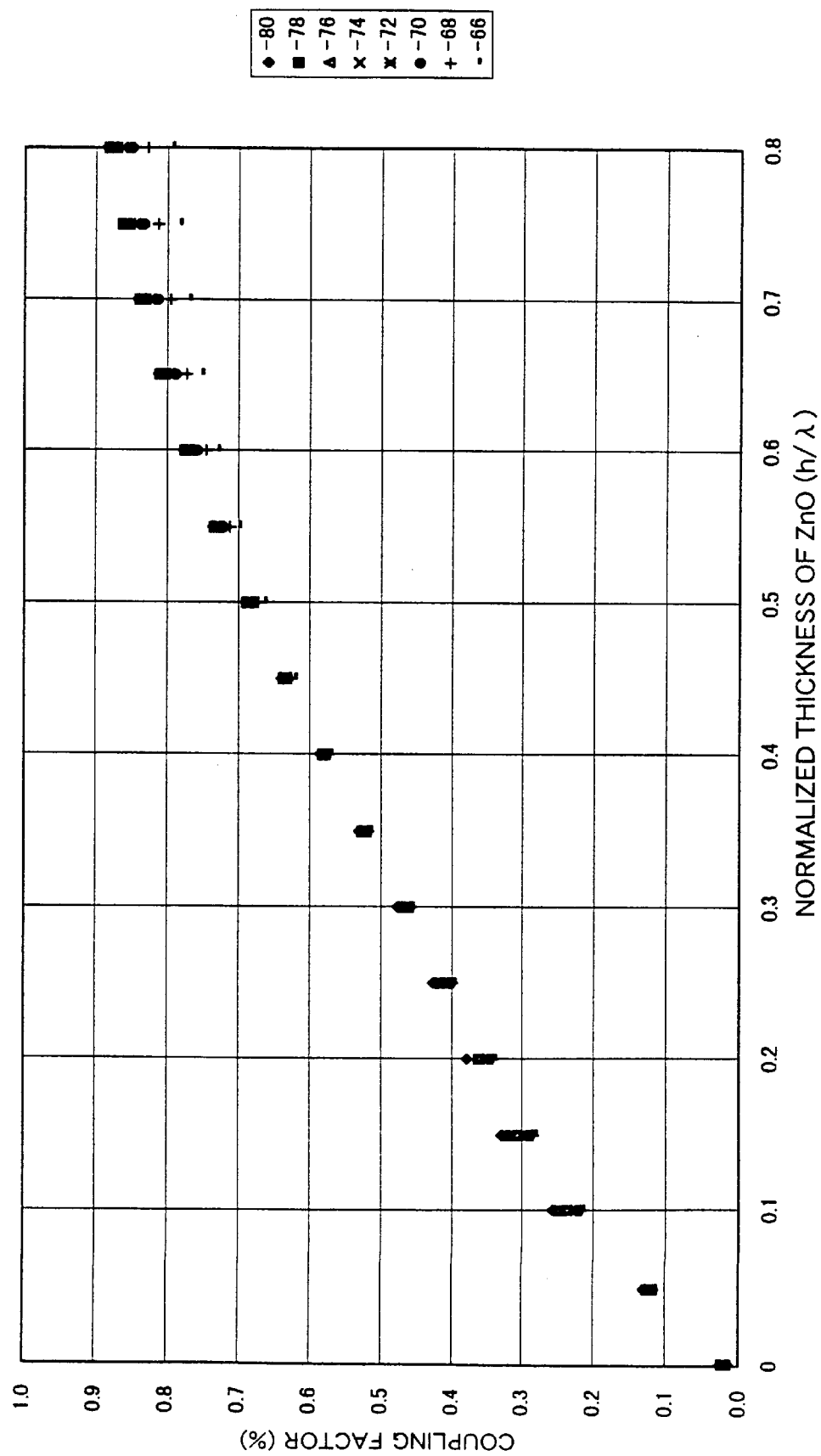
FIG. 28 is a graph illustrative of electromechanical coupling factor $k^2$ changes for a surface acoustic wave device comprising a langasite single crystal substrate making use of area II-1, and a ZnO film and an interdigital electrode formed on the surface thereof, when the normalized thickness h/λ of the ZnO film and ψ for defining the propagation direction of a surface acoustic wave are varied.

From FIG. 27, on the one hand, it is seen that, at area II-1, the zero temperature property is obtained and the thickness of the ZnO film at which the zero temperature property is obtained varies depending on the propagation direction of surface acoustic waves. From FIG. 28, on the other hand, it is seen that as the ZnO film becomes thick, the electromechanical coupling factor tends to become large. Therefore, if the thickness of the ZnO film is determined in such a manner that a large-enough electromechanical coupling factor is obtained and if, at this time, the propagation direction is selected in such a manner that the zero temperature property is obtained, it is then possible to achieve a surface acoustic wave device having the zero temperature property and a large electromechanical coupling factor. If, for instance, the propagation direction ψ is −70° and the normalized thickness, h/λ, of ZnO is 0.35, it is then possible to achieve a small size yet broad passband surface acoustic wave device having excellent temperature properties because TCV is substantially reduced to zero and a very large $k^2$ of 0.51% is obtained.

Example 2-3

(Embodiment 2)

Surface acoustic wave devices were fabricated as in example 2-1 with the exception that φ and θ were 0° and 90°, respectively and ψ to determine the x-axis or the propagation direction of surface acoustic waves was varied at intervals of 2° between 66° and 80°. It is to be noted that these values for φ, θ and ψ0 were included in area II-10. For these devices, the TCV vs. h/λ (normalized thickness) relations were examined. The results are plotted in FIG. 29. Also, the $k^2$ vs. h/λ relations were examined. The results are plotted in FIG. 30.

Figure 29:
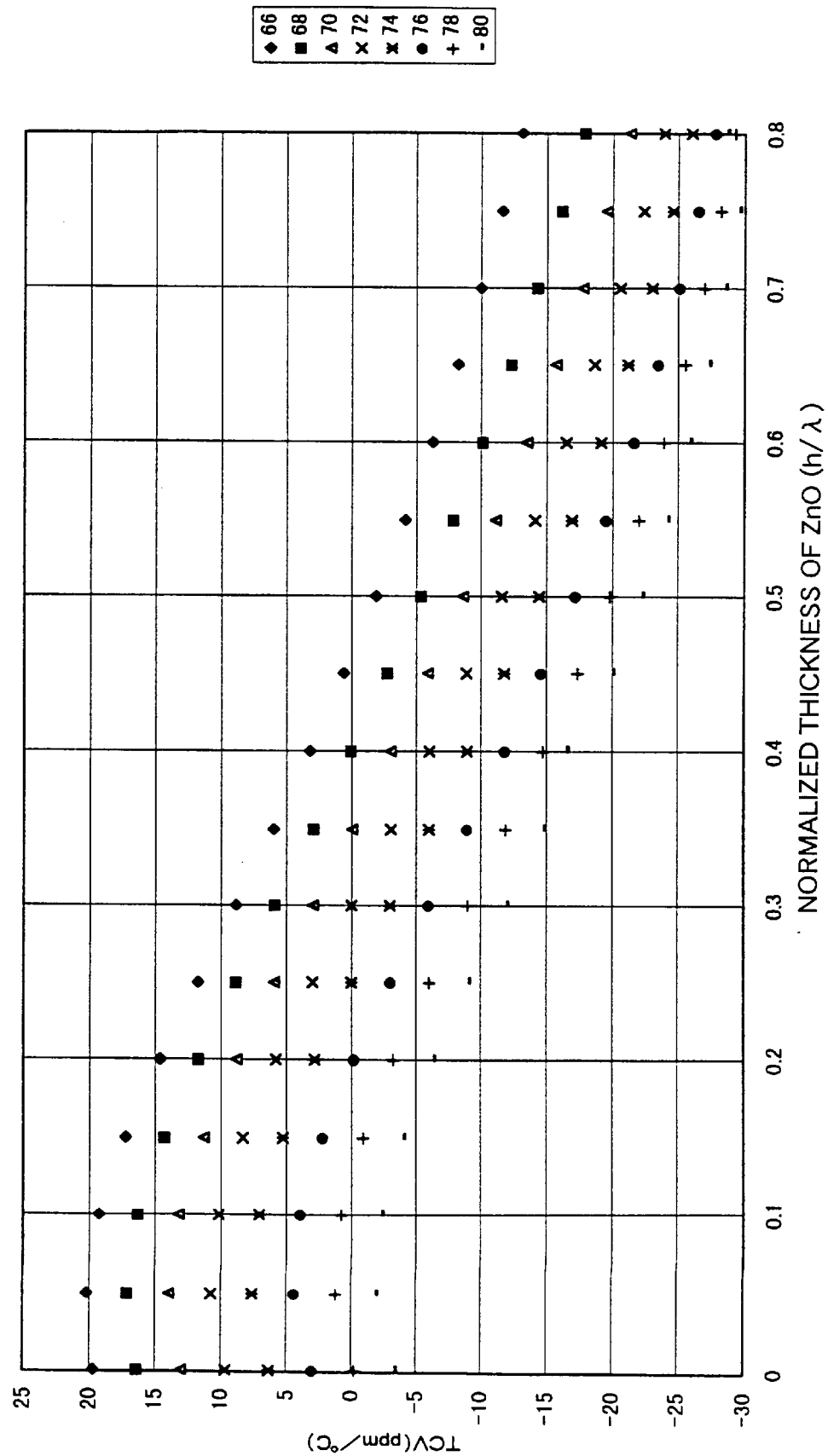
FIG. 29 is a graph illustrative of TCV (a temperature coefficient of SAW velocity) changes for a surface acoustic wave device comprising a langasite single crystal substrate making use of area II-10, and a ZnO film and an interdigital electrode formed on the surface thereof, when the normalized thickness h/λ of the ZnO film and ψ for defining the propagation direction of a surface acoustic wave are varied.
Figure 30:
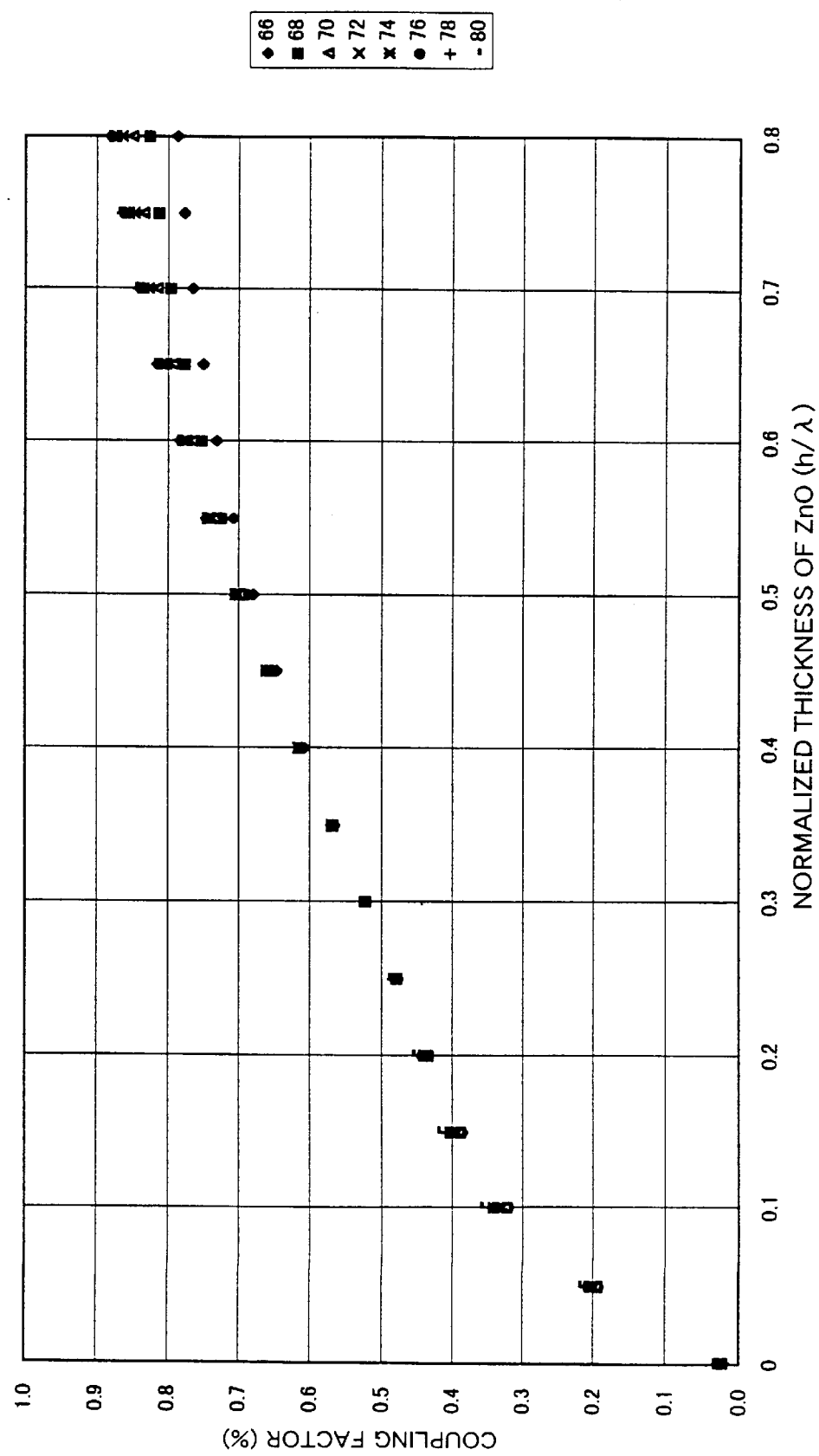
FIG. 30 is a graph illustrative of electromechanical coupling factor $k^2$ changes for a surface acoustic wave device comprising a langasite single crystal substrate making use of area II-10, and a ZnO film and an interdigital electrode formed on the surface thereof, when the normalized thickness h/λ of the ZnO film and ψ for defining the propagation direction of a surface acoustic wave are varied.

From FIG. 29, on the one hand, it is seen that, at area II-10, the zero temperature property can be obtained and the thickness of the ZnO film at which the zero temperature property is obtained varies depending on the propagation direction of surface acoustic waves. From FIG. 30, on the other hand, it is seen that as the ZnO film becomes thick, the electromechanical coupling factor tends to become large. Therefore, if the thickness of the ZnO film is determined in such a manner that a large-enough electromechanical coupling factor is obtained and if, at this time, the propagation direction is selected in such a manner that the zero temperature property is obtained, it is then possible to achieve a surface acoustic wave device having the zero temperature property and a large electromechanical coupling factor. If, for instance, the propagation direction ψ is 70° and the normalized thickness, h/λ, of ZnO is 0.35, it is then possible to achieve a small size yet broad passband surface acoustic wave device having excellent temperature properties because TCV is substantially reduced to zero and a very large $k^2$ of 0.56% is obtained.

Example 3-1

(Embodiment 3)

A langasite single crystal was grown by the CZ process, and a 0.35 mm thick substrate was cut out of this single crystal. A surface acoustic wave transducer comprising a set of an input side interdigital electrode and an output side interdigital electrode was formed on the surface of the substrate, and a ZnO film was formed thereon by means of a magnetron sputtering process. Then, an opposite electrode film was formed on the ZnO film to fabricate a surface acoustic wave device. The interdigital electrodes and opposite electrode films were formed of Al by evaporation. The interdigital electrodes, each being a normal type electrode of the same shape, had a thickness of 0.1 μm, an electrode finger width d of 15 μm and an electrode pitch (4 d=λ) of 60 μm), with the number of electrode fingers pairs being 40 and the aperture width of electrode fingers being 60λ (=3.6 mm). However, when output signals were faint, interdigital electrodes with only the aperture width changed to 100λ were used in place of the aforesaid interdigital electrodes. In addition, when the normalized thickness, h/λ, of the ZnO film exceeded 0.4, the electrode pitch was halved to 30 μm, and the aperture width was correspondingly halved to 1.8 mm (=60w). The opposite electrode film had a thickness of 0.1 μm.

The surface acoustic wave device according to embodiment 3, because of having the structure wherein the interdigital electrodes oppose to the opposite electrode film with the ZnO film interleaved between them, is unlikely to operate as the thickness of the ZnO film is close to zero. This is because short-circuiting occurs between the interdigital electrodes and the opposite electrode film. In the instant example, therefore, the minimum value for the normalized thickness, h/λ, of the ZnO film was preset at 0.005. For a device having a normalized thickness of 0.005, use was made of interdigital electrodes having a thickness of 0.1 μm, an electrode pitch (=λ) of 320 μm, 20 electrode finger pairs, and a aperture width of 5 mm, an opposite electrode film having a thickness of 0.07 μm, and a substrate having a thickness of 1 mm.

In the instant example, φ and θ were 0° and 90° when the cut angle of the substrate in this device out of the langasite single crystal and the propagation direction of surface acoustic waves thereon were expressed in terms of Euler angles (φ, θ and ψ). For ψ to determine the x-axis or the propagation direction of surface acoustic waves, the values shown in FIGS. 32A to 41C were selected from within the general area III. The thickness, h, of the ZnO film on the substrate was selected in such a way that the aforesaid normalized thickness, h/λ, was between 0.005 and 0.8. Changes in the SAW velocity, electromechanical coupling factor $k^2$, and temperature coefficient of SAW velocity, TCV, were examined at varied h/λ's in each propagation direction. In this regard, it is to be noted that the value of λ varies depending on the value of h/λ. The SAW velocity was found from the center frequency of the filter, and the electromechanical coupling factor $k^2$ was determined from a two-terminal admittance measured of the surface acoustic wave transducer, using a well-known Smith's equivalent circuit model. The results of the SAW velocity, $k^2$, and TCV measured in each propagation direction are plotted in FIGS. 32A to 41C.

As the normalized thickness, h/α, of the ZnO film increased, the surface acoustic wave mode vanished, resulting in the generation of bulk waves. For this reason, data obtained after the generation of bulk waves are not plotted at all.

The graphs showing the SAW velocity, and k2 changes indicate that if the cut angle of the substrate from the crystal and the propagation direction of surface acoustic waves lie in the general area III, the SAW velocity can then be reduced to 2,900 m/s or lower. This is more favorable for achieving a size reduction of a surface acoustic wave device, as compared with a conventional ST quartz crystal. It is also found that within the general area III an electro-mechanical coupling factor of 0.1% or greater can be obtained. It is thus possible to obtain a much greater electromechanical coupling factor by a selection of the thickness of the ZnO film.

Referring further to the graphs showing the TCV changes, when the substrate per se has a positive TCV, in other words, when TCV is positive upon the normalized thickness, h/λ, being close to 0, it is found that TCV is shifted from a positive to a negative direction with an h/λ increase; improvements are made in the temperature properties. When the substrate itself has a negative TCV, on the other hand, TCV is greatly shifted to a negative side due to the provision of the ZnO film and an increase in its normalized thickness. Even in this case, the absolute value of TCV is not so great (of the order of 35 ppm/° C. or lower); it is found that the substrate can be much more improved in terms of temperature stability over a conventional BGO substrate.

In what follows, each area will be explained at great length.

A device making use of area III-1 can have electromechanical coupling factor peaks at h/λ=0.05 and h/λ=0.65, as can be seen from FIG. 32B. At h/λ=0.05 an electromechanical coupling factor of 0.22% is obtained, and at h/λ=0.65 a very great electromechanical coupling factor of 0.71% is obtained. At this time, TCV=−3 ppm/° C. in the former case and TCV=−27 ppm/° C. in the latter case, as can be seen from FIG. 32C; good-enough temperature properties are obtained.

A device making use of area III-2 can have electromechanical coupling factor peaks at h/λ=0.05 and h/λ=0.6, as can be seen from FIG. 33B. At h/λ=0.05 an electromechanical coupling factor of 0.2% is obtained, and at h/λ=0.6 a great electromechanical coupling factor of 0.3% is obtained. At this time, TCV=29 ppm/° C. in the former case and TCV=5 ppm/° C. in the latter case, as can be seen from FIG. 33C; good-enough temperature properties are obtained.

A device making use of area III-3 can have electromechanical coupling factor peaks at h/λ=0.05 and h/λ=0.45, as can be seen from FIG. 34B. At h/λ=0.05 an electromechanical coupling factor of 0.29% is obtained, and at h/λ=0.45 a great electromechanical coupling factor of 0.12% is obtained. At this time, TCV=40 ppm/° C. in the former case and TCV=31 ppm/° C. in the latter case, as can be seen from FIG. 34C; good-enough temperature properties are obtained.

A device making use of area III-4 can have electromechanical coupling factor peaks at h/λ=0.05 and h/λ=0.45, as can be seen from FIG. 35B. At h/λ=0.05 an electromechanical coupling factor of 0.37% is obtained, and at h/λ=0.45 a great electromechanical coupling factor of 0.2% is obtained. At this time, TCV=32 ppm/° C. in the former case and TCV=15 ppm/° C. in the latter case, as can be seen from FIG. 35C; good-enough temperature properties are obtained.

A device making use of area III-5 can have electromechanical coupling factor peaks at h/λ=0.05 and h/λ=0.4, as can be seen from FIG. 36B. At h/λ=0.05 an electromechanical coupling factor of 0.36% is obtained, and at h/λ 0.4 a great electromechanical coupling factor of 0.2% is obtained. At this time, TCV=27 ppm/° C. in the former case and TCV=14 ppm/° C. in the latter case, as can be seen from FIG. 36C; good-enough temperature properties are obtained.

A device making use of area III-6 can have electromechanical coupling factor peaks at h/λ=0.05 and h/λ=0.4, as can be seen from FIG. 37B. At h/λ=0.05 an electromechanical coupling factor of 0.29% is obtained, and at h/λ=0.4 a great electromechanical coupling factor of 0.5% is obtained. At this time, TCV=25 ppm/° C. in the former case and TCV=16 ppm/° C. in the latter case, as can be seen from FIG. 37C; good-enough temperature properties are obtained.

A device making use of area III-7 can have electromechanical coupling factor peaks at h/λ=0.05 and h/λ=0.45, as can be seen from FIG. 38B. At h/λ=0.05 an electromechanical coupling factor of 0.24% is obtained, and at h/λ=0.45 a very great electromechanical coupling factor of 0.65% is obtained. At this time, TCV=31 ppm/° C. in the former case and TCV=18 ppm/° C. in the latter case, as can be seen from FIG. 38C; good-enough temperature properties are obtained.

Figure 39A:
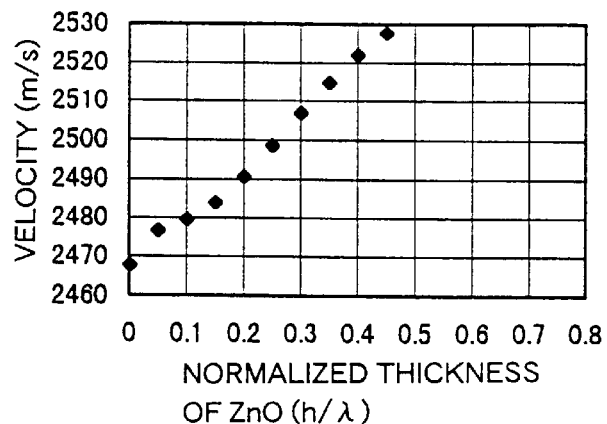
FIGS. 39A, 39B, and 39C are generally illustrative of varying normalized thickness h/λ of ZnO film vs. characteristic change relations for a surface acoustic wave device comprising a langasite single crystal substrate making use of area III-8, and an interdigital electrode, a ZnO film and an opposite electrode film formed on the surface thereof in this order, and are a graph for SAW velocity changes, a graph for electromechanical coupling factor $k^2$ changes, and a graph for TCV (a temperature coefficient of SAW velocity) changes, respectively.
Figure 39B:
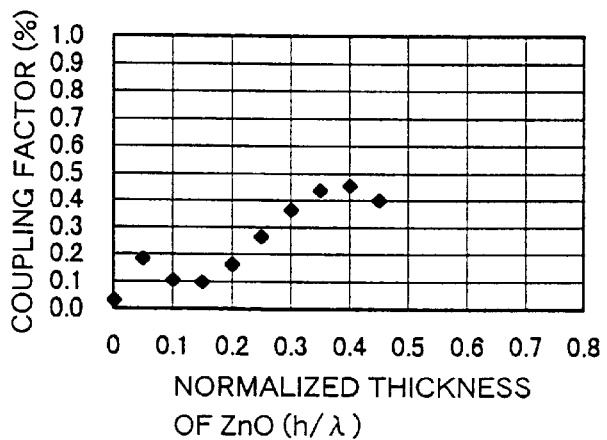
Figure 39C:
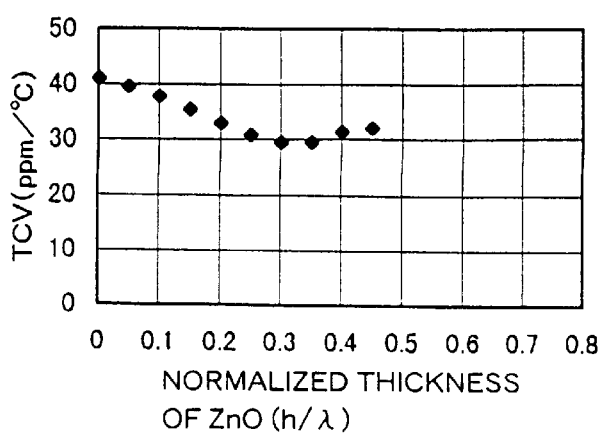
Figure 40:
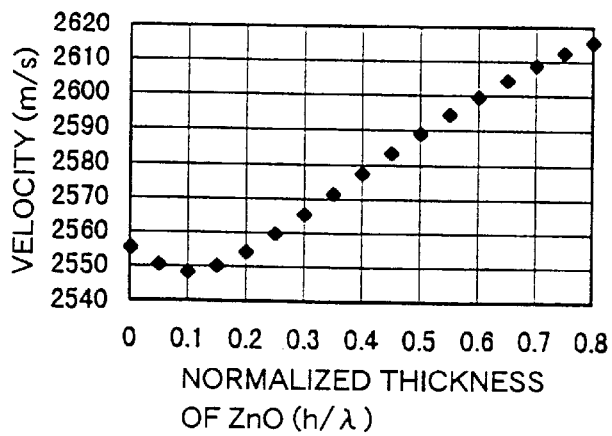
FIGS. 40A, 40B, and 40C are generally illustrative of varying normalized thickness h/λ of ZnO film vs. characteristic change relations for a surface acoustic wave device comprising a langasite single crystal substrate making use of area III-9, and an interdigital electrode, a ZnO film and an opposite electrode film formed on the surface thereof in this order, and are a graph for SAW velocity changes, a graph for electromechanical coupling factor $k^2$ changes, and a graph for TCV (a temperature coefficient of SAW velocity) changes, respectively.
Figure 40:
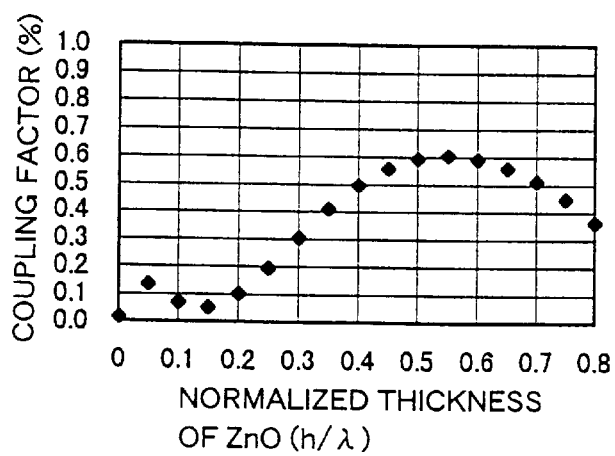
Figure 40:
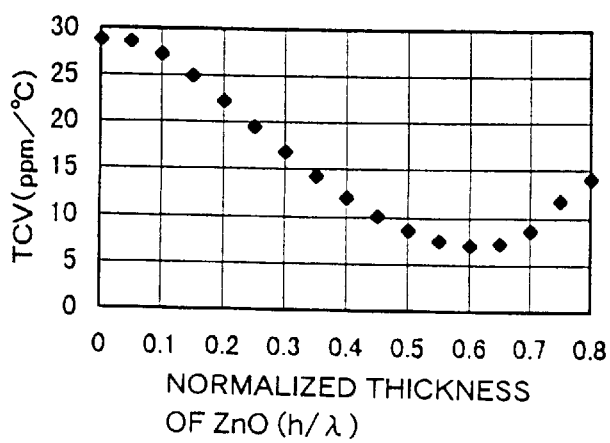
Figure 41:
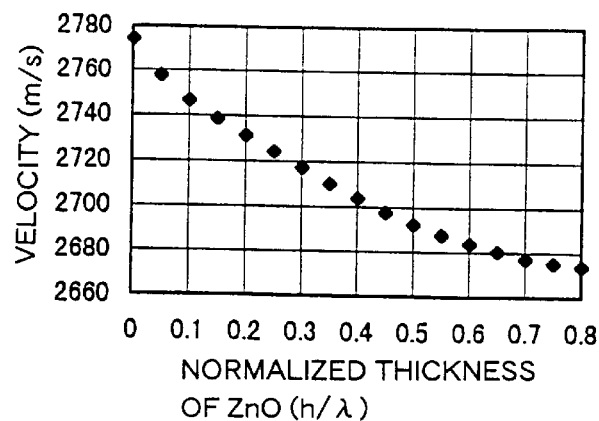
FIGS. 41A, 41B, and 41C are generally illustrative of varying normalized thickness h/λ of ZnO film vs. characteristic change relations for a surface acoustic wave device comprising a langasite single crystal substrate making use of area III-10, and an interdigital electrode, a ZnO film and an opposite electrode film formed on the surface thereof in this order, and are a graph for SAW velocity changes, a graph for electromechanical coupling factor $k^2$ changes, and a graph for TCV (a temperature coefficient of SAW velocity) changes, respectively.
Figure 41:
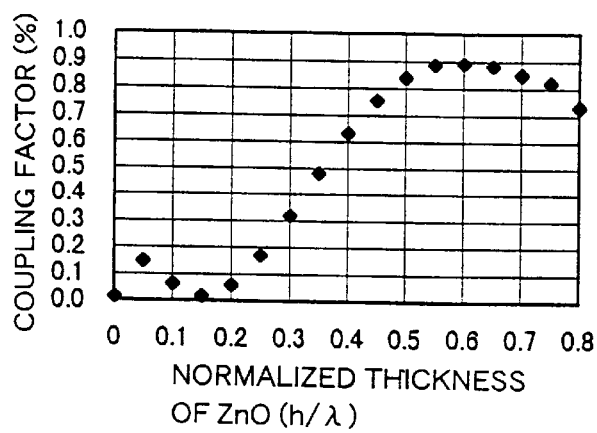
Figure 41:
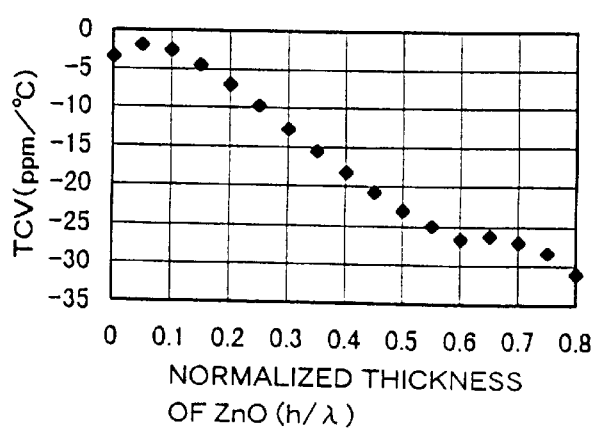

A device making use of area III-8 can have electromechanical coupling factor peaks at h/λ=0.05 and h/λ=0.4, as can be seen from FIG. 39B. At h/λ=0.05 an electromechanical coupling factor of 0.18% is obtained, and at h/λ=0.4 a great electromechanical coupling factor of 0.45% is obtained. At this time, TCV=39 ppm/° C. in the former case and TCV=31 ppm/° C. in the latter case, as can be seen from FIG. 39C; good-enough temperature properties are obtained.

A device making use of area III-9 can have electromechanical coupling factor peaks at h/λ=0.05 and h/λ=0.55, as can be seen from FIG. 40B. At h/λ=0.05 an electromechanical coupling factor of 0.13% is obtained, and at h/λ=0.55 a great electromechanical coupling factor of 0.6% is obtained. At this time, TCV=29 ppm/° C. in the former case and TCV=7 ppm/° C. in the latter case, as can be seen from FIG. 40C; good-enough temperature properties are obtained.

A device making use of area III-10 can have electromechanical coupling factor peaks at h/λ=0.05 and h/λ=0.6, as can be seen from FIG. 41B. At h/λ=0.05 an electromechanical coupling factor of 0.14% is obtained, and at h/λ=0.6 a great electromechanical coupling factor of 0.89% is obtained. At this time, TCV=−2 ppm/° C. in the former case and TCV=−27 ppm/° C. in the latter case, as can be seen from FIG. 41C; good-enough temperature properties are obtained.

Example 3-2
(Embodiment 3)

Surface acoustic wave devices were fabricated as in example 3-1 with the exception that φ and θ were 0° and 90°, respectively, and ψ to determine the x-axis or the propagation direction of surface acoustic waves was varied at intervals of 2° between −80° and −66°. It is to be noted that these values for φ, θ and ψ were included in area III-1. For these devices, the TCV vs. h/λ (normalized thickness) relations were examined. The results are plotted in FIG. 42. Also, the $k^2$ vs. h/λ relations were examined. The results are plotted in FIG. 43.

Figure 42:
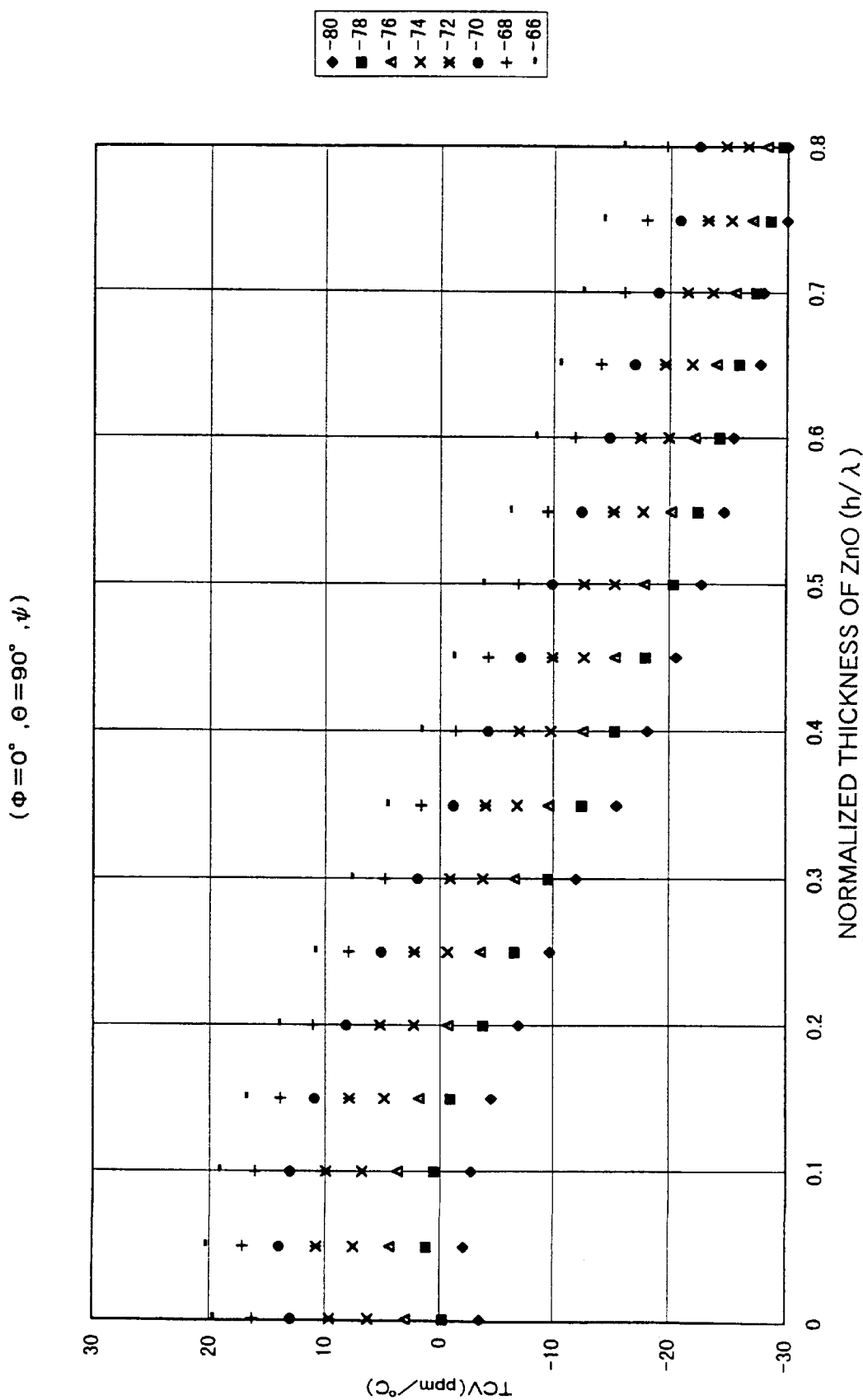
FIG. 42 is a graph illustrative of TCV (a temperature coefficient of SAW velocity) changes for a surface acoustic wave device comprising a langasite single crystal substrate making use of area III-1, and an interdigital electrode, a ZnO and an opposite electrode film formed on the surface thereof in this order, when the normalized thickness h/λ of the ZnO film and ψ for defining the propagation direction of a surface acoustic wave are varied.
Figure 43:
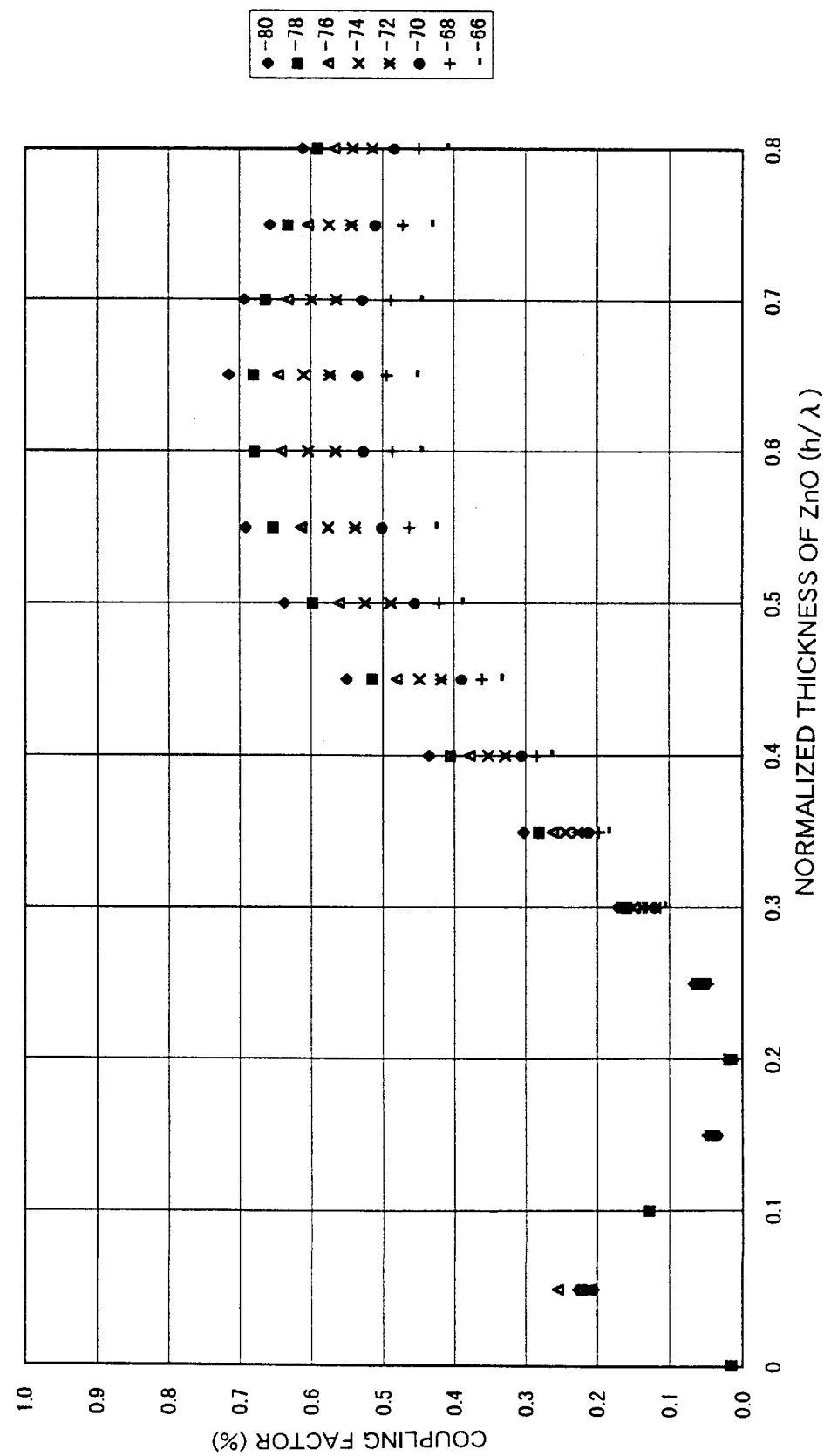
FIG. 43 is a graph illustrative of electromechanical coupling factor $k^2$ changes for a surface acoustic wave device comprising a langasite single crystal substrate making use of area III-1, and an interdigital electrode, a ZnO film and an opposite electrode film formed on the surface thereof, when the normalized thickness h/λ of the ZnO film and ψ for defining the propagation direction of a surface acoustic wave are varied.

From FIG. 42, on the one hand, it is seen that, at area III-1, the zero temperature property can be obtained and the thickness of the ZnO film at which the zero temperature property is obtained varies depending on the propagation direction of surface acoustic waves. From FIG. 43, on the other hand, it is seen that as the electromechanical coupling factor has two peaks, and that as the ZnO film becomes thicker, the peak becomes larger. Therefore, if the thickness of the ZnO film is determined in such a manner that a large-enough electromechanical coupling factor is obtained and if, at this time, the propagation direction is selected in such a manner that the zero temperature property is obtained, it is then possible to achieve a surface acoustic wave device having the zero temperature property and a large electromechanical coupling factor. If, for instance, the propagation direction ψ is −78° and the normalized thickness, h/λ, of ZnO is 0.05, it is then possible to achieve a small size yet broad passband surface acoustic wave device having excellent temperature properties because TCV is substantially reduced to zero and a practical-enough $k^2$ of 0.21% is obtained.

Example 3-3
(Embodiment 3)

Surface acoustic wave devices were fabricated as in example 3-1 with the exception that φ and θ were 0° and 90°, respectively, and ψ to determine the x-axis or the propagation direction of surface acoustic waves was varied at intervals of 2° between 66° and 80°. It is to be noted that these values for φ, θ and ψ were included in area I11-10. For these devices, the TCV vs. h/λ (normalized thickness) relations were examined. The results are plotted in FIG. 44. Also, the $k^2$ vs. h/λ relations were examined. The results are plotted in FIG. 45.

Figure 44:
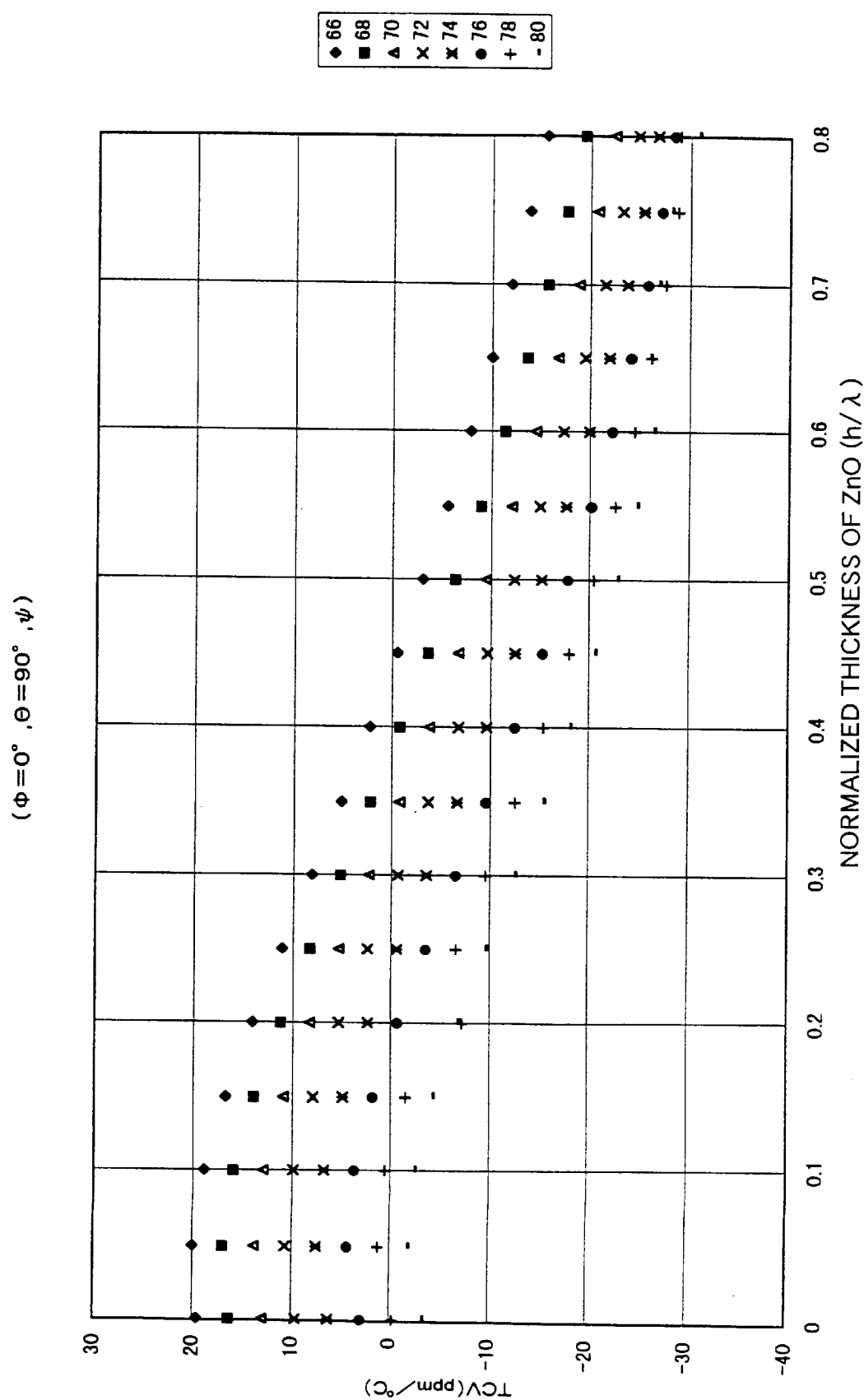
FIG. 44 is a graph illustrative of TCV (a temperature coefficient of SAW velocity) changes for a surface acoustic wave device comprising a langasite single crystal substrate making use of area III-10, and an interdigital electrode, a ZnO and an opposite electrode film formed on the surface thereof in this order, when the normalized thickness h/λ of the ZnO film and ψ for defining the propagation direction of a surface acoustic wave are varied.
Figure 45:
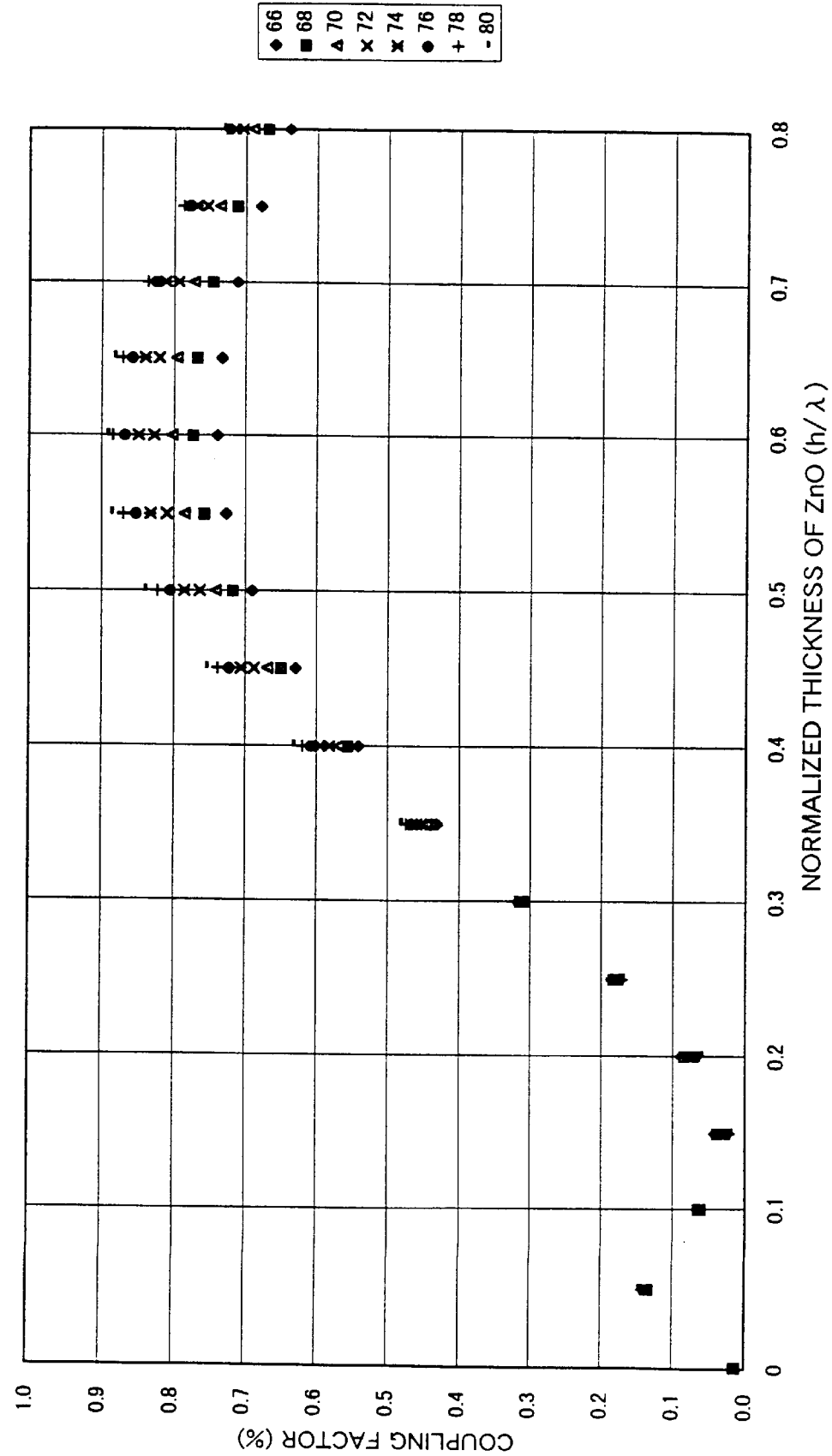
FIG. 45 is a graph illustrative of electromechanical coupling factor $k^2$ changes for a surface acoustic wave device comprising a langasite single crystal substrate making use of area III-10, and an interdigial electrode, a ZnO film and an opposite electrode film formed on the surface thereof in this order, when the normalized thickness h/λ of the ZnO film and ψ for defining the propagation direction of a surface acoustic wave are varied.

From FIG. 44, on the one hand, it is seen that, at area III-10, the zero temperature property can be obtained and the thickness of the ZnO film at which the zero temperature property is obtained varies depending on the propagation direction of surface acoustic waves. From FIG. 45, on the other hand, it is seen that as the ZnO film becomes thick, the electromechanical coupling factor tends to become large. Therefore, if the thickness of the ZnO film is determined in such a manner that a large-enough electromechanical coupling factor is obtained and if, at this time, the propagation direction is selected in such a manner that the zero temperature property is obtained, it is then possible to achieve a surface acoustic wave device having the zero temperature property and a large electromechanical coupling factor. If, for instance, the propagation direction ψ is 70° and the normalized thickness, h/λ, of ZnO is 0.35, it is then possible to achieve a small size yet broad passband surface acoustic wave device having excellent temperature properties because TCV is substantially reduced to zero and a large $k^2$ of 0.44% is obtained.

Example 4-1

(Embodiment 4)

A langasite single crystal was grown by the CZ process, and a 0.35 mm thick substrate was cut out of this single crystal. An opposite electrode film was formed on the surface of the substrate. Then, a ZnO film was formed on the surface of the opposite electrode film by a magnetron sputtering process, and a surface acoustic wave transducer comprising a set of an input side interdigital electrode and an output side interdigital electrode was finally formed on the surface of the ZnO film to fabricate a surface acoustic wave device. The interdigital electrodes and opposite electrode film were formed by the evaporation of Al. The interdigital electrodes, each being a normal type electrode of the same shape, had a thickness of 0.1 μm, an electrode finger width d of 15 μm and an electrode pitch (=4 d=λ) of 60 μm, with the number of electrode finger pairs being 40 and the aperture width of electrode fingers being 60λ (=3.6 mm). However, when output signals were faint, interdigital electrodes with only the aperture width changed to 100λ were used in place of the aforesaid interdigital electrodes. In addition, when the normalized thickness, h/λ, of the ZnO film exceeded 0.4, the electrode pitch (=λ) was halved to 30 μm, and the aperture width was correspondingly halved to 1.8 mm (=60λ).

The surface acoustic wave device according to embodiment 4, because of having the structure wherein the interdigital electrodes oppose to the opposite electrode film with the ZnO film interleaved between them, is unlikely to operate as the thickness of the ZnO film is close to zero. This is because short-circuiting occurs between the interdigital electrodes and the opposite electrode film. In the instant example, therefore, the minimum value for the normalized thickness, h/λ, of the ZnO film was preset at 0.005. For a device having a normalized thickness of 0.005, use was made of interdigital electrodes having a thickness of 0.1 λm, an electrode pitch of 320 μm, 20 electrode finger pairs, and a aperture width of 5 mm, an opposite electrode film having a thickness of 0.07 μm, and a substrate having a thickness of 1 mm.

In the instant example, φ and θ were 0° and 90° when the cut angle of the substrate in this device out of the langasite single crystal and the propagation direction of surface acoustic waves thereon were expressed in terms of Euler angles (φ, θ and ψ). For ψ to determine the x-axis or the propagation direction of surface acoustic waves, the values shown in FIGS. 47A to 56C were selected from within the general area IV. The thickness, h, of the ZnO film on the substrate was selected in such a way that the aforesaid normalized thickness, h/λ, was between 0.05 and 0.8. Changes in the SAW velocity, electromechanical coupling factor $k^2$, and temperature coefficient of SAW velocity, TCV, were examined at varied h/λ's in each propagation direction. In this regard, it is to be noted that the value of x varies depending on the value of h/λ, as already described. The SAW velocity was found from the center frequency of the filter, and the electromechanical coupling factor $k^2$ was determined from a two-terminal admittance measured of the surface acoustic wave transducer, using a well-known Smith's equivalent circuit model. The results of the SAW velocity, $k^2$, and TCV measured in each propagation direction are plotted in FIGS. 47A to 56C.

As the normalized thickness, h/λ, of the ZnO film increased, the surface acoustic wave mode vanished, resulting in the generation of bulk waves. For this reason, data obtained after the generation of bulk waves are not plotted at all.

The graphs showing the SAW velocity, and $k^2$ changes indicate that if the cut angle of the substrate from the crystal and the propagation direction of surface acoustic waves lie in the general area IV, the SAW velocity can then be reduced to 2,900 m/s or lower. This is more favorable for achieving a size reduction of a surface acoustic wave device, as compared with a conventional ST quartz crystal. It is also found that within the general area IV an electromechanical coupling factor of 0.1% or greater can be obtained. It is thus possible to obtain a much greater electromechanical coupling factor by a selection of the thickness of the ZnO.

Referring further to the graphs showing the TCV changes, when the substrate per se has a positive TCV, in other words, when TCV is positive upon the normalized thickness, h/λ, being close to 0, it is found that TCV is shifted from a positive to a negative direction with an h/λ increase; improvements are made in the temperature properties. When the substrate itself has a negative TCV, on the other hand, TCV is greatly shifted to a negative side due to the provision of the ZnO film and an increase in its normalized thickness. Even in this case, the absolute value of TCV is not so great (of the order of 35 ppm/° C. or lower); it is found that the substrate can be much more improved in terms of temperature stability over a conventional BGO substrate.

In what follows, each area will be explained at great length.

Figure 47A:
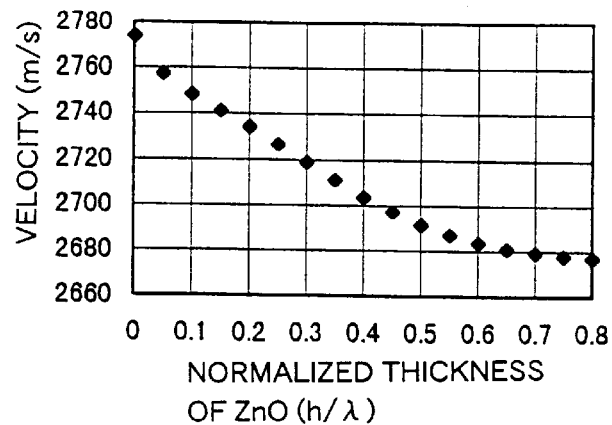
FIGS. 47A, 47B, and 47C are generally illustrative of varying normalized thickness h/λ of ZnO film vs. characteristic change relations for a surface acoustic wave device comprising a langasite single crystal substrate making use of area IV-1, and an opposite electrode film, a ZnO film and an interdigital electrode formed on the surface thereof in this order, and are a graph for SAW velocity changes, a graph for electromechanical coupling factor $k^2$ changes, and a graph for TCV (a temperature coefficient of SAW velocity) changes, respectively.
Figure 47B:
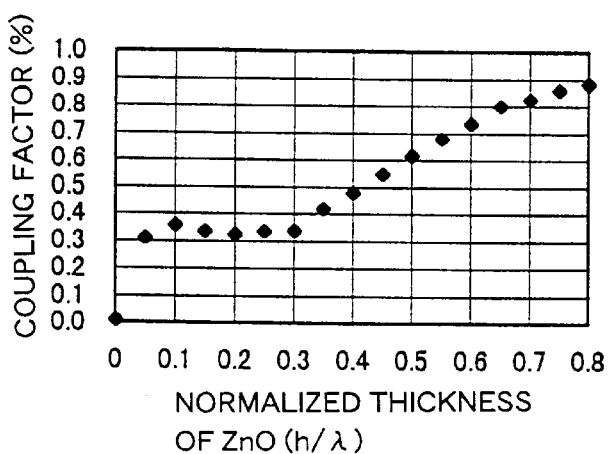
Figure 47C:
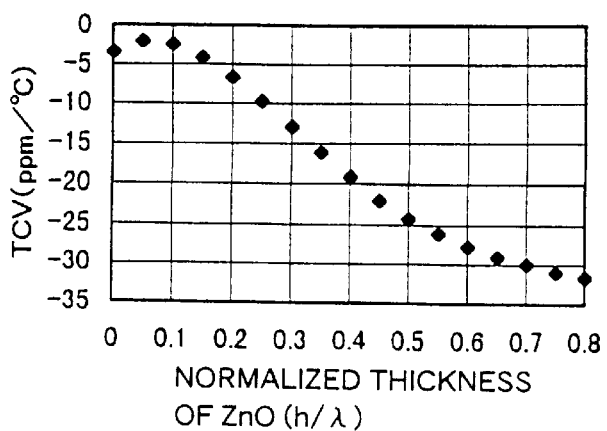
Figure 48:
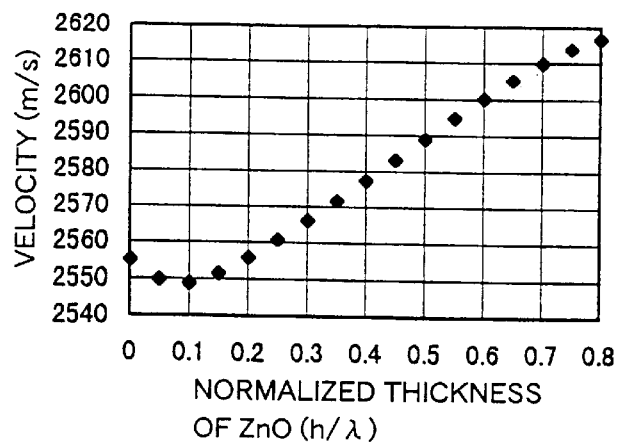
FIGS. 48A, 48B, and 48C are generally illustrative of varying normalized thickness h/λ of ZnO film vs. characteristic change relations for a surface acoustic wave device comprising a langasite single crystal substrate making use of area IV-2, and an opposite electrode film, a ZnO film and an interdigital electrode formed on the surface thereof in this order, and are a graph for SAW velocity changes, a graph for electromechanical coupling factor $k^2$ changes, and a graph for TCV (a temperature coefficient of SAW velocity) changes, respectively.
Figure 48:
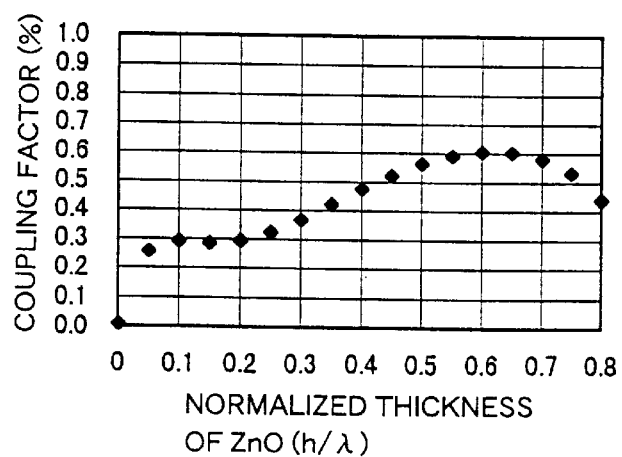
Figure 48:
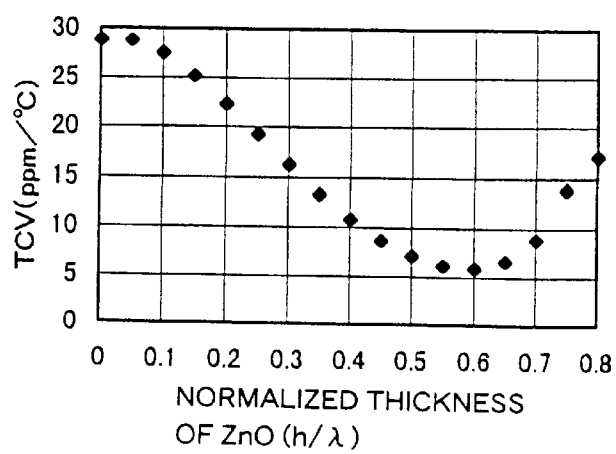
Figure 49:
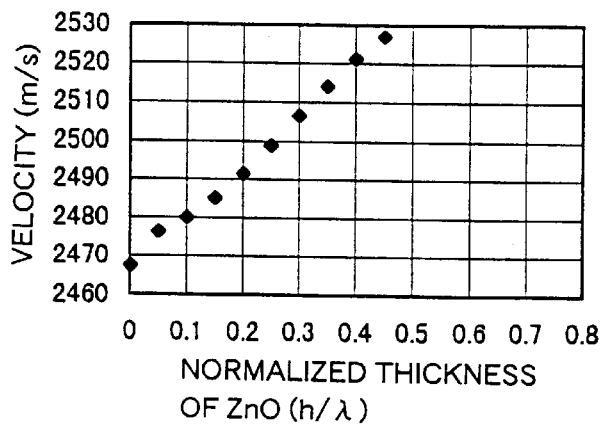
FIGS. 49A, 49B, and 49C are generally illustrative of varying normalized thickness h/λ of ZnO film vs. characteristic change relations for a surface acoustic wave device comprising a langasite single crystal substrate making use of area IV-3, and an opposite electrode film, a ZnO film and an interdigital electrode formed on the surface thereof in this order, and are a graph for SAW velocity changes, a graph for electromechanical coupling factor k2 changes, and a graph for TCV (a temperature coefficient of SAW velocity) changes, respectively.
Figure 49:
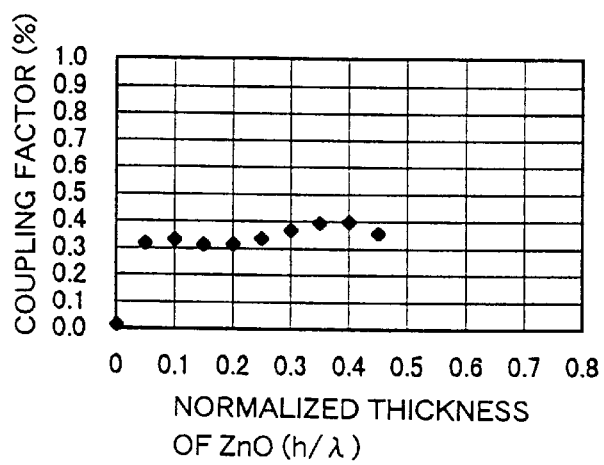
Figure 49:
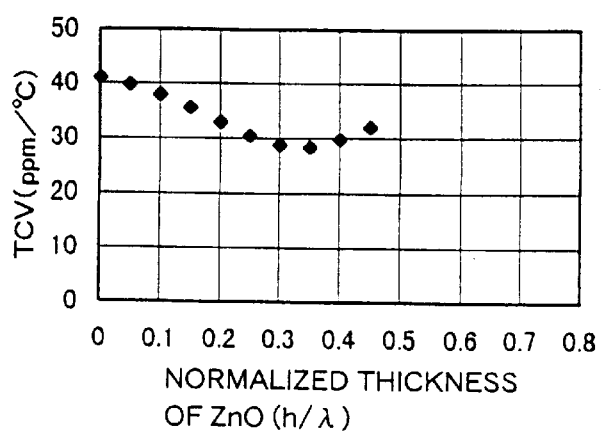
Figure 50:
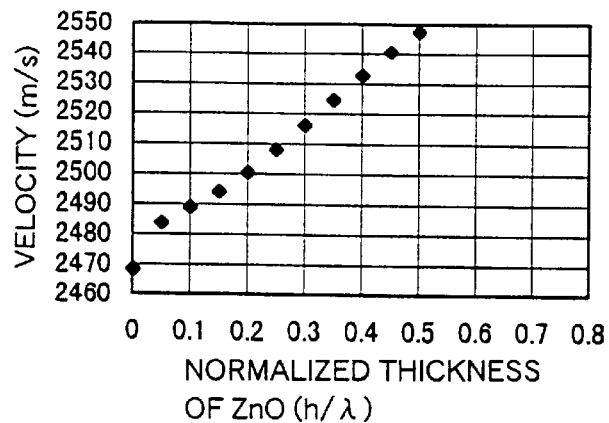
FIGS. 50A, 50B, and 50C are generally illustrative of varying normalized thickness h/λ of ZnO film vs. characteristic change relations for a surface acoustic wave device comprising a langasite single crystal substrate making use of area IV-4, and an opposite electrode film, a ZnO film and an interdigital electrode formed on the surface thereof in this order, and are a graph for SAW velocity changes, a graph for electromechanical coupling factor $k^2$ changes, and a graph for TCV (a temperature coefficient of SAW velocity) changes, respectively.
Figure 50:
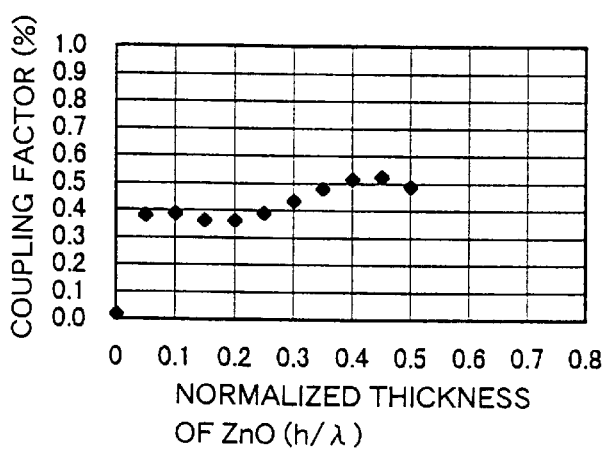
Figure 50:
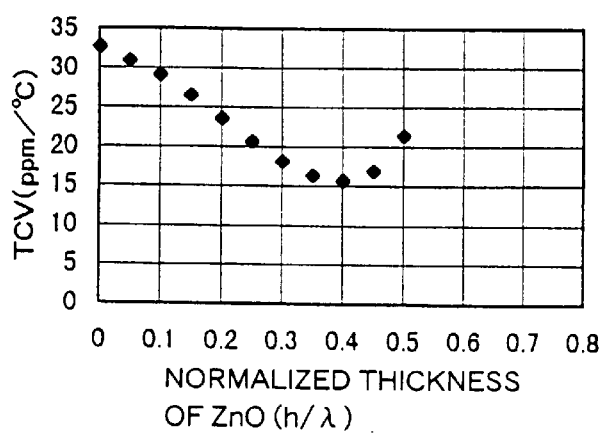
Figure 51:
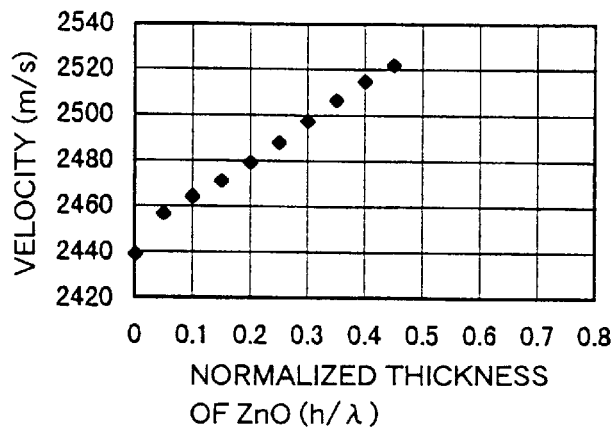
FIGS. 51A, 51B, and 51C are generally illustrative of varying normalized thickness h/λ of ZnO film vs. characteristic change relations for a surface acoustic wave device comprising a langasite single crystal substrate making use of area IV-5, and an opposite electrode film, a ZnO film and an interdigital electrode formed on the surface thereof in this order, and are a graph for SAW velocity changes, a graph for electromechanical coupling factor $k^2$ changes, and a graph for TCV (a temperature coefficient of SAW velocity) changes, respectively.
Figure 51:
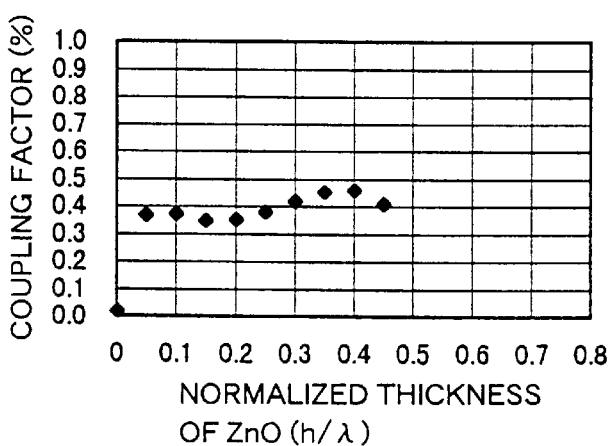
Figure 51:
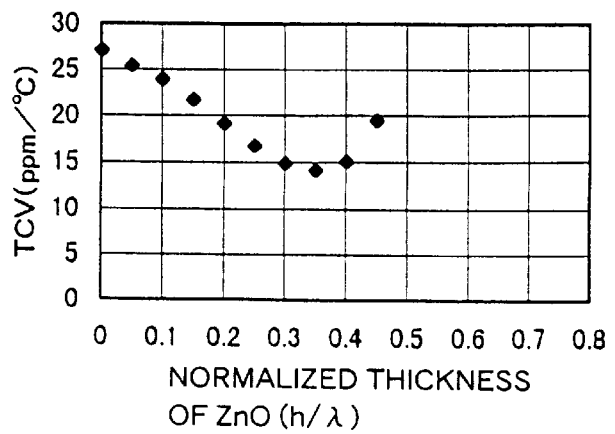
Figure 52:
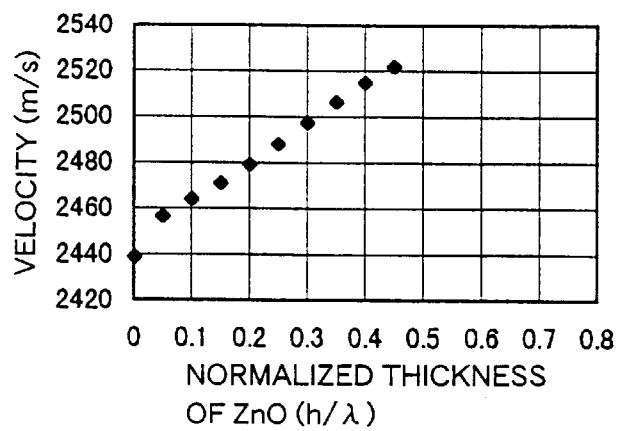
FIGS. 52A, 52B, and 52C are generally illustrative of varying normalized thickness h/λ of ZnO film vs. characteristic change relations for a surface acoustic wave device comprising a langasite single crystal substrate making use of area IV-6, and an opposite electrode film, a ZnO film and an interdigital electrode formed on the surface thereof in this order, and are a graph for SAW velocity changes, a graph for electromechanical coupling factor $k^2$ changes, and a graph for TCV (a temperature coefficient of SAW velocity) changes, respectively.
Figure 52:
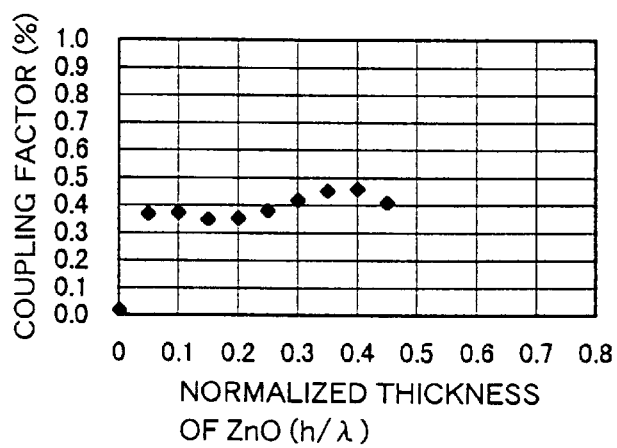
Figure 52:
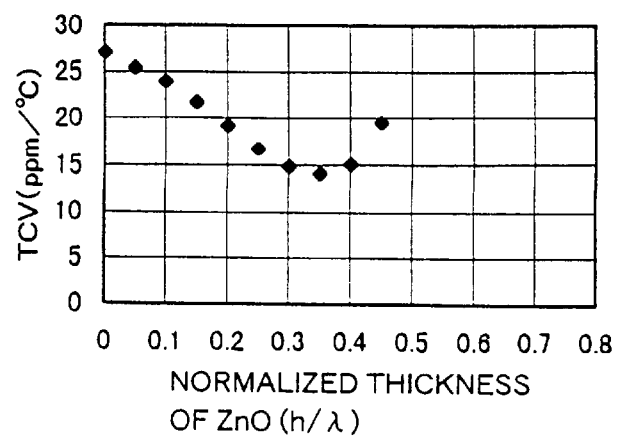
Figure 53:
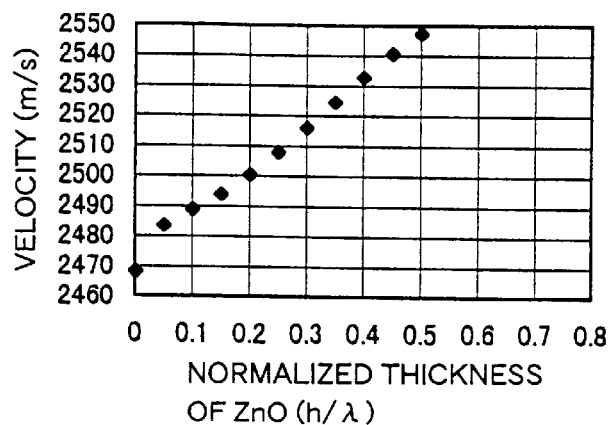
FIGS. 53A, 53B, and 53C are generally illustrative of varying normalized thickness h/λ of ZnO film vs. characteristic change relations for a surface acoustic wave device comprising a langasite single crystal substrate making use of area IV-7, and an opposite electrode film, a ZnO film and an interdigital electrode formed on the surface thereof in this order, and are a graph for SAW velocity changes, a graph for electromechanical coupling factor $k^2$ changes, and a graph for TCV (a temperature coefficient of SAW velocity) changes, respectively.
Figure 53:
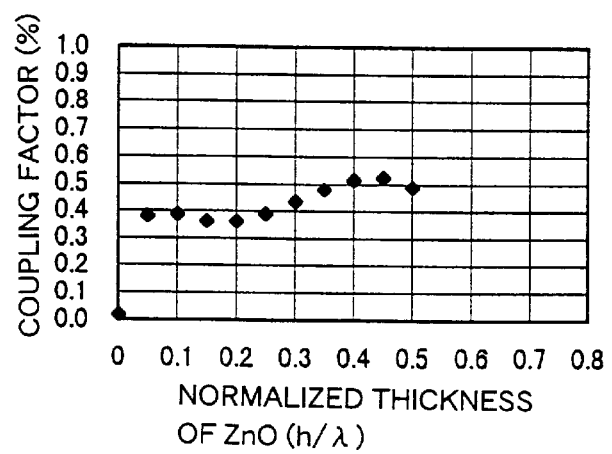
Figure 53:
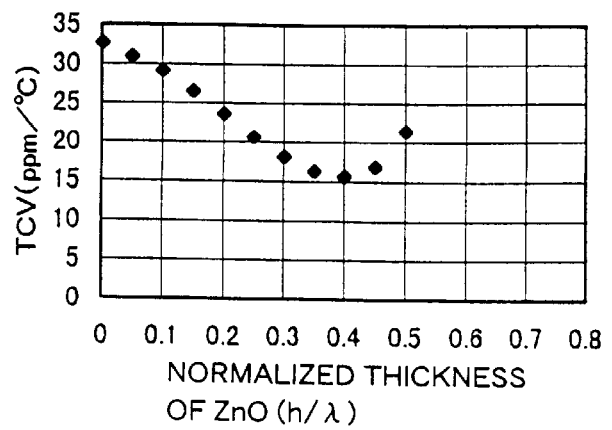
Figure 54:
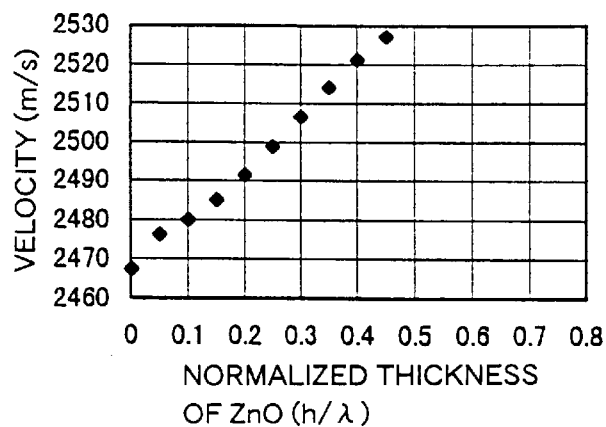
FIGS. 54A, 54B, and 54C are generally illustrative of varying normalized thickness h/λ of ZnO film vs. characteristic change relations for a surface acoustic wave device comprising a langasite single crystal substrate making use of area IV-8, and an opposite electrode film, a ZnO film and an interdigital electrode formed on the surface thereof in this order, and are a graph for SAW velocity changes, a graph for electromechanical coupling factor $k^2$ changes, and a graph for TCV (a temperature coefficient of SAW velocity) changes, respectively.
Figure 54:
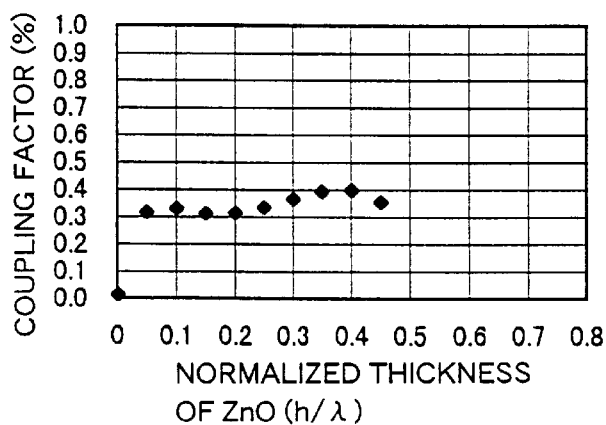
Figure 54:
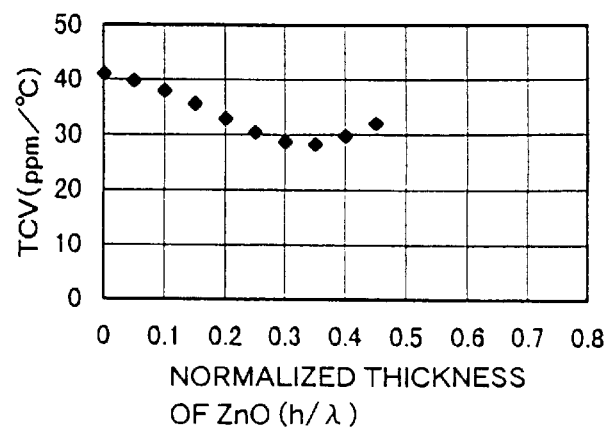
Figure 55:
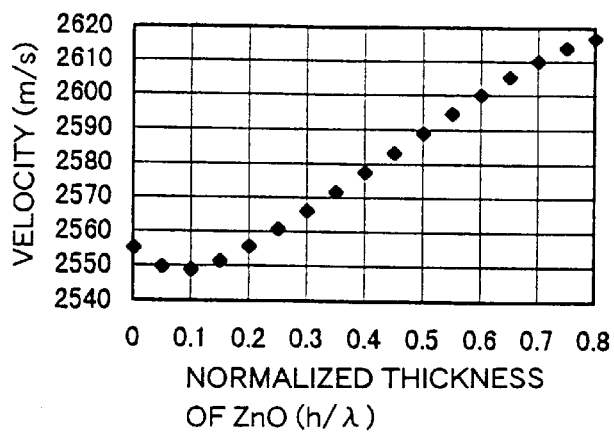
FIGS. 55A, 55B, and 55C are generally illustrative of varying normalized thickness h/λ of ZnO film vs. characteristic change relations for a surface acoustic wave device comprising a langasite single crystal substrate making use of area IV-9, and an opposite electrode film, a ZnO film and an interdigital electrode formed on the surface thereof in this order, and are a graph for SAW velocity changes, a graph for electromechanical coupling factor $k^2$ changes, and a graph for TCV (a temperature coefficient of SAW velocity) changes, respectively.
Figure 55:
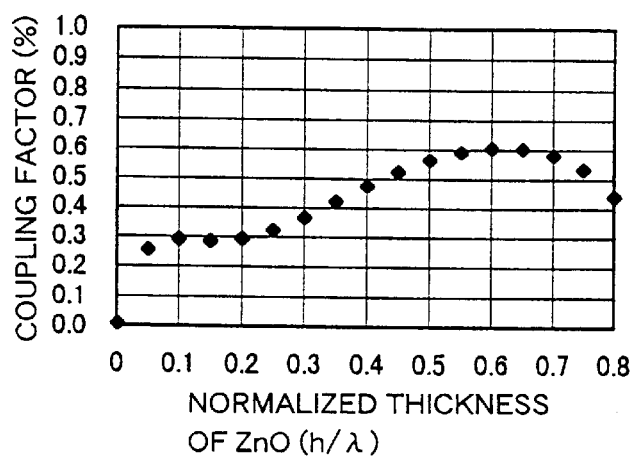
Figure 55:
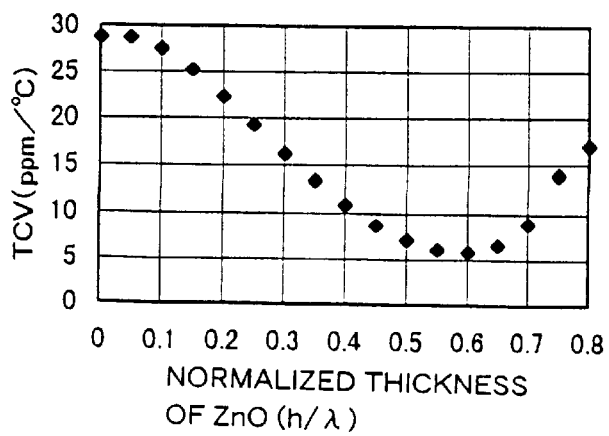
Figure 56:
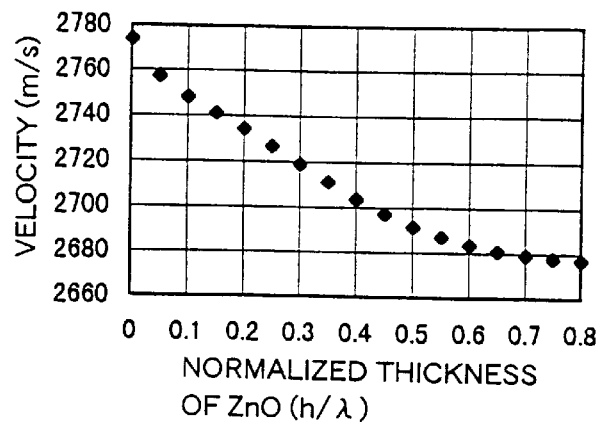
FIGS. 56A, 56B, and 56C are generally illustrative of varying normalized thickness h/λ of ZnO film vs. characteristic change relations for a surface acoustic wave device comprising a langasite single crystal substrate making use of area IV-10, and an opposite electrode film, a ZnO film and an interdigital electrode formed on the surface thereof in this order, and are a graph for SAW velocity changes, a graph for electromechanical coupling factor k2 changes, and a graph for TCV (a temperature coefficient of SAW velocity) changes, respectively.
Figure 56:
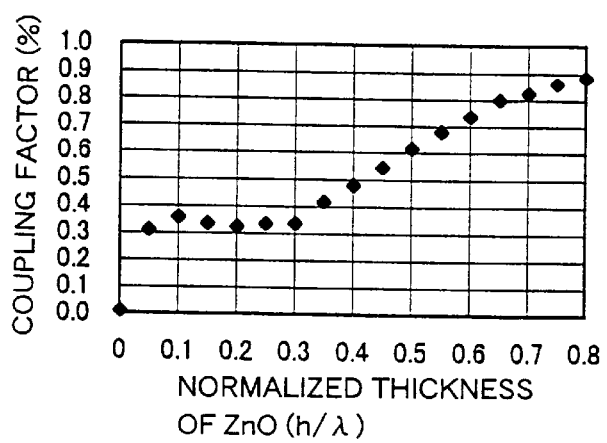
Figure 56:
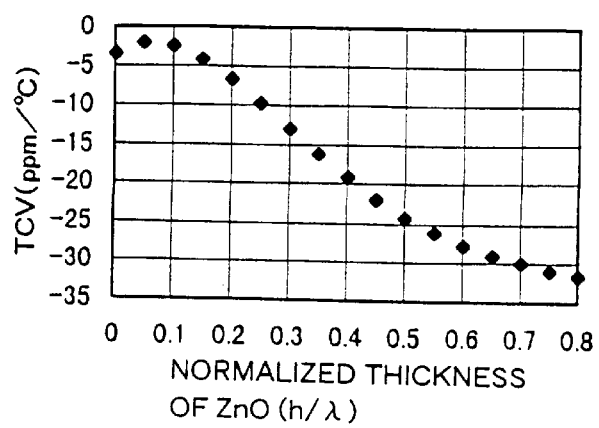

A device making use of area IV-1 can have a very great electromechanical coupling factor of 0.88% when h/λ=0.8, as can be seen from FIGS. 47B, and 47C. At this time, TCV=−31 ppm/° C.; good-enough temperature properties are obtained.

A device making use of area IV-2 can have a great electromechanical coupling factor of 0.6% when h/λ=0.6, as can be seen from FIGS. 48B, and 48C. At this time, TCV=6 ppm/° C.; very excellent temperature properties are obtained.

A device making use of area IV-3 can have an electromechanical coupling factor of 0.39% when h/λ=0.4, as can be seen from FIGS. 49B, and 49C. At this time, TCV=29 ppm/° C.; good-enough temperature properties are obtained.

A device making use of area IV-4 can have a great electromechanical coupling factor of 0.52% when h/λ=0.45, as can be seen from FIGS. 50B, and 50C. At this time, TCV=17 ppm/° C.; good-enough temperature properties are obtained.

A device making use of area IV-5 can have a very great electromechanical coupling factor of 0.46% when h/λ=0.4, as can be seen from FIGS. 51B, and 51C. At this time, TCV=15 ppm/° C.; good-enough temperature properties are obtained.

A device making use of area IV-6 can have a very great electromechanical coupling factor of 0.46% when h/λ=0.4, as can be seen from FIGS. 52B, and 52C. At this time, TCV=15 ppm/° C.; good-enough temperature properties are obtained.

A device making use of area IV-7 can have a very great electromechanical coupling factor of 0.52% when h/λ=0.45, as can be seen from FIGS. 53B, and 53C. At this time, TCV=17 ppm/° C.; good-enough temperature properties are obtained.

A device making use of area IV-8 can have a very great electromechanical coupling factor of 0.39% when h/λ=0.4, as can be seen from FIGS. 54B, and 54C. At this time, TCV=29 ppm/° C.; good-enough temperature properties are obtained.

A device making use of area IV-9 can have a very great electromechanical coupling factor of 0.6% when h/λ=0.6, as can be seen from FIGS. 55B, and 55C. At this time, TCV=6 ppm/° C.; good-enough temperature properties are obtained.

A device making use of area IV-10 can have a very great electromechanical coupling factor of 0.88% when h/λ=0.8, as can be seen from FIGS. 56B, and 56C. At this time, TCV=−32 ppm/° C.; good-enough temperature properties are obtained.

Example 4-2

(Embodiment 4)

Surface acoustic wave devices were fabricated as in example 4-1 with the exception that $\phi$ and $\theta$ were 0° and 90°, respectively and $\psi$ to determine the x-axis or the propagation direction of surface acoustic waves was varied at intervals of 2° between −80° and −66°. It is to be noted that these values for $\phi$, $\theta$ and $\psi$ were included in area IV-1. For these devices, the TCV vs. h/λ (normalized thickness) relations were examined. The results are plotted in FIG. 57. Also, the $k^2$ vs. h/λ relations were examined. The results are plotted in FIG. 58.

Figure 57:
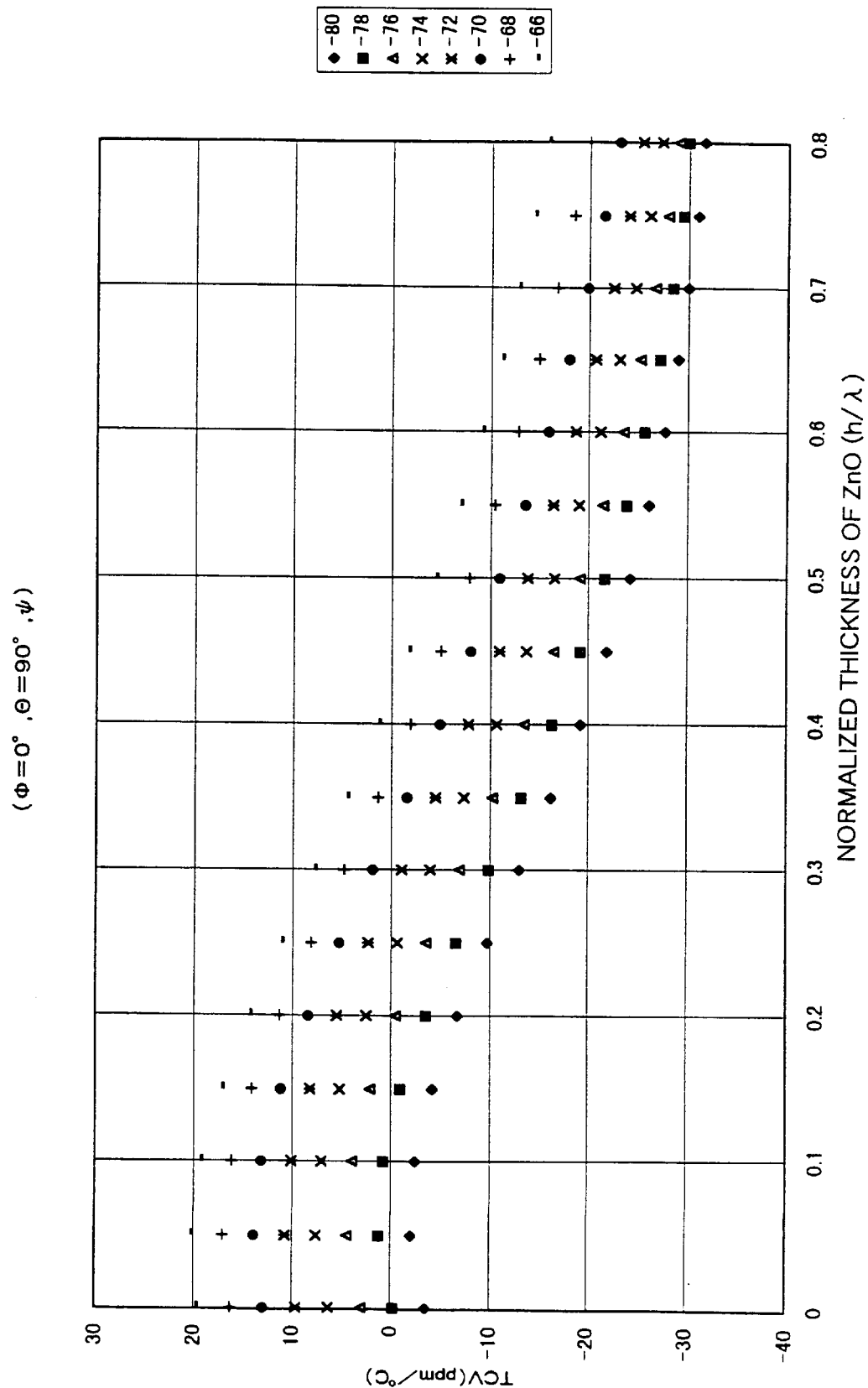
FIG. 57 is a graph illustrative of TCV (a temperature coefficient of SAW velocity) changes for a surface acoustic wave device comprising a langasite single crystal substrate making use of area IV-1, and an opposite electrode film, a ZnO film and an interdigital electrode formed on the surface thereof in this order, when the normalized thickness h/λ of the ZnO film and ψ for defining the propagation direction of a surface acoustic wave are varied.
Figure 58:
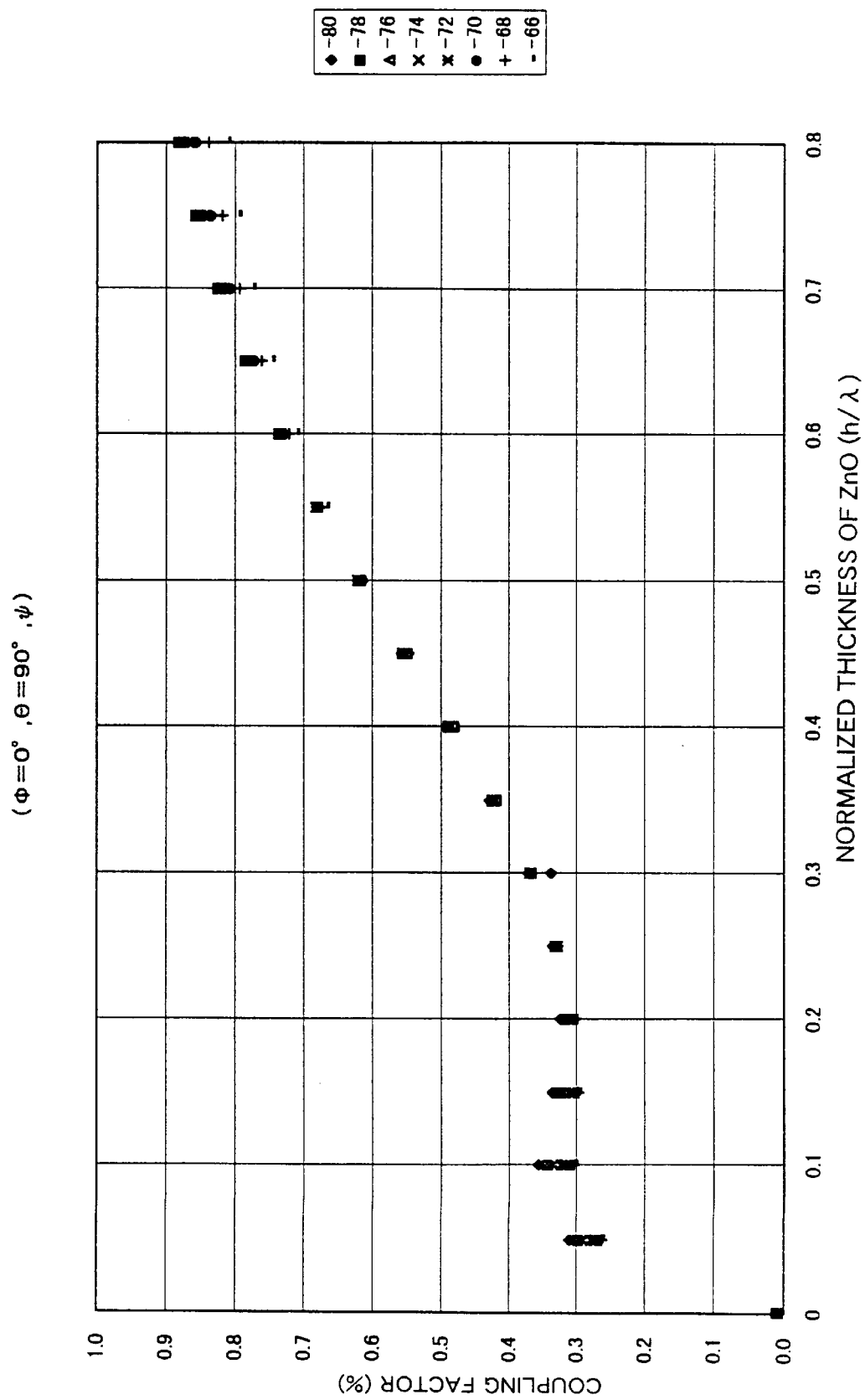
FIG. 58 is a graph illustrative of electromechanical coupling factor $k^2$ changes for a surface acoustic wave device comprising a langasite single crystal substrate making use of area IV-1, and an opposite electrode film, a ZnO film and an interdigital electrode formed on the surface thereof in this order, when the normalized thickness h/λ of the ZnO film and ψ for defining the propagation direction of a surface acoustic wave are varied.

From FIG. 57, on the one hand, it is seen that, at area IV-1, the zero temperature property can be obtained and the thickness of the ZnO film at which the zero temperature property is obtained varies depending on the propagation direction of surface acoustic waves. From FIG. 58, on the other hand, it is seen that as the ZnO film becomes thick, the electromechanical coupling factor tends to become large. Therefore, if the thickness of the ZnO film is determined in such a manner that a large-enough electromechanical coupling factor is obtained and if, at this time, the propagation direction is selected in such a manner that the zero temperature property is obtained, it is then possible to achieve a surface acoustic wave device having the zero temperature property and a large electromechanical coupling factor. If, for instance, the propagation direction $\psi$ is −70 and the normalized thickness, h/λ, of ZnO is 0.35, it is then possible to achieve a small size yet broad passband surface acoustic wave device having excellent temperature properties because TCV is substantially reduced to zero and a very large $k^2$ of 0.42% is obtained.

Example 4-3

(Embodiment 4)

Surface acoustic wave devices were fabricated as in example 4-1 with the exception that $\phi$ and $\theta$ were 0° and 90°, respectively and $\psi$ to determine the x-axis or the propagation direction of surface acoustic waves was varied at intervals of 2° between 66° and 80°. It is to be noted that these values for $\phi$, $\theta$ and $\psi$ were included in area IV-10. For these devices, the TCV vs. h/λ (normalized thickness) relations were examined. The results are plotted in FIG. 59.

Figure 60:
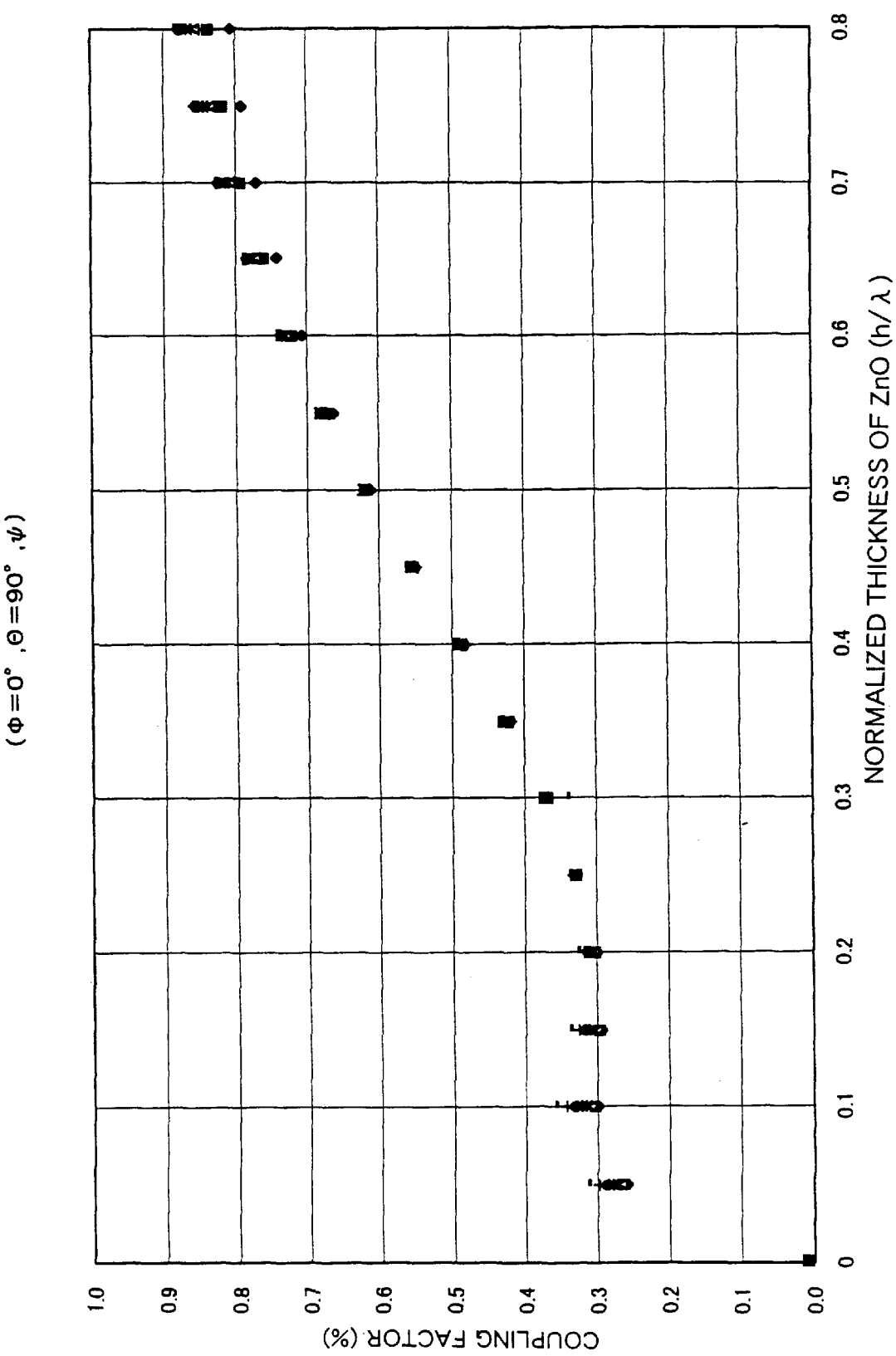
FIG. 60 is a graph illustrative of electromechanical coupling factor k2 changes for a surface acoustic wave device comprising a langasite single crystal substrate making use of area IV-10, and an opposite electrode film, a ZnO film and an interdigital electrode formed on the surface thereof in this order, when the normalized thickness h/λ of the ZnO film and ψ for defining the propagation direction of a surface acoustic wave are varied.

Also, the $k^2$ vs. h/λ relations were examined. The results are plotted in FIG. 60.

Figure 59:
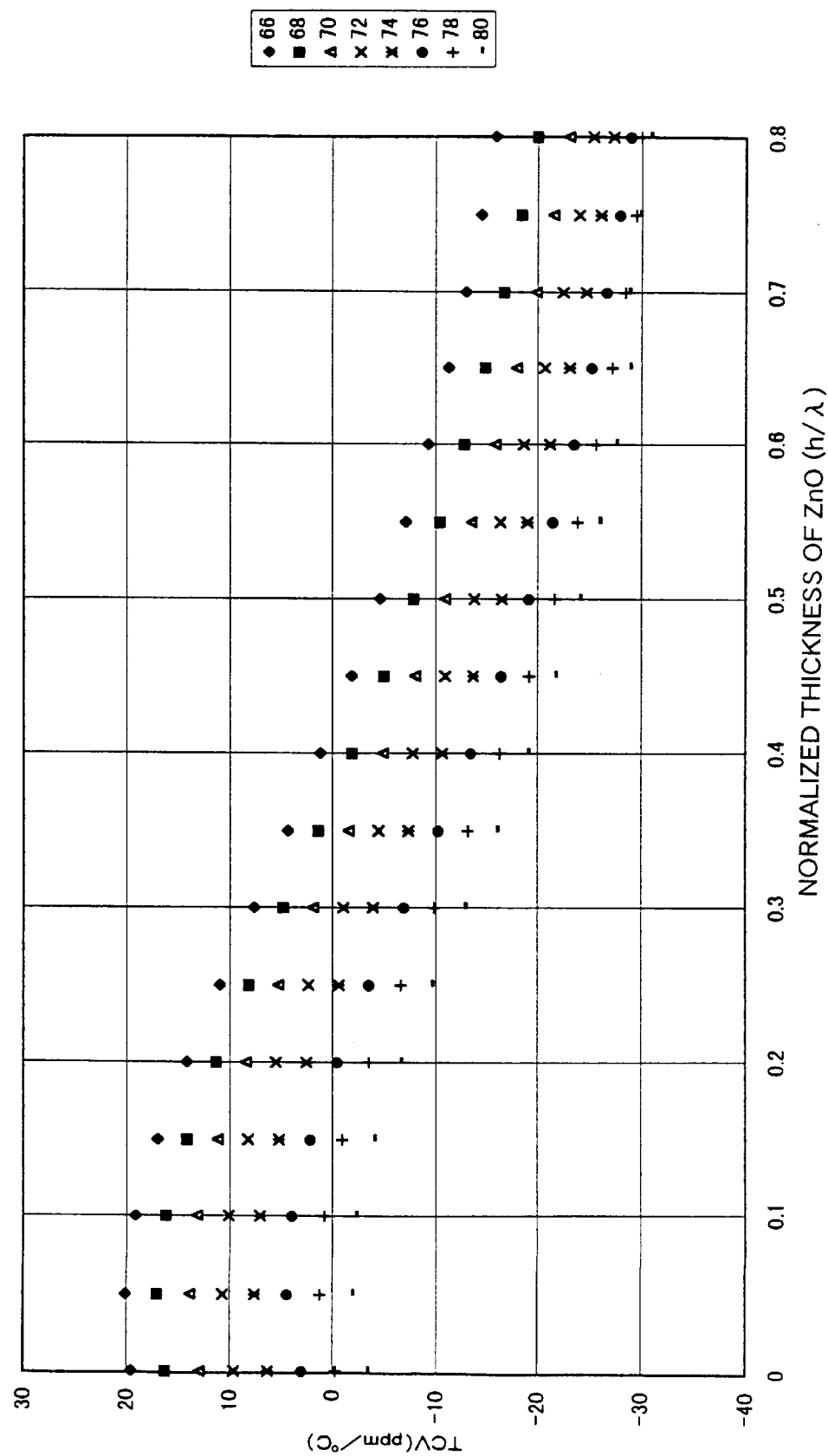
FIG. 59 is a graph illustrative of TCV (a temperature coefficient of SAW velocity) changes for a surface acoustic wave device comprising a langasite single crystal substrate making use of area IV-10, and an opposite electrode film, a ZnO film and an interdigital electrode formed on the surface thereof in this order, when the normalized thickness h/λ of the ZnO film and ψ for defining the propagation direction of a surface acoustic wave are varied.

From FIG. 59, on the one hand, it is seen that, at area IV-10, the zero temperature property can be obtained and the thickness of the ZnO film at which the zero temperature property is obtained varies depending on the propagation direction of surface acoustic waves. From FIG. 60, on the other hand, it is seen that as the ZnO film becomes thick, the electromechanical coupling factor tends to become large. Therefore, if the thickness of the ZnO film is determined in such a manner that a large-enough electromechanical coupling factor is obtained and if, at this time, the propagation direction is selected in such a manner that the zero temperature property is obtained, it is then possible to achieve a surface acoustic wave device having the zero temperature property and a large electromechanical coupling factor. If, for instance, the propagation direction $\psi$ is 70° and the normalized thickness, h/λ, of ZnO is 0.35, it is then possible to achieve a small size yet broad passband surface acoustic wave device having excellent temperature properties because TCV is substantially reduced to zero and a very large $k^2$ of 0.42% is obtained.

The results of the examples clarify the advantages of the invention.

What we claim is:

1. A surface acoustic wave device, comprising:

a substrate, an interdigital electrode on a surface of said substrate, and a piezoelectric film configured to cover said surface of said substrate and a surface of said interdigital electrode, wherein:

said substrate is a langasite single crystal belonging to a point group 32, and when a cut angle of said substrate cut out of the langasite single crystal and a propagation direction of surface acoustic waves on said substrate are represented in terms of Euler angles ($\phi$, $\theta$, $\psi$), where $-5° \leq \phi \leq 5°$ $85° \leq \theta \leq 95°$ $-90° \leq \psi < -70°$, and said piezoelectric film is a c-axis oriented ZnO film that satisfies:

$h/\lambda = 0.2$ to $0.8$ where h is a thickness of said ZnO film, and λ is a wavelength of a surface acoustic wave.

2. A surface acoustic wave device comprising:

a substrate, an interdigital electrode on a surface of said substrate, and a piezoelectric film configured to cover said surface of said substrate and a surface of said interdigital electrode, wherein:

said substrate is a langasite single crystal belonging to a point group 32, and when a cut angle of said substrate cut out of the langasite single crystal and a propagation direction of surface acoustic waves on said substrate are represented in terms of Euler angles ($\phi$, $\theta$, $\psi$), where $-5° \leq \phi \leq 5°$ $85° > \theta \leq 95°$ $-70° \leq \psi < -50°$, and said piezoelectric film is a c-axis oriented ZnO film that satisfies:

$h/\lambda = 0.25$ to $0.7$ where h is a thickness of said ZnO film, and λ is a wavelength of a surface acoustic wave.

3. A surface acoustic wave device comprising:

a substrate, an interdigital electrode on a surface of said substrate, and a piezoelectric film configured to cover said surface of said substrate and a surface of said interdigital electrode, wherein:

said substrate is a langasite single crystal belonging to a point group 32, and when a cut angle of said substrate cut out of the langasite single crystal and a propagation direction of surface acoustic waves on said substrate are represented in terms of Euler angles ($\phi, \theta, \psi$), where $5° \leq \phi \leq 5°$ $85° \leq \theta \leq 95°$ $-50° \leq \psi < -35°$, and said piezoelectric film is a c-axis oriented ZnO film that satisfies:

$$h/\lambda = 0.25 \text{ to } 0.45$$

where h is a thickness of said ZnO film, and $\lambda$ is a wavelength of a surface acoustic wave.

4. A surface acoustic wave device comprising:

a substrate, an interdigital electrode on a surface of said substrate, and a piezoelectric film configured to cover said surface of said substrate and a surface of said interdigital electrode, wherein:

said substrate is a langasite single crystal belonging to a point group 32, and when a cut angle of said substrate cut out of the langasite single crystal and a propagation direction of surface acoustic waves on said substrate are represented in terms of Euler angles ($\phi, \theta, \psi$), where $-5° \leq \phi \leq 5°$ $85° \leq \theta \leq 95°$ $35° \leq \psi < -25°$, and said piezoelectric film is a c-axis oriented ZnO film that satisfies:

$$0 < h/\lambda \leq 0.5$$

where h is a thickness of said ZnO film, and $\lambda$ is a wavelength of a surface acoustic wave.

5. A surface acoustic wave device comprising:

a substrate, an interdigital electrode on a surface of said substrate, and a piezoelectric film configured to cover said surface of said substrate and a surface of said interdigital electrode, wherein:

said substrate is a langasite single crystal belonging to a point group 32, and when a cut angle of said substrate cut out of the langasite single crystal and a propagation direction of surface acoustic waves on said substrate are represented in terms of Euler angles ($\phi, \theta, \psi$), where $-5° \leq \phi \leq 5°$ $85° \leq \theta \leq 95°$ $-25° \leq \psi \leq -10°$, and said piezoelectric film is a c-axis oriented ZnO film that satisfies:

$$0 < h/\lambda \leq 0.45$$

where h is a thickness of said ZnO film, and $\lambda$ is a wavelength of a surface acoustic wave.

6. A surface acoustic wave device comprising:

a substrate, an interdigital electrode on a surface of said substrate, and a piezoelectric film configured to cover said surface of said substrate and a surface of said interdigital electrode, wherein:

said substrate is a langasite single crystal belonging to a point group 32, and when a cut angle of said substrate cut out of the langasite single crystal and a propagation direction of surface acoustic waves on said substrate are represented in terms of Euler angles ($\phi, \theta, \psi$), where $-5° \leq \phi \leq 5°$ $85° \leq \theta \leq 95°$ $10° \leq \psi < 25°$, and said piezoelectric film is a c-axis oriented ZnO film that satisfies:

$$0 < h/\lambda \leq 0.4$$

where h is a thickness of said ZnO film, and $\lambda$ is a wavelength of a surface acoustic wave.

7. A surface acoustic wave device comprising:

a substrate, an interdigital electrode on a surface of said substrate, and a piezoelectric film configured to cover said surface of said substrate and a surface of said interdigital electrode, wherein:

said substrate is a langasite single crystal belonging to a point group 32, and when a cut angle of said substrate cut out of the langasite single crystal and a propagation direction of surface acoustic waves on said substrate are represented in terms of Euler angles ($\phi, \theta, \psi$), where $-5° \leq \phi \leq 5°$ $85° \leq \theta \leq 95°$ $25° \leq \psi < 35°$, and said piezoelectric film is a c-axis oriented ZnO film that satisfies:

$$0 < h/\lambda \leq 0.45$$

where h is a thickness of said ZnO film, and $\lambda$ is a wavelength of a surface acoustic wave.

8. A surface acoustic wave device comprising:

a substrate, an interdigital electrode on a surface of said substrate, and a piezoelectric film configured to cover said surface of said substrate and a surface of said interdigital electrode, wherein:

said substrate is a langasite single crystal belonging to a point group 32, and when a cut angle of said substrate cut out of the langasite single crystal and a propagation direction of surface acoustic waves on said substrate are represented in terms of Euler angles ($\phi, \theta, \psi$), where $-5° \leq \phi \leq 5°$ $85° \leq \theta \leq 95°$ $35° \leq \psi < 50°$, and said piezoelectric film is a c-axis oriented ZnO film that satisfies:

$$0 < h/\lambda \leq 0.4$$

where h is a thickness of said ZnO film, and $\lambda$ is a wavelength of a surface acoustic wave.

9. A surface acoustic wave device comprising:

a substrate, an interdigital electrode on a surface of said substrate, and a piezoelectric film configured to cover said surface of said substrate and a surface of said interdigital electrode, wherein:

said substrate is a langasite single crystal belonging to a point group 32, and when a cut angle of said substrate cut out of the langasite single crystal and a propagation direction of surface acoustic waves on said substrate are represented in terms of Euler angles ($\phi, \theta, \psi$), where $-50° \leq \phi \leq 5°$ $85° \leq \theta \leq 95°$ $50° \leq \psi < 70°$, and said piezoelectric film is a c-axis oriented ZnO film that satisfies:

$$h/\lambda = 0.15 \text{ to } 0.7$$

where h is a thickness of said ZnO film, and $\lambda$ is a wavelength of a surface acoustic wave.

10. A surface acoustic wave device comprising:

a substrate, an interdigital electrode on a surface of said substrate, and a piezoelectric film configured to cover said surface of said substrate and a surface of said interdigital electrode, wherein:

said substrate is a langasite single crystal belonging to a point group 32, and when a cut angle of said substrate cut out of the langasite single crystal and a propagation direction of surface acoustic waves on said substrate are represented in terms of Euler angles ($\phi, \theta, \psi$), where $-5° \leq \phi \leq 5°$ $85° \leq \theta \leq 95°$ $70° \leq \psi < 90°$, and said piezoelectric film is a c-axis oriented ZnO film that satisfies:

$$h/\lambda = 0.15 \text{ to } 0.18$$

where h is a thickness of said ZnO film, and $\lambda$ is a wavelength of a surface acoustic wave.

11. A surface acoustic wave device comprising:

a substrate, a piezoelectric film on a surface of said substrate, and an interdigital electrode on a surface of said piezoelectric film, wherein:

said substrate is a langasite single crystal belonging to a point group 32, and when a cut angle of said substrate cut out of the langasite single crystal and a propagation direction of surface acoustic waves on said substrate are represented in terms of Euler angles ($\phi, \theta, \psi$), where $-5° \leq \phi \leq 5°$ $85° \leq \theta \leq 95°$ $-90° \leq \psi < -70°$, and said piezoelectric film is a c-axis oriented ZnO film that satisfies:

$$h/\lambda = 0.05 \text{ to } 0.8$$

where h is a thickness of said ZnO film, and $\lambda$ is a wavelength of a surface acoustic wave.

12. A surface acoustic wave device comprising:

a substrate, a piezoelectric film on a surface of said substrate, and an interdigital electrode on a surface of said piezoelectric film, wherein:

said substrate is a langasite single crystal belonging to a point group 32, and when a cut angle of said substrate cut out of the langasite single crystal and a propagation direction of surface acoustic waves on said substrate are represented in terms of Euler angles ($\phi, \theta, \psi$), where $-5° \leq \phi \leq 5°$ $85° \leq \theta \leq 95°$ $-70° \leq \psi < -50°$, and said piezoelectric film is a c-axis oriented ZnO film that satisfies:

$$h/\lambda = 0.05 \text{ to } 0.75$$

where h is a thickness of said ZnO film, and $\lambda$ is a wavelength of a surface acoustic wave.

13. A surface acoustic wave device comprising:

a substrate, a piezoelectric film on a surface of said substrate, and an interdigital electrode on a surface of said piezoelectric film, wherein:

said substrate is a langasite single crystal belonging to a point group 32, and when a cut angle of said substrate cut out of the langasite single crystal and a propagation direction of surface acoustic waves on said substrate are represented in terms of Euler angles ($\phi, \theta, \psi$), where $-5° \leq \phi \leq 5°$ $85° \leq \theta \leq 95°$ $-50° \leq \psi < -35°$, and said piezoelectric film is a c-axis oriented ZnO film that satisfies:

$$0 < h/\lambda \leq 0.45$$

where h is a thickness of said ZnO film, and $\lambda$ is a wavelength of a surface acoustic wave.

14. A surface acoustic wave device comprising:

a substrate, a piezoelectric film on a surface of said substrate, and an interdigital electrode on a surface of said piezoelectric film, wherein:

said substrate is a langasite single crystal belonging to a point group 32, and when a cut angle of said substrate cut out of the langasite single crystal and a propagation direction of surface acoustic waves on said substrate are represented in terms of Euler angles ($\phi, \theta, \psi$) where $-5° \leq \phi \leq 5°$ $85° \leq \theta \leq 95°$ $-35° \leq \psi < -35°$, and said piezoelectric film is a c-axis oriented ZnO film that satisfies:

$$0 < h/\lambda \leq 0.5$$

where h is a thickness of said ZnO film, and $\lambda$ is wavelength of a surface acoustic wave.

15. A surface acoustic wave device comprising:

a substrate, a piezoelectric film on a surface of said substrate, and an interdigital electrode on a surface of said piezoelectric film, wherein:

said substrate is a langasite single crystal belonging to a point group 32, and when a cut angle of said substrate cut out of the langasite single crystal and a propagation direction of surface acoustic waves on said substrate are represented in terms of Euler angles ($\phi$, $\theta$, $\psi$), where $-5° \leq \phi \leq 5°$ $85° \leq \theta \leq 95°$ $-25° \leq \psi < -10°$, and said piezoelectric film is a c-axis oriented ZnO film that satisfies:

$$0 < h/\lambda \leq 0.45$$

where h is a thickness of said ZnO film, and $\lambda$ is a wavelength of a surface acoustic wave.

16. A surface acoustic wave device comprising:

a substrate, a piezoelectric film on a surface of said substrate, and an interdigital electrode on a surface of said piezoelectric film, wherein:

said substrate is a langasite single crystal belonging to a point group 32, and when a cut angle of said substrate cut out of the langasite single crystal and a propagation direction of surface acoustic waves on said substrate are represented in terms of Euler angles ($\phi$, $\theta$, $\psi$), where $-5° \leq \phi \leq 5°$ $85° \leq \theta \leq 95°$ $10° \leq \psi < 25°$, and said piezoelectric film is a c-axis oriented ZnO film that satisfies:

$$0 < h/\lambda \leq 0.4$$

where h is a thickness of said ZnO film, and $\lambda$ is a wavelength of a surface acoustic wave.

17. A surface acoustic wave device comprising:

a substrate, a piezoelectric film on a surface of said substrate, and an interdigital electrode on a surface of said piezoelectric film, wherein:

said substrate is a langasite single crystal belonging to a point group 32, and when a cut angle of said substrate cut out of the langasite single crystal and a propagation direction of surface acoustic waves on said substrate are represented in terms of Euler angles ($\phi$, $\theta$, $\psi$), where $-5° \leq \phi \leq 5°$ $85° \leq \theta \leq 95°$ $25° \leq \psi < 35°$, and said piezoelectric film is a c-axis oriented ZnO film that satisfies:

$$0 < h/\lambda \leq 0.45$$

where h is a thickness of said ZnO film, and $\lambda$ is a wavelength of a surface acoustic wave.

18. A surface acoustic wave device comprising:

a substrate, a piezoelectric film on a surface of said substrate, and an interdigital electrode on a surface of said piezoelectric film, wherein:

said substrate is a langasite single crystal belonging to a point group 32, and when a cut angle of said substrate cut out of the langasite single crystal and a propagation direction of surface acoustic waves on said substrate are represented in terms of Euler angles ($\phi$, $\theta$, $\psi$), where $-5° \leq \phi \leq 5°$ $85° \leq \theta \leq 95°$ $35° \leq \psi < 35°$, and said piezoelectric film is a c-axis oriented ZnO film that satisfies:

$$0 < h/\lambda \leq 0.4$$

where h is a thickness of said ZnO film, and $\lambda$ is a wavelength of a surface acoustic wave.

19. A surface acoustic wave device comprising:

a substrate, a piezoelectric film on a surface of said substrate, and an interdigital electrode on a surface of said piezoelectric film, wherein:

said substrate is a langasite single crystal belonging to a point group 32, and when a cut angle of said substrate cut out of the langasite single crystal and a propagation direction of surface acoustic waves on said substrate are represented in terms of Euler angles ($\phi$, $\theta$, $\psi$), where $-5° \leq \phi \leq 5°$ $85° \leq \theta \leq 95°$ $50° \leq \psi < 70°$, and said piezoelectric film is a c-axis oriented ZnO film that satisfies:

$$h/\lambda = 0.05 \text{ to } 0.7$$

where h is a thickness of said ZnO film, and $\lambda$ is a wavelength of a surface acoustic wave.

20. A surface acoustic wave device comprising:

a substrate, a piezoelectric film on a surface of said substrate, and an interdigital electrode on a surface of said piezoelectric film, wherein:

said substrate is a langasite single crystal belonging to a point group 32, and when a cut angle of said substrate cut out of the langasite single crystal and a propagation direction of surface acoustic waves on said substrate are represented in terms of Euler angles ($\phi$, $\theta$, $\psi$), where $-5° \leq \phi \leq 5°$ $85° \leq \theta \leq 95°$ $70° \leq \psi < 90°$, and said piezoelectric film is a c-axis oriented ZnO film that satisfies:

$$h/\lambda = 0.05 \text{ to } 0.8$$

where h is a thickness of said ZnO film, and $\lambda$ is wavelength of a surface acoustic wave.

21. A surface acoustic wave device comprising:

a substrate, an interdigital electrode on a surface of said substrate, and a piezoelectric film configured to cover said surface of said substrate and a surface of said interdigital electrode and an opposite electrode film on a surface of said piezoelectric film, wherein:

said substrate is a langasite single crystal belonging to a point group 32, and when a cut angle of said substrate cut out of the langasite single crystal and a propagation direction of surface acoustic waves on said substrate are represented in terms of Euler angles ($\phi$, $\theta$, $\psi$), where $-5° \leq \phi \leq 5°$
$85° \leq \theta \leq 95°$
$-90° \leq \psi < -70°$, and
said piezoelectric film is a c-axis oriented ZnO film that satisfies:

$$0 < h/\lambda \leq 0.1 \text{ or } 0.3 \leq h/\lambda \leq 0.8$$

where h is a thickness of said ZnO film, and $\lambda$ is a wavelength of a surface acoustic wave.

22. A surface acoustic wave device comprising:
a substrate,
an interdigital electrode on a surface of said substrate, and
a piezoelectric film configured to cover said surface of said substrate and a surface of said interdigital electrode and an opposite electrode film on a surface of said piezoelectric film, wherein:
said substrate is a langasite single crystal belonging to a point group 32, and when a cut angle of said substrate cut out of the langasite single crystal and a propagation direction of surface acoustic waves on said substrate are represented in terms of Euler angles ($\phi$, $\theta$, $\psi$), where
$-5° \leq \phi \leq 5°$
$85° \leq \theta \leq 95°$
$-70° \leq \psi < -50°$, and
said piezoelectric film is a c-axis oriented ZnO film that satisfies:

$$0 < h/\lambda \leq 0.1 \text{ or } 0.35 \leq h/\lambda \leq 0.8$$

where h is a thickness of said ZnO film, and $\psi$ is wavelength of a surface acoustic wave.

23. A surface acoustic wave device comprising
a substrate,
an interdigital electrode on a surface of said substrate, and
a piezoelectric film configured to cover said surface of said substrate and a surface of said interdigital electrode and an opposite electrode film on a surface of said piezoelectric film, wherein:
said substrate is a langasite single crystal belonging to a point group 32, and when a cut angle of said substrate cut out of the langasite single crystal and a propagation direction of surface acoustic waves on said substrate are represented in terms of Euler angles ($\phi$, $\theta$, $\psi$), where
$-5° \leq \phi \leq 5°$
$85° \leq \theta \leq 95°$
$-50° \leq \psi < -35°$, and
said piezoelectric film is a c-axis oriented ZnO film that satisfies:

$$0 < h/\lambda \leq 0.15 \text{ or } 0.35 \leq h/\lambda \leq 0.5$$

where h is a thickness of said ZnO film, and $\lambda$ is a wavelength of a surface acoustic wave.

24. A surface acoustic wave device comprising:
a substrate,
an interdigital electrode on a surface of said substrate, and
a piezoelectric film configured to cover said surface of said substrate and a surface of said interdigital electrode and an opposite electrode film on a surface of said piezoelectric film, wherein:
said substrate is a langasite single crystal belonging to a point group 32, and when a cut angle of said substrate cut out of the langasite single crystal and a propagation direction of surface acoustic waves on said substrate are represented in terms of Euler angles ($\phi$, $\theta$, $\psi$), where
$-5° \leq \phi \leq 5°$
$85° \leq \theta \leq 95°$
$-35° \leq \psi < -25°$, and
said piezoelectric film is a c-axis oriented ZnO film that satisfies:

$$0 < h/\lambda \leq 0.15 \text{ or } 0.3 \leq h/\lambda \leq 0.5$$

where h is a thickness of said ZnO film, and $\lambda$ is a wavelength of a surface acoustic wave.

25. A surface acoustic wave device comprising:
a substrate,
an interdigital electrode on a surface of said substrate, and
a piezoelectric film configured to cover said surface of said substrate and a surface of said interdigital electrode and an opposite electrode film on a surface of said piezoelectric film, wherein:
said substrate is a langasite single crystal belonging to a point group 32, and when a cut angle of said substrate cut out of the langasite single crystal and a propagation direction of surface acoustic waves on said substrate are represented in terms of Euler angles ($\phi$, $\theta$, $\psi$), where
$-5° \leq \phi \leq 5°$
$85° \leq \theta \leq 95°$
$-25° \leq \psi \leq -10°$, and
said piezoelectric film is a c-axis oriented ZnO film that satisfies:

$$0 < h/\lambda \leq 0.15 \text{ or } 0.3 \leq h/\lambda \leq 0.45$$

where h is a thickness of said ZnO film, and $\lambda$ is a wavelength of a surface acoustic wave.

26. A surface acoustic wave device comprising:
a substrate,
an interdigital electrode on a surface of said substrate, and
a piezoelectric film configured to cover said surface of said substrate and a surface of said interdigital electrode and an opposite electrode film on a surface of said piezoelectric film, wherein:
said substrate is a langasite single crystal belonging to a point group 32, and when a cut angle of said substrate cut out of the langasite single crystal and a propagation direction of surface acoustic waves on said substrate are represented in terms of Euler angles ($\phi$, $\theta$, $\psi$) where
$-5° \leq \phi \leq 5°$
$85° \leq \theta \leq 95°$
$10° \leq \psi < 25°$, and
said piezoelectric film is a c-axis oriented ZnO film that satisfies:

$$0 < h/\lambda \leq 0.45$$

where h is a thickness of said ZnO film, and $\lambda$ is a wavelength of a surface acoustic wave.

27. A surface acoustic wave device comprising:
a substrate,
an interdigital electrode on a surface of said substrate, and
a piezoelectric film configured to cover said surface of said substrate and a surface of said interdigital electrode and an opposite electrode film on a surface of said piezoelectric film, wherein:
said substrate is a langasite single crystal belonging to a point group 32, and when a cut angle of said substrate cut out of the langasite single crystal and a propagation direction of surface acoustic waves on said substrate are represented in terms of Euler angles ($\phi$, $\theta$, $\psi$), where $-5° \leq \phi \leq 5°$ $85° \leq \theta \leq 95°$ $25° \leq \psi < 35°$, and said piezoelectric film is a c-axis oriented ZnO film that satisfies:

$$0 < h/\lambda \leq 0.5$$

where h is a thickness of said ZnO film, and λ is a wavelength of a surface acoustic wave.

28. A surface acoustic wave device comprising:

a substrate, an interdigital electrode on a surface of said substrate, and a piezoelectric film configured to cover said surface of said substrate and a surface of said interdigital electrode and an opposite electrode film on a surface of said piezoelectric film, wherein:

said substrate is a langasite single crystal belonging to a point group 32, and when a cut angle of said substrate cut out of the langasite single crystal and a propagation direction of surface acoustic waves on said substrate are represented in terms of Euler angles (φ, θ, ψ), where $-5° \leq \phi \leq 5°$ $85° \leq \theta \leq 95°$ $35° \leq \psi < 50°$, and said piezoelectric film is a c-axis oriented ZnO film that satisfies:

$$0 < h/\lambda \leq 0.45$$

where h is a thickness of said ZnO film, and λ is a wavelength of a surface acoustic wave.

29. A surface acoustic wave device comprising:

a substrate, an interdigital electrode on a surface of said substrate, and a piezoelectric film configured to cover said surface of said substrate and a surface of said interdigital electrode and an opposite electrode film on a surface of said piezoelectric film, wherein:

said substrate is a langasite single crystal belonging to a point group 32, and when a cut angle of said substrate cut out of the langasite single crystal and a propagation direction of surface acoustic waves on said substrate are represented in terms of Euler angles (φ, θ, ψ), where $-5° \leq \phi \leq 5°$ $85° \leq \theta \leq 95°$ $50° \leq \psi < 70°$, and said piezoelectric film is a c-axis oriented ZnO film that satisfies:

$$0 < h/\lambda \leq 0.05 \text{ or } 0.2 < h/\lambda \leq 0.8$$

where h is a thickness of said ZnO film, and λ is a wavelength of a surface acoustic wave.

30. A surface acoustic wave device comprising:

a substrate, an interdigital electrode on a surface of said substrate, and a piezoelectric film configured to cover said surface of said substrate and a surface of said interdigital electrode and an opposite electrode film on a surface of said piezoelectric film, wherein:

said substrate is a langasite single crystal belonging to a point group 32, and when a cut:angle of said substrate cut out of the langasite single crystal and a propagation direction of surface acoustic waves on said substrate are represented in terms of Euler angles (φ, θ, ψ), where $-5° \leq \phi \leq 5°$ $85° \leq \theta \leq 95°$ $70° \leq \psi < 90°$, and said piezoelectric film is a c-axis oriented ZnO film that satisfies:

$$0 < h/\lambda \leq 0.5 \text{ or } 0.25 \leq h/\lambda \leq 0.8$$

where h is a thickness of said ZnO film, and λ is a wavelength of a surface acoustic wave.

31. A surface acoustic wave device comprising:

a substrate, an opposite electrode film on a surface of said substrate, and a piezoelectric film on said opposite electrode film and an interdigital electrode on a surface of said piezoelectric film, wherein:

said substrate is a langasite single crystal belonging to a point group 32, and when a cut angle of said substrate cut out of the langasite single crystal and a propagation direction of surface acoustic waves on said substrate are represented in terms of Euler angles (φ, θ, ψ), where $-5° \leq \phi \leq 5°$ $85° \leq \theta \leq 95°$ $-90° \leq \psi < -70°$, and said piezoelectric film is a c-axis oriented ZnO film that satisfies:

$$h/\lambda = 0.05 \text{ to } 0.8$$

where h is a thickness of said ZnO film, and λ is a wavelength of a surface acoustic wave.

32. A surface acoustic wave device comprising:

a substrate, an opposite electrode film on a surface of said substrate, and a piezoelectric film on said opposite electrode film and an interdigital electrode on a surface of said piezoelectric film, wherein:

said substrate is a langasite single crystal belonging to a point group 32, and when a cut angle of said substrate cut out of the langasite single crystal and a propagation direction of surface acoustic waves on said substrate are represented in terms of Euler angles (φ, θ, ψ), where $-5° \leq \phi \leq 5°$ $85° \leq \theta \leq 95°$ $-70° \leq \psi < -50°$, and said piezoelectric film is a c-axis oriented ZnO film that satisfies:

$$h/\lambda = 0.05 \text{ to } 0.8$$

where h is a thickness of said ZnO film, and λ is a wavelength of a surface acoustic wave.

33. A surface acoustic wave device comprising:

a substrate, an opposite electrode film on a surface of said substrate, and a piezoelectric film on said opposite electrode film and an interdigital electrode on a surface of said piezoelectric film, wherein:

said substrate is a langasite single crystal belonging to a point group 32, and when a cut angle of said substrate cut out of the langasite single crystal and a propagation direction of surface acoustic waves on said substrate are represented in terms of Euler angles (φ, θ, ψ), where $-5° \leq \phi \leq 5°$
$85° \leq \theta \leq 95°$
$-50° \leq \psi < -35°$, and said piezoelectric film is a c-axis oriented ZnO film that satisfies:

$$h/\lambda = 0.05 \text{ to } 0.45$$

where h is a thickness of said ZnO film, and $\lambda$ is a wavelength of a surface acoustic wave.

34. A surface acoustic wave device comprising:

a substrate, an opposite electrode film on a surface of said substrate, and a piezoelectric film on said opposite electrode film and an interdigital electrode on a surface of said piezoelectric film, wherein:

said substrate is a langasite single crystal belonging to a point group 32, and when a cut angle of said substrate cut out of the langasite single crystal and a propagation direction of surface acoustic waves on said substrate are represented in terms of Euler angles ($\phi$, $\theta$, $\psi$), where $-5° \leq \phi \leq 5°$
$85° \leq \theta \leq 95°$
$-35° \leq \psi < -25°$, and said piezoelectric film is a c-axis oriented ZnO film that satisfies:

$$h/\lambda = 0.05 \text{ to } 0.5$$

where h is a thickness of said ZnO film, and $\lambda$ is a wavelength of a surface acoustic wave.

35. A surface acoustic wave device comprising:

a substrate, an opposite electrode film on a surface of said substrate, and a piezoelectric film on said opposite electrode film and an interdigital electrode on a surface of said piezoelectric film, wherein:

said substrate is a langasite single crystal belonging to a point group 32, and when a cut angle of said substrate cut out of the langasite single crystal and a propagation direction of surface acoustic waves on said substrate are represented in terms of Euler angles ($\phi$, $\theta$, $\psi$), where $-5° \leq \phi \leq 5°$
$85° \leq \theta \leq 95°$
$-25° \leq \psi < -10°$, and said piezoelectric film is a c-axis oriented ZnO film that satisfies:

$$h/\lambda = 0.05 \text{ to } 0.45$$

where h is a thickness of said ZnO film, and $\lambda$ is a wavelength of a surface acoustic wave.

36. A surface acoustic wave device comprising:

a substrate, an opposite electrode film on a surface of said substrate, and a piezoelectric film on said opposite electrode film and an interdigital electrode on a surface of said piezoelectric film, wherein:

said substrate is a langasite single crystal belonging to a point group 32, and when a cut angle of said substrate cut out of the langasite single crystal and a propagation direction of surface acoustic waves on said substrate are represented in terms of Euler angles ($\phi$, $\theta$, where $-5° \leq \phi \leq 5°$
$85° \leq \theta \leq 95°$
$10° \leq \psi < 25°$, and said piezoelectric film is a c-axis oriented ZnO film that satisfies:

$$h/\lambda = 0.05 \text{ to } 0.45$$

where h is a thickness of said ZnO film, and $\lambda$ is a wavelength of a surface acoustic wave.

37. A surface acoustic wave device comprising:

a substrate, an opposite electrode film on a surface of said substrate, and a piezoelectric film on said opposite electrode film and an interdigital electrode on a surface of said piezoelectric film, wherein:

said substrate is a langasite single crystal belonging to a point group 32, and when a cut angle of said substrate cut out of the langasite single crystal and a propagation direction of surface acoustic waves on said substrate are represented in terms of Euler angles ($\phi$, $\theta$, where $-5° \leq \phi \leq 5°$
$85° \leq \theta \leq 95°$
$25° \leq \psi < 35°$, and said piezoelectric film is a c-axis oriented ZnO film that satisfies:

$$h/\lambda = 0.05 \text{ to } 0.5$$

where h is a thickness of said ZnO film, and $\lambda$ is a wavelength of a surface acoustic wave.

38. A surface acoustic wave device comprising:

a substrate, an opposite electrode film on a surface of said substrate, and a piezoelectric film on said opposite electrode film and a n interdigital electrode on a surface of said piezoelectric film, where in:

said substrate is a langasite single crystal belonging to a point group 32, and when a cut angle of said substrate cut out of the langasite single crystal and a propagation direction of surface acoustic waves on said substrate are represented in terms of Euler angles ($\phi$, $\theta$, $\psi$), where $-5° \leq \phi \leq 5°$
$85° \leq \theta \leq 95°$
$35° \leq \psi < 50°$, and said piezoelectric film is a c-axis oriented ZnO film that satisfies:

$$h/\lambda = 0.05 \text{ to } 0.45$$

where h is a thickness of said ZnO film, and $\lambda$ is a wavelength of a surface acoustic wave.

39. A surface acoustic wave device comprising:

a substrate, an opposite electrode film on a surface of said substrate, and a piezoelectric film on said opposite electrode film and an interdigital electrode on a surface of said piezoelectric film, wherein:

said substrate is a langasite single crystal belonging to a point group 32, and when a cut angle of said substrate cut out of the langasite single crystal and a propagation direction of surface acoustic waves on said substrate are represented in terms of Euler angles ($\phi$, $\theta$, $\psi$), where $-5° \leq \phi \leq 5°$ $85° \leq \theta \leq 95°$ $50° \leq \psi < 70°$, and said piezoelectric film is a c-axis oriented ZnO film that satisfies:

$$h/\lambda = 0.05 \text{ to } 0.8$$

where h is a thickness of said ZnO film, and $\lambda$ is a wavelength of a surface acoustic wave.

40. A surface acoustic wave device comprising:

a substrate, an opposite electrode film on a surface of said substrate, and a piezoelectric film on said opposite electrode film and an interdigital electrode on a surface of said piezoelectric film, wherein:

said substrate is a langasite single crystal belonging to a point group 32, and when a cut angle of said substrate cut out of the langasite single crystal and a propagation direction of surface acoustic waves on said substrate are represented in terms of Euler angles ($\phi$, $\theta$, $\psi$), where $-5° \leq \phi \leq 5°$ $85° \leq \theta \leq 95°$ $70° \leq \psi < 90°$, and said piezoelectric film is a c-axis oriented ZnO film that satisfies:

$$h/\lambda = 0.05 \text{ to } 0.8$$

where h is a thickness of said ZnO film, and $\lambda$ is a wavelength of a surface acoustic wave.

* * * * *

UNITED STATES PATENT AND TRADEMARK OFFICE
CERTIFICATE OF CORRECTION

PATENT NO. : 6,121,713

DATED : September 19, 2000

INVENTOR(S): Kenji INOUE, et al.

It is certified that an error appears in the above-identified patent and that said Letters Patent is hereby corrected as shown below:

Claim 4, line 14, change "$35° \leq \psi < -25°$" to -- $-35° \leq \psi < -25°$.

Claim 14, line 13, change "$-35° \leq \psi < -35°$" to -- $-35° \leq \psi < -25°$.

Signed and Sealed this

Fifteenth Day of May, 2001

Attest:

NICHOLAS P. GODICI

Attesting Officer

Acting Director of the United States Patent and Trademark Office